(12) United States Patent
Yudasaka et al.

(10) Patent No.: US 7,118,943 B2
(45) Date of Patent: Oct. 10, 2006

(54) PRODUCTION METHOD OF A THIN FILM DEVICE, PRODUCTION METHOD OF A TRANSISTOR, ELECTRO-OPTICAL APPARATUS AND ELECTRONIC EQUIPMENT

(75) Inventors: Ichio Yudasaka, Chino (JP); Tatsuya Shimoda, Fujimi-machi (JP); Masahiro Furusawa, Chino (KR)

(73) Assignee: Seiko Epson Corporation, Tokyo (JP)

( * ) Notice: Subject to any disclaimer, the term of this patent is extended or adjusted under 35 U.S.C. 154(b) by 179 days.

(21) Appl. No.: 10/417,181

(22) Filed: Apr. 17, 2003

(65) Prior Publication Data

US 2004/0082195 A1    Apr. 29, 2004

(30) Foreign Application Priority Data

Apr. 22, 2002  (JP)  ............... 2002-119850

(51) Int. Cl.
  *H01L 21/00* (2006.01)
  *H01L 21/84* (2006.01)
  *H01L 21/4763* (2006.01)
  *H01L 21/44* (2006.01)

(52) U.S. Cl. ............... 438/149; 438/622; 438/678

(58) Field of Classification Search ............... 438/149, 438/758, 608, 106, 617, 687, 639, 643, 622, 438/633, 626, 678, 692; 257/59
  See application file for complete search history.

(56) References Cited

U.S. PATENT DOCUMENTS

| | | | |
|---|---|---|---|
| 5,387,546 A * | 2/1995 | Maeda et al. ............... 438/784 |
| 5,906,859 A | 5/1999 | Bremmer et al. |
| 5,989,945 A | 11/1999 | Yudasaka et al. |
| 6,312,971 B1 * | 11/2001 | Amundson et al. ............ 438/99 |
| 6,376,362 B1 * | 4/2002 | Matsumoto ................. 438/633 |
| 6,565,763 B1 * | 5/2003 | Asakawa et al. ............. 216/56 |
| 6,593,591 B1 * | 7/2003 | Yudasaka et al. ............. 257/57 |
| 6,713,389 B1 * | 3/2004 | Speakman ................. 438/674 |
| 6,810,814 B1 * | 11/2004 | Hasei ........................ 101/485 |
| 6,811,945 B1 * | 11/2004 | Kobayashi ................. 430/199 |
| 6,828,582 B1 * | 12/2004 | Ando et al. ................... 257/40 |
| 6,850,357 B1 * | 2/2005 | Kaneko et al. ............. 359/296 |
| 6,865,010 B1 * | 3/2005 | Duthaler et al. ............ 359/296 |
| 7,014,521 B1 * | 3/2006 | Fujiike et al. ................ 445/24 |
| 2003/0068581 A1 * | 4/2003 | Kawamura et al. ......... 430/315 |

FOREIGN PATENT DOCUMENTS

| | | |
|---|---|---|
| EP | 1 087 428 A1 | 3/2000 |
| JP | A 2002-26014 | 1/2002 |
| KR | 1999-028928 | 4/1999 |
| TW | 449670 | 11/2001 |
| WO | WO97/43689 | 11/1997 |
| WO | WO00/59015 | 10/2000 |
| WO | WO 00/59040 | 10/2000 |

\* cited by examiner

*Primary Examiner*—Walter L. Lindsay, Jr.
(74) *Attorney, Agent, or Firm*—Oliff & Berridge, PLC

(57) ABSTRACT

In this production method of a thin film device, a thin film is formed by discharging a liquid material from a nozzle in a deposition chamber to coat the liquid material onto a substrate. The substrate is then subjected to heat treatment by a first heat treatment unit and a second heat treatment unit, thereby improving the crystallinity and fitness of the film as well as its adhesion with other films.

24 Claims, 35 Drawing Sheets

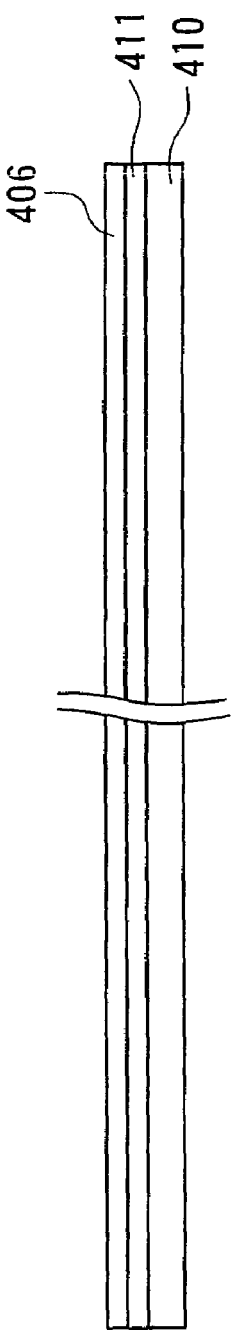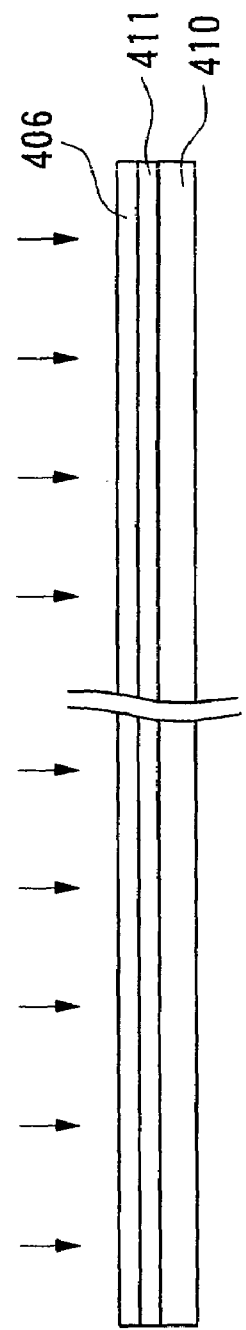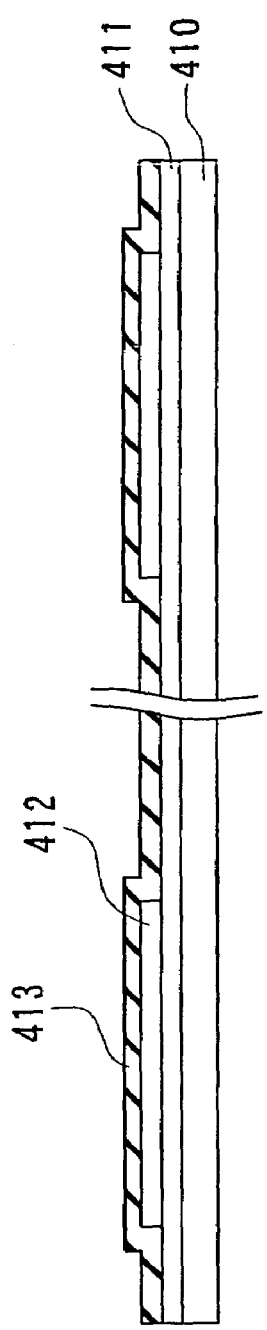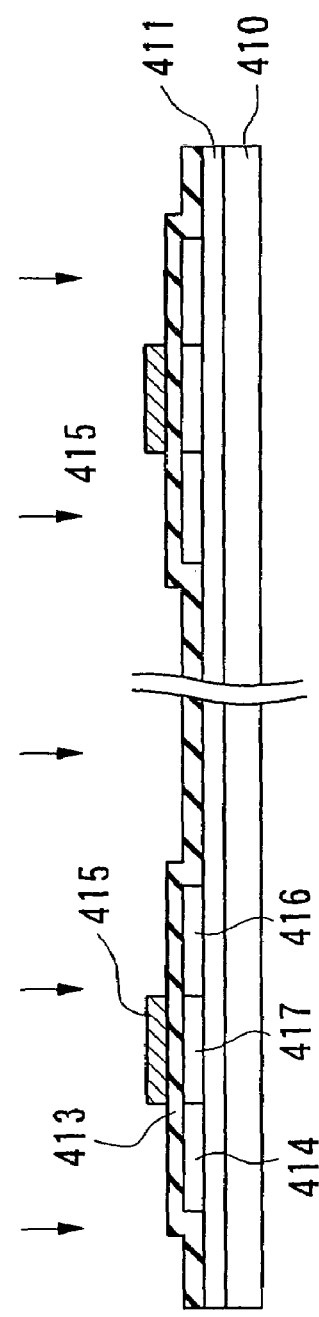
FIG. 14A
FIG. 14B
FIG. 14C
FIG. 14D

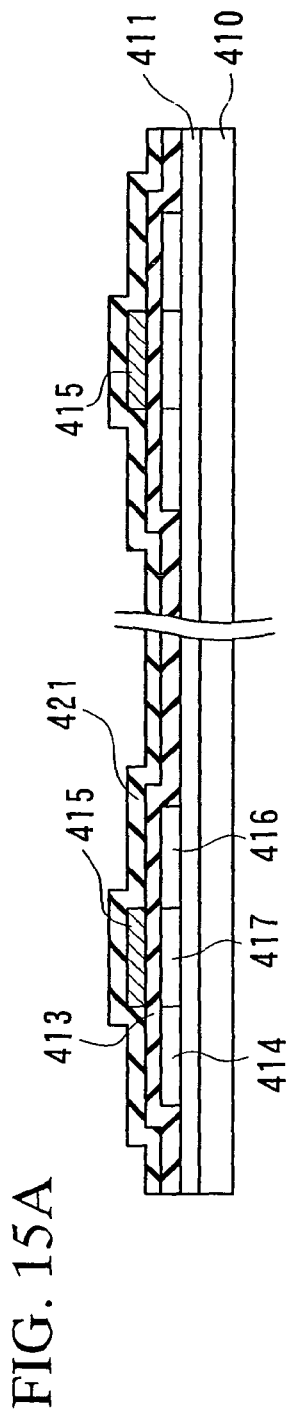
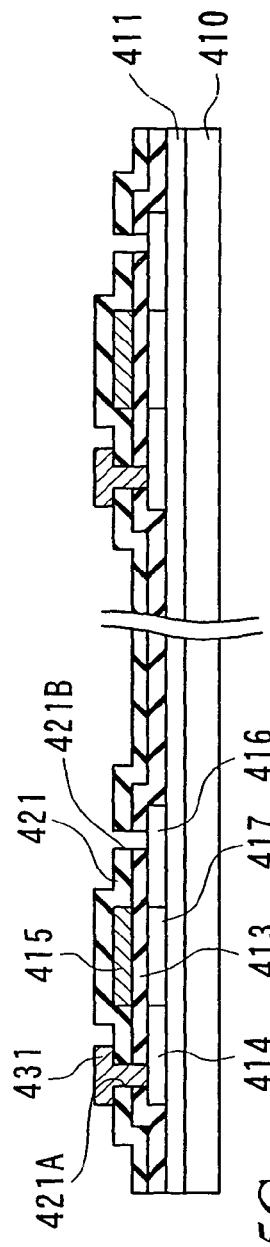
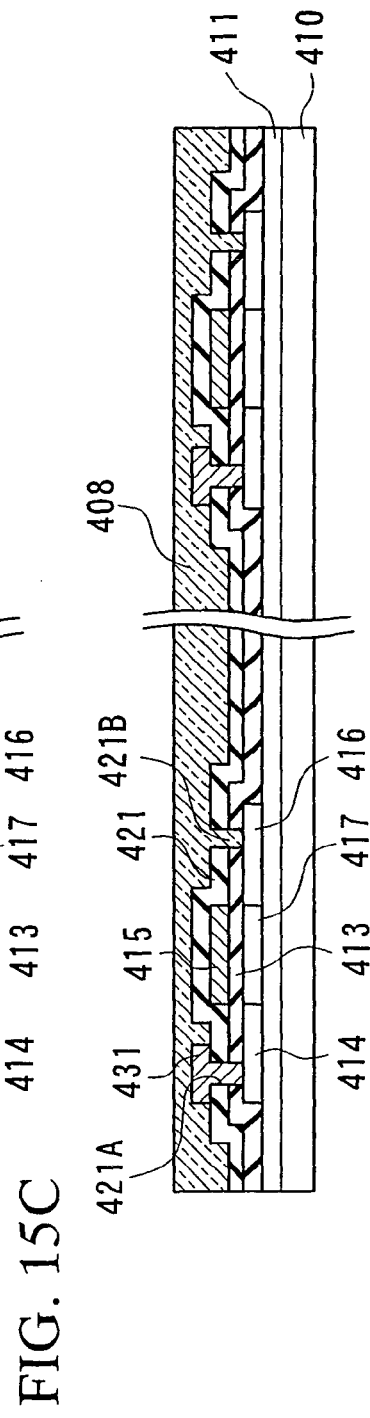
FIG. 15A
FIG. 15B
FIG. 15C

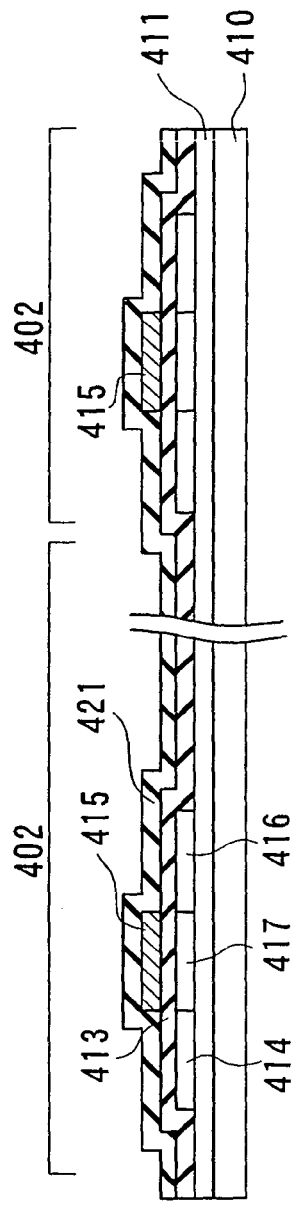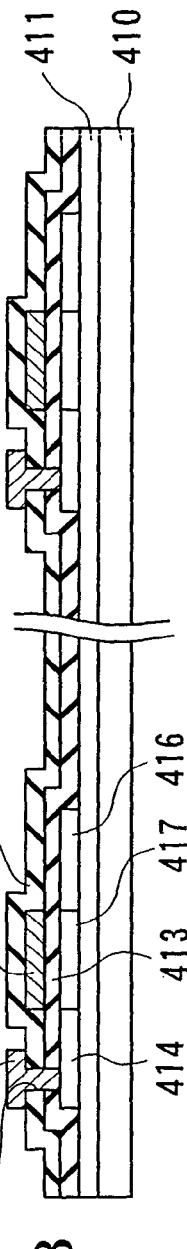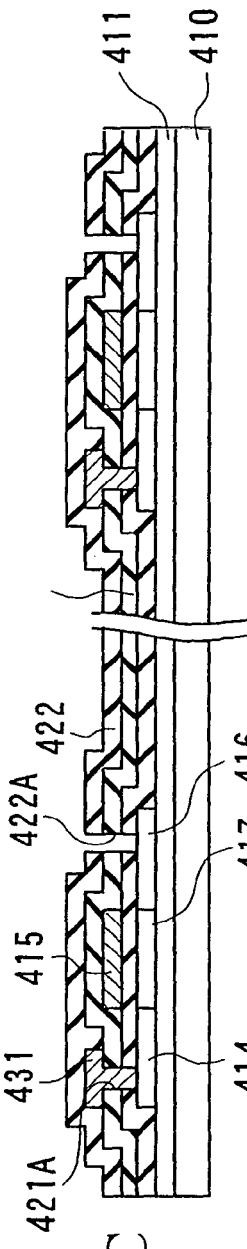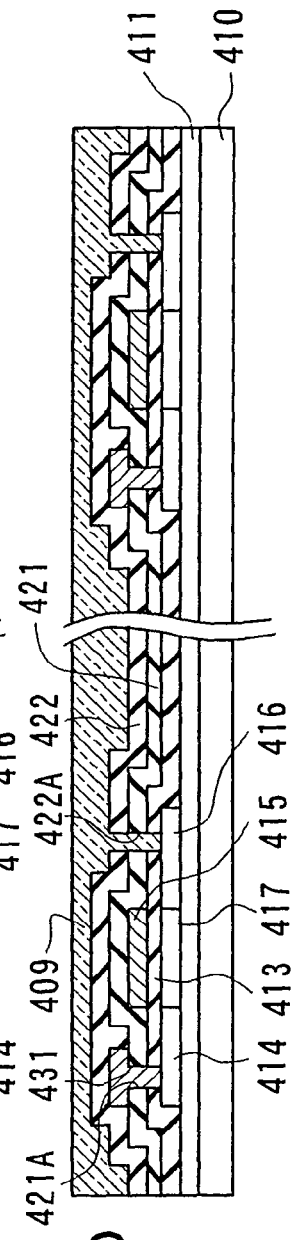

PRODUCTION METHOD OF A THIN FILM DEVICE, PRODUCTION METHOD OF A TRANSISTOR, ELECTRO-OPTICAL APPARATUS AND ELECTRONIC EQUIPMENT

BACKGROUND OF THE INVENTION

1. Field of the Invention

The present invention relates to a production method of a thin film device and transistor that can be preferably used for a liquid crystal display apparatus, electroluminescent display apparatus, electrophoresis display apparatus or other electro-optical apparatus or LSI and so forth. Moreover, the present invention relates to an electro-optical apparatus and electronic equipment equipped with a thin film device and transistor obtained according to the production method of the present invention.

2. Background Art

Normally, thin film devices are composed with a thin film such as a semiconductor film, insulating film or electrically conductive film and so forth, and transparent electrically conductive films are additionally used in thin film devices employed in liquid crystal display apparatuses and so forth in particular. In the case of classifying thin films according to their function, insulating films consist of gate insulating films and interlayer insulating films, and electrically conductive films consist of gate electrodes, source/drain electrodes, pixel electrodes, wiring and so forth. Chemical vapor deposition (CVD) and sputtering have mainly been employed for forming insulating films and electrically conductive films.

Silicon films consist of amorphous silicon films or polysilicon films are mainly used for semiconductor films. Thermal CVD, plasma CVD and optical CVD and so forth using monosilane gas or disilane gas are used to form silicon films, with thermal CVD typically being used to form polysilicon films, and plasma CVD typically being used to form amorphous silicon films.

However, due to such characteristics as the use of a vacuum device, the need for substrate heating, the need for a power supply such as plasma and the deposition of a film on unnecessary portions other than the substrate such as the inner wall of the apparatus resulting in the occurrence of foreign object defects following peeling of that film, conventional CVD and sputtering methods have had problems such as low productivity, numerous defects, poor yield, non-uniform film thickness due to surface irregularities, and disconnections in the wiring pattern at the locations of ledges. These problems ultimately lead to increased costs of thin film devices produced by CVD and sputtering.

Therefore, methods for producing thin film devices by techniques differing from the conventional deposition methods described above of the prior art have been proposed in recent years. For example, there is a method for forming a desired thin film by coating a liquid material onto a substrate to form a coated film followed by heat treatment of the coated film. According to this method, a thin film can be formed at low cost by a compact and inexpensive apparatus with high productivity, few defects, high yield and without the occurrence of disconnections at the locations of ledges, thereby enabling the production of low-cost thin film devices.

However, in the above prior art, a method for forming a coated film on a substrate surface lacks concreteness, resulting in the problem of it being difficult to apply the method to actual coating. Namely, although a nominal description is made of the coating method in related documents of the prior art, a detailed coating process is not disclosed.

In consideration of the above circumstances, an object of the present invention is to provide a production method of a thin film device, a production method of a transistor, an electro-optical apparatus and electronic equipment in which a thin film that composes a thin film device is formed by a material discharge method using a liquid material.

SUMMARY OF THE INVENTION

A first aspect of the present invention is a production method of a thin film device in which a thin film device provided with a plurality of layers is formed on a base material, the production method having a step in which at least one layer of the plurality of layers is formed, and this step comprising a step in which the relative positions of a nozzle that discharges liquid material containing a composite component of the one layer and the base material are moved, and a step in which the liquid material is discharged from the nozzle towards the base material.

Since the production method of a thin film device of this aspect of the present invention forms a coated film by coating a liquid material onto a base material using a material discharge method, the liquid material can be coated only at the region where the thin film is desired to be deposited, thereby making it possible to conserve liquid material. In addition, since this method can be carried out independent of a vacuum treatment apparatus, formation of the thin film can be carried out at low cost by a compact and inexpensive apparatus with high productivity, few defects, high yield and no disconnections at the location of ledges.

In the production method of a thin film device of the present invention, the above liquid material may contain polymer having Si—N bonds (polysilazane) or Spin On Glass (SOG) having a basic structure consisting of siloxane bonds, and the one layer may be an insulating layer. In this case, since the production method can be carried out independent of a vacuum treatment apparatus, film deposition can be carried out with an easy coating method such as spin coating. In particular, since polysilazane is highly resistant to cracking and is resistant to oxygen plasma, it can be used as an insulating layer having a certain degree of film thickness even if it is a single layer. In addition, in the case of SOG films, the production line can be constructed at an extremely low investment as compared with the prior art, the throughput of the production apparatus can be increased and the cost of the thin film device can be reduced considerably.

A production method of a thin film device of another aspect of the present invention is provided with a step in which a silicon film formation region is formed by an insulating layer or resist layer, a step in which a liquid material containing silicon atoms is coated on the silicon film formation region, and a step in which a first heat treatment is performed on the coated liquid material. In this case, since a liquid material is coated onto a silicon film formation region, waste of the liquid material can be eliminated, the silicon film can be crystallized efficiently by heat treatment, and an optimum semiconductor layer can be formed by allowing the containing of impurities.

In a production method of a thin film device of another aspect of the present invention, the step in which a silicon film formation region is formed is provided with a step in which the relative positions of a nozzle that discharges a liquid material containing a composite component of the insulating layer or resist layer and the base material are moved, and a step in which the liquid material is discharged from the nozzle towards the base material. In this case, since a silicon film formation region is formed by coating a liquid material onto a base material using a material discharge method, the liquid material can be coated only onto the desired formation region, thereby making it possible to conserve liquid material. In addition, since this production method can be carried out independent of a vacuum treatment apparatus, a silicon film formation region can be formed by a compact and inexpensive apparatus with high productivity, few defects, high yield and low cost.

The above liquid material may also contain impurity atoms. In this case, a silicon semiconductor layer can be formed efficiently.

The production method may also have a step in which liquid repellency treatment is performed on the insulating layer or resist layer. In this case, liquid material coated by a material discharge method is repelled due to the liquid repellency treatment on the film, thereby having the effect of being efficiently introduced onto the lyophilic coating region.

In the above liquid repellency treatment step, a self-organizing layer of the insulating layer or resist layer may also be formed. In this case, since the self-organizing layer is a structure having liquid repellency, liquid material is efficiently repelled on this surface, enabling it to be efficiently introduced onto the coating region.

The liquid material containing silicon atoms may also contain a silicon compound having a ring system represented with the general formula $Si_nX_m$ (where, n represents an integer of 5 or more, m represents an integer of n, 2n-2 or 2n, and X represents a hydrogen atom and/or halogen atom). In this case, the optimum silicon compound is selected after coating the liquid material in consideration of solvent removal, efficiency of heat treatment and so forth.

In the above silicon compound having a ring system represented with the general formula $Si_nX_m$, n may be an integer of not less than 5 and not greater than 20. In the case n is less than 5, handling becomes difficult since the silicon-based compound itself becomes unstable due to strain caused by the ring structure. In addition, in the case n is greater than 20, solubility in solution decreases due to the cohesive strength of the silicon compound. Since this narrows the selection range of solvents that can actually be used, the optimum silicon compound should be selected.

The above liquid material containing the above silicon compound having a ring system represented with the general formula $Si_nX_m$ may have a solute concentration of 1–80% by weight. In this case, a liquid material can be prepared corresponding to the desired silicon film thickness. If the solute concentration exceeds 80% by weight, precipitation occurs easily making it difficult to obtain a uniform coated film.

The above liquid material containing the above silicon compound having a ring system represented with the general formula $Si_nX_m$ may have a viscosity of 1–100 mPa s. In this case, viscosity can be suitably selected according to the coating location and target coated film thickness. It becomes difficult to obtain a uniform coated film if the viscosity exceeds 100 mPa s.

The above liquid material containing the above silicon compound having a ring system represented with the general formula $Si_nX_m$ may have a vapor pressure at room temperature of 0.001–100 mmHg. In this case, a suitable silicon film can be obtained. In the case the vapor pressure is higher than 100 mmHg, the solvent ends up evaporating first when forming a coated film by coating, thereby making it difficult to form a satisfactory coated film. On the other hand, in the case of a solvent having a vapor pressure lower than 0.001 mmHg, drying becomes slow and the solvent tends to easily remain in the silicon compound coated film, thereby making it difficult to obtain a satisfactory coated film in the heat treatment of the following step.

The solution that contains the above silicon compound having a ring system represented with the general formula $Si_nX_m$ may also be that in which the solvent is a hydrocarbon-based solvent. In this case, the solubility of the silicon compound and the stability of the solution are satisfactory.

The production method of a thin film device of the present invention may also be provided with a step in which a second heat treatment is performed at a higher temperature than the previously mentioned first heat treatment. In this case, the fineness of the silicon film can be improved by this second heat treatment.

In the production method of a thin-film device of the present invention, the above second heat treatment may be carried out by laser annealing or lamp annealing. In this case, since treatment can be performed at a high temperature by applying heat for a short period of time, together with the silicon film being able to be heat treated efficiently, there is also the effect of minimizing detrimental effects on a glass substrate or other films.

The previously mentioned liquid material may contain electrically conductive particles. In this case, since a liquid material that contains electrically conductive particles is coated onto a base material, an optimal electrically conductive film can be formed while eliminating waste of the liquid material.

The production method of a thin film device of another aspect of the present invention is provided with a step in which an electrically conductive film formation region is formed by an insulating film or resist film, and a step in which liquid repellency treatment is performed on the insulating film or resist film, and the above liquid material is discharged towards the electrically conductive film formation region. In this case, since the liquid material containing electrically conductive particles is repelled from the insulating film or resist film while being efficiently introduced onto the lyophilic electrically conductive film formation region, an optimal electrically conductive film can be formed while being able to eliminate waste of the liquid material.

In the above liquid repellency treatment step, a self-organizing layer of the insulating layer or resist layer may also be formed. In this case, since the self-organizing layer is a structure that has liquid repellency, the liquid material is efficiently repelled on its surface, and can be efficiently introduced onto a coating region.

The production method of a thin film device of the present invention may also have a step in which a second heat treatment is performed at higher temperature than the first heat treatment. In this case, lowering of the resistance of the coated electrically conductive film as well as reduction of its contact resistance can be carried out effectively.

In the production method of a thin film device of the present invention, the second heat treatment may be carried out by laser annealing or lamp annealing. In this case, since heat treatment can be carried out at a high temperature by applying heat for a short period of time, together with the electrically conductive film being able to be heat treated efficiently, there is also the effect of minimizing detrimental effects on a glass substrate or other films.

The above nozzle may be provided with a plurality discharge ports that discharge the above liquid material, and may selectively discharge a liquid material onto a region where the previously mentioned one layer is to be formed. In this case, since the above liquid material can be discharged only onto a coating region on a base material, the liquid material can be used efficiently. In addition, since a photolithography step is not required, both reduction of equipment costs and improvement of throughput can be realized.

The discharged state and non-discharged state of the above liquid material may be respectively and independently controlled for the above plurality of discharge ports. In this case, an even more precise pattern can be coated.

The above liquid material contains a resist material, and a step may also be contained in which the discharged liquid material is subjected to heat treatment. In this case, since the liquid material containing a resist material can be discharged only onto a desired coating region on a base material, the resist can be used efficiently, and the resist material can be discharged efficiently.

Another aspect of the present invention is a production method of a transistor in which a transistor is formed on a base material, the above transistor being provided with a semiconductor layer having a source region, drain region and channel region, a gate insulating film and a gate electrode, that is provided with a step in which the relative positions of a nozzle that discharges a liquid material containing the composite components of the semiconductor layer, gate insulting film and gate electrode and the base material are moved, and a step in which the liquid material is discharged from the nozzle towards the base material. In this case, since each composite component of the transistor is formed by coating the liquid material onto a base material using a material discharge method, the liquid material can be coated only onto a desired region, thereby making it possible to conserve liquid material. In addition, since production of the transistor is carried out independent of a vacuum treatment apparatus, a transistor can be formed at low cost with high productivity, few defects, high yield and without the occurrence of disconnections at the locations of ledges.

The production method may also have a step in which an undercoating insulating layer is formed between the base material and the transistor. In this case, contamination from a glass substrate and so forth can be prevented, and a surface state can be prepared on which a polycrystalline silicon film is formed.

A step may also be provided in which a protective insulating layer is formed for the upper layer of the above transistor. In this case, the entire thin film transistor can be protected from external contamination and so forth.

An electro-optical apparatus of another aspect of the present invention comprises a switching element and an electro-optical layer that is driven by the switching element, the switching element being a thin film device produced according to the production method of a thin film device as described above. In this case, since the switching element is composed by a coated film using a low-cost material discharge method, both the cost of the switching element and the cost of the electro-optical apparatus can be reduced.

An electro-optical apparatus of another aspect of the present invention comprises a transistor and an electro-optical layer driven by the transistor, the transistor being a transistor produced according to the production method of a transistor as described above. In this case, since the transistor is composed by a coated film using a low-cost material discharge method, the cost of the transistor can be reduced. Namely, the cost of the electro-optical apparatus can be reduced. Furthermore, an "electro-optical apparatus" as referred to in the present invention refers to a general apparatus equipped with an electro-optical element that either emits light or changes the state of light from the outside by an electrical action, and includes both that which emits light on its own as well as that which controls the transmission of light from the outside. Examples of electro-optical elements include liquid crystal elements, electrophoresis elements, electroluminescence (EL) elements and electron emission elements that emit light by allowing electrons generated by the application of an electrical field to contact a light emitting plate.

The electrical equipment equipped with a display unit of the present invention is provided with the above electro-optical apparatus for the above display unit. In this case, since the cost of the electro-optical apparatus is low, the cost of the electrical equipment can also be reduced. Furthermore, "electrical equipment" referred to in the present invention refers to general equipment that demonstrates a fixed function by combining a plurality of elements or circuits, examples of which include equipment composed by being provided with an electro-optical apparatus and memory. Here, the electrical equipment may be provided with one or a plurality of circuit boards. Although there are no particular restrictions on the constitution, examples include IC cards, cell phones, video cameras, personal computers, head-mounted stereos, rear or front projectors, as well as facsimiles equipped with a display function, finders of digital cameras, portable TVs, DSP devices, PDA, electronic notebooks, photoelectric information boards and advertising and publicity displays.

BRIEF DESCRIPTION OF THE DRAWINGS

FIGS. 14A through 14D are cross-sectional views showing the production method of the active matrix substrate shown in FIG. 12.

FIGS. 15A through 15C are cross-sectional views showing each of the steps carried out after the steps shown in FIGS. 14A through 14D.

FIGS. 18A through 18D are cross-sectional views showing each of the steps carried out after the steps shown in FIGS. 14A through 14D in the production of the active matrix substrate shown in FIG. 16.

DESCRIPTION OF THE PREFERRED EMBODIMENTS

The following provides an explanation of preferable embodiments of a production method of a thin film device, a production method of a transistor, an electro-optical apparatus and electronic equipment as claimed in the present invention with reference to the drawings. However, the present invention is not limited to any of the following embodiments, and for example, the constituent features of these embodiments may be suitably combined.

[First Embodiment]

(Explanation of Structure of Thin Film Device)

Figure 3H:
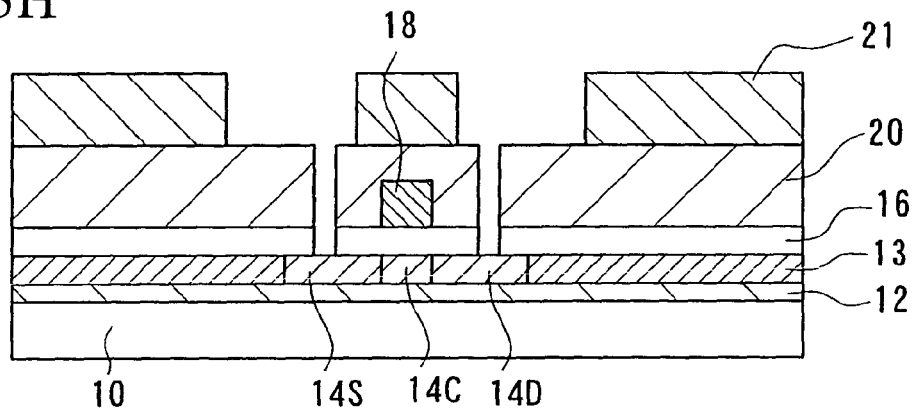
FIGS. 3H through 3J are cross-sectional views showing the production process of a thin film device according to a first embodiment of the present invention.
Figure 3I:
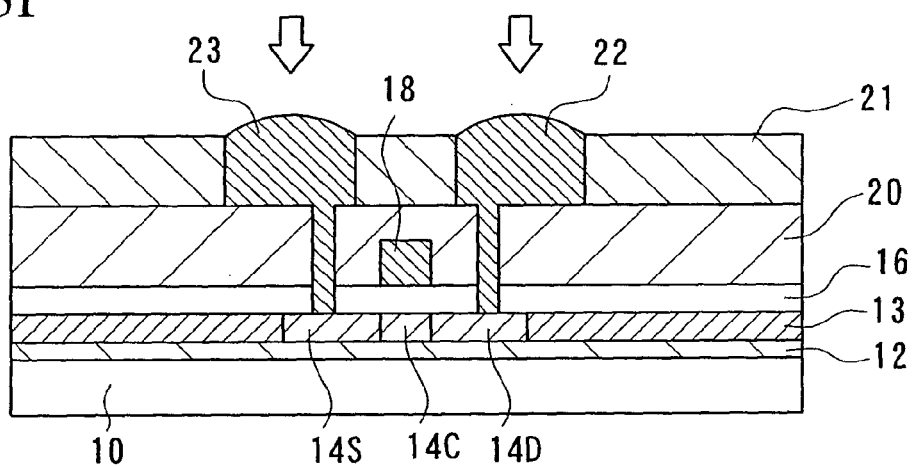
Figure 3J:
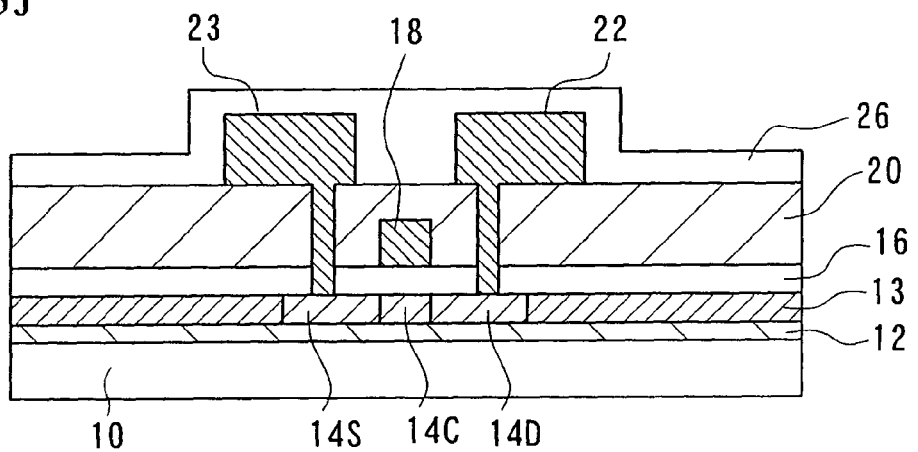

A cross-sectional view of a thin film transistor (abbreviated as TFT) using coplanar polycrystalline silicon is shown in FIG. 3J as an example of the basic structure of a thin film device. The following explanation is provided using a TFT for the thin film device loaded onto, for example, a TFT-LCD. In FIG. 3J, a first insulating film (undercoating insulting film) 12 is formed on glass substrate 10, and a polycrystalline silicon TFT is formed thereon. Polycrystalline silicon film 14 is composed of source region 14S and drain region 14D doped with a high concentration of impurities, and channel region 14C between source region 14S and drain region 14D.

A third insulating film (gate insulating film) 16 is formed on polycrystalline silicon film 14 and a second insulating film 13 formed in parallel with the polycrystalline silicon film 14, and a gate electrode 18 and a gate wire (not shown) are formed on the third insulating film 16. A drain electrode 22 is connected to drain region 14D via an opening 15 formed in a fourth insulating film (interlayer insulating film) 20 and third insulating film 16, and a source wiring 24 is connected to source region 14S. The uppermost protective film 26 may be omitted. Furthermore, although the purpose of first insulating film 12 is to protect contamination from glass substrate 10 and provide a proper surface state on which polycrystalline silicon film 14 is formed, this may also be omitted. FIG. 3J indicates the basic TFT structure, and there are an extremely wide range of variations of this basic structure. For example, in order to increase the numerical aperture in a coplanar TFT, a second interlayer insulating film may be provided between drain electrode 22 and source wiring 24 to create a structure in which the interval between drain electrode 22 and source wiring 24 is reduced. Alternatively, a gate wire not shown and source wiring 24 may be in the form of a multi-layer film for the purpose of decreasing the wiring resistance and increasing the wiring redundancy of the gate wire and source wiring 24 connected to gate electrode 18. In all of these modified structures, the number of layers of thin films that compose the TFT increase in nearly all cases relative to the basic structure of FIG. 3J. In addition, although there are also inverted staggered types of TFT that use an amorphous silicon film in addition to coplanar TFT, these are identical with respect to the source region, drain region and channel region.

(Insulating Film Formation Method)

Figure 4:
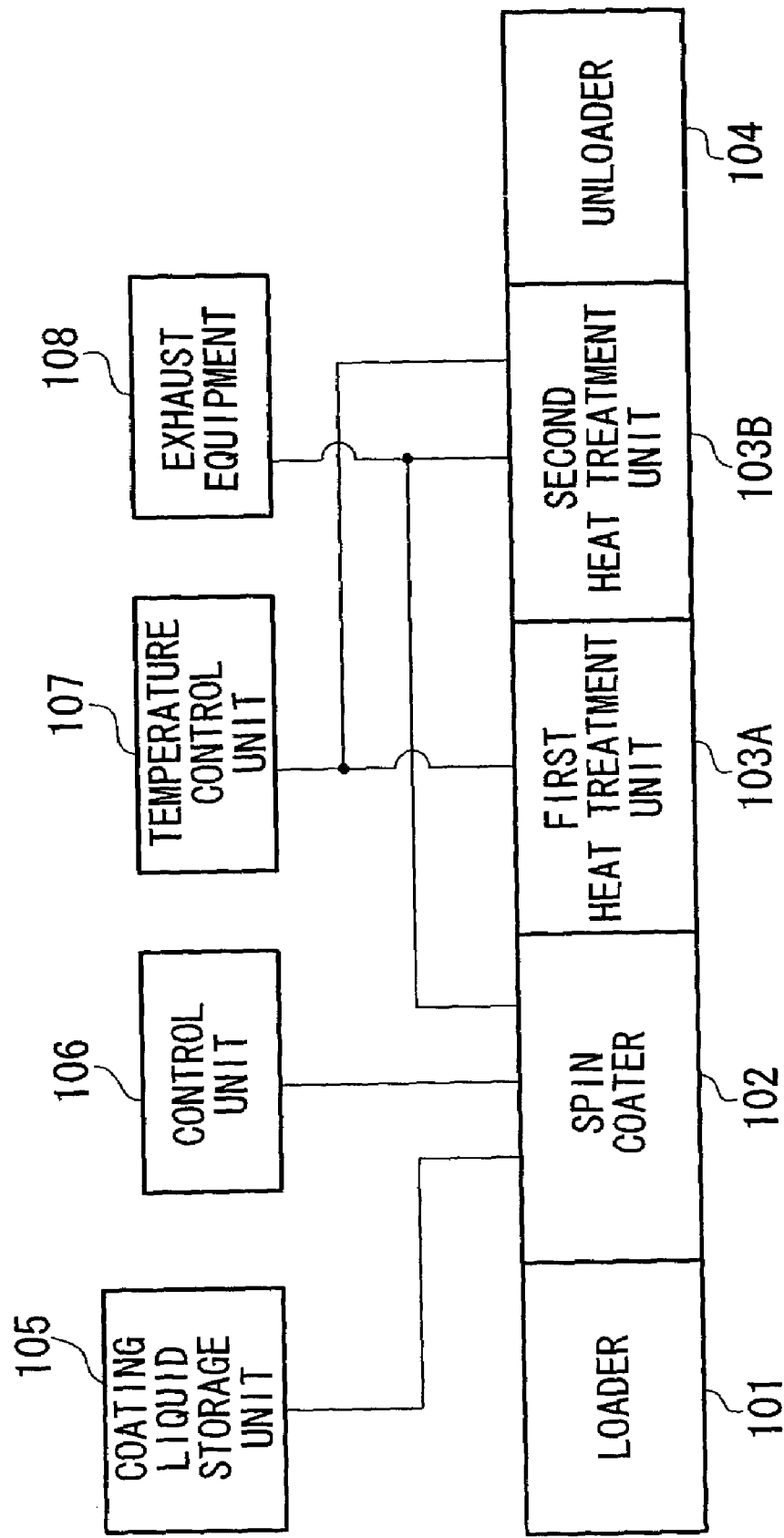
FIG. 4 is a block diagram of a coated film formation apparatus that includes a coating apparatus that uses a spin coater according to a first embodiment of the present invention.

FIG. 4 shows a coating type of insulating film formation apparatus for forming a thin film such as an insulating film by coating a liquid followed by heat treatment. An example of a liquid that becomes an insulating film as a result of heat treatment following coating is polysilazane (the generic name of a polymer having Si—N bonds). One type of polysilazane is $[SiH_2NH]_n$ (where n is an integer), and is referred to as polyperhydrosilazane. This product is sold commercially by, for example, Clariant Japan. Furthermore, if the H in $[SiH_2NH]_n$ is substituted with an alkyl group (such as a methyl group or ethyl group), the result is an organic polysilazane, which is distinguished from inorganic polysilazane. In the present embodiment, it is preferable to use inorganic polysilazane. Polysilazane is mixed into a liquid such as xylene and then, for example, spin coated onto a substrate. This coated film is converted to $SiO_2$ by heat treating in an atmosphere containing water vapor or oxygen.

In addition, a Spin-On-Glass (SOG) film is an example of a liquid that becomes an insulating film as a result of heat treatment following coating. The SOG film is a polymer having a basic structure consisting of siloxane bonds. SOG films consist of organic SOG containing alkyl groups and inorganic SOG that do not contain alkyl groups, and are used with alcohol and so forth as a solvent. SOG films are used for the interlayer insulating films of LSI for the purpose of flattening. Organic SOG films are easily etched by oxygen plasma treatment, while inorganic SOG films have the problem of susceptibility to cracking even in the case of thick films of several hundred nanometers. Inorganic SOG films are hardly ever used for interlayer insulating films and so forth in the form of a single layer, but rather are used as the flattening layer of the top layer or bottom layer of CVD insulating films. With respect to this point, polysilazane is highly resistant to cracking and is also resistant to oxygen plasma, thereby allowing it to be used as a somewhat thick insulating film even in the form of a single layer. Thus, the explanation here deals with the case of using polysilazane.

Figure 6:
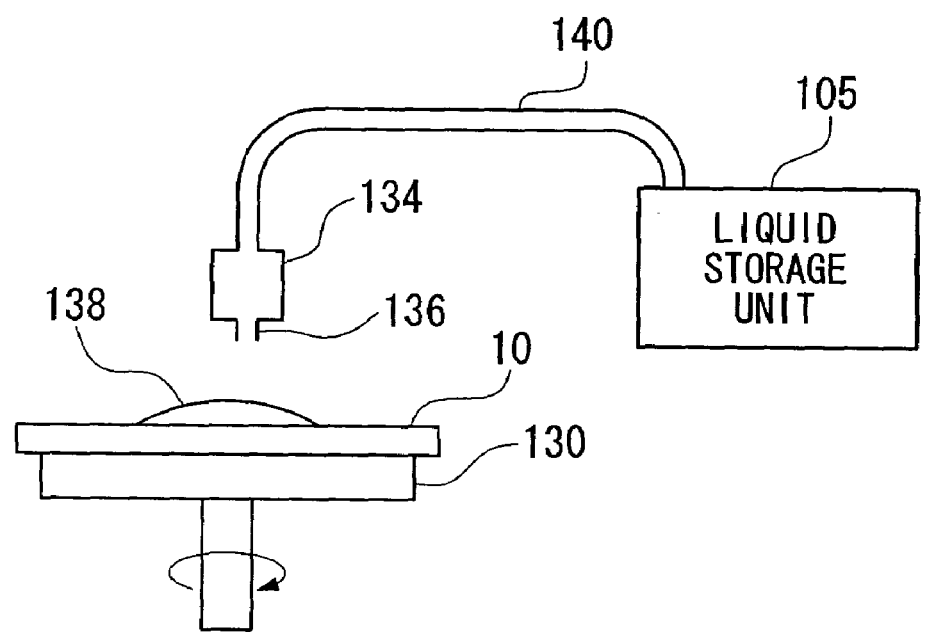
FIG. 6 is a block diagram of a liquid coating apparatus according to a first embodiment of the present invention.
Figure 7:
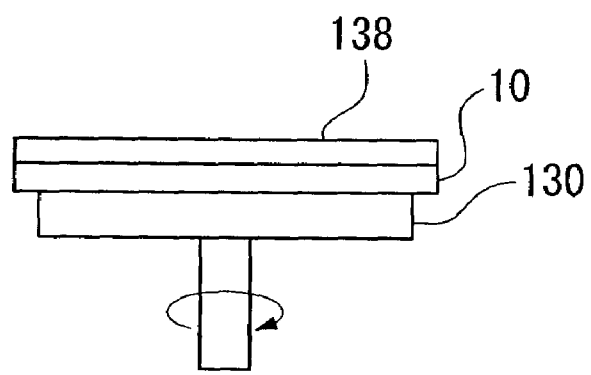
FIG. 7 is a schematic explanatory drawing showing the state after spin coating with the liquid coating apparatus of FIG. 6.

In FIG. 4, a loader 101 removes a plurality of glass substrates housed in a cassette one at a time and transports a glass substrate 10 to spin coater 102. In spin coater 102, as shown in FIG. 6, glass substrate 10 is vacuum suctioned on stage 130, and polysilazane 138 is dropped onto glass substrate 10 from a nozzle 136 of a dispenser 134. The dropped polysilazane 138 spreads over the central portion of glass substrate 10. A mixed liquid of polysilazane and xylene is contained in a canister or other container, and stored in a liquid storage unit 105 shown in FIGS. 4 and 6. The mixed liquid of polysilazane and xylene is supplied to dispenser 134 from liquid storage unit 105 via a supply line 140, and then coated onto glass substrate 10. Moreover, as shown in FIG. 7, polysilazane 138 is coated while spreading over the entire surface of glass substrate 10 due to rotation of stage 130.

The rotating speed and rotating time of stage 130 is controlled by a control unit 106 shown in FIG. 4. The rotating speed increases to 1000 rpm in a few seconds, held at 1000 rpm for about 20 seconds, and is then stopped after a few seconds. Under these coating conditions, the film thickness of the polysilazane coated film is about 700 nm. Next, glass substrate 10 is transported to first heat treatment unit 103A where it is converted to $SiO_2$ as a result of undergoing heat treatment for 10–60 minutes at a temperature of 100–350° C. in a water vapor atmosphere. This heat treatment is controlled by a temperature control unit 107.

Here, the previously mentioned third insulating film 16 functioning as a gate insulating film is an important insulating film that influences the electrical characteristics of the TFT, and the interface characteristics with the silicon film must be controlled simultaneous to film thickness and film quality. Thus, a second heat treatment unit 103B is provided between the first heat treatment unit 103A and an unloader 104 in order to improve film quality and interface characteristics. In this second heat treatment unit 103B, heat treatment for 30–60 minutes at a higher temperature of 400–500° C. than the heat treatment temperature in first heat treatment 103A, or heat treatment at a high temperature for a short duration, such as laser annealing or lamp annealing, is preferably carried out following the heat treatment in first heat treatment unit 103A.

The length of the heat treatment unit and the number of substrates housed in the oven are set for each heat treatment unit 103A and 103B so as to coordinate the tact time of spin coater 102 and heat treatment time in order to increase the throughput of the coating type of insulating film formation apparatus. Since xylene is used for the liquid in which the polysilazane is mixed, and hydrogen, ammonia and so forth are generated during conversion, at least spin coater 102 and second heat treatment unit 103B require exhaust equipment 108. Glass substrates 10 on which heat treatment has been performed and an insulating film has been formed are housed in a cassette by unloader 104.

The coating type of insulating film formation apparatus shown in FIG. 4 has a remarkably simple constitution, and thus a much lower price, in comparison with CVD apparatuses of the prior art. Moreover, it also has characteristics that include higher throughput, greater ease of maintenance and higher operation rate than CVD apparatuses. As a result of these characteristics, the cost of image display apparatuses and electronic equipment using thin film devices produced with the above coating type of insulating film formation apparatus can be reduced considerably. All of the insulating films of first insulating film 12, third insulating film 16, fourth insulating film 20 and protective film 26 shown in FIG. 3J can be deposited with the coating type of insulating film formation apparatus described above. In addition, in the case of additionally forming an insulating film between drain electrode 22 and source wiring 24, forming this additional insulating film in the form of a coated film using the apparatus of FIG. 4 is particularly advantageous since there is also the effect of flattening the insulating film surface.

Furthermore, since interface characteristics can be more easily controlled in the case of CVD films formed in a vacuum atmosphere as compared with coated insulating films, in the case of requiring a high-performance TFT, the gate insulating film among the insulating films that compose the TFT may be formed in the form of a CVD film, while the other insulating films may be formed in the form of coated insulating films according to the present invention. In addition, although spin coating is used for the coating method in the present embodiment, the coated film may also be formed on the substrate using another method such as roll coating, curtain coating, dip coating, spray coating or a material discharge method.

(Silicon Film Formation Method)

Figure 5:
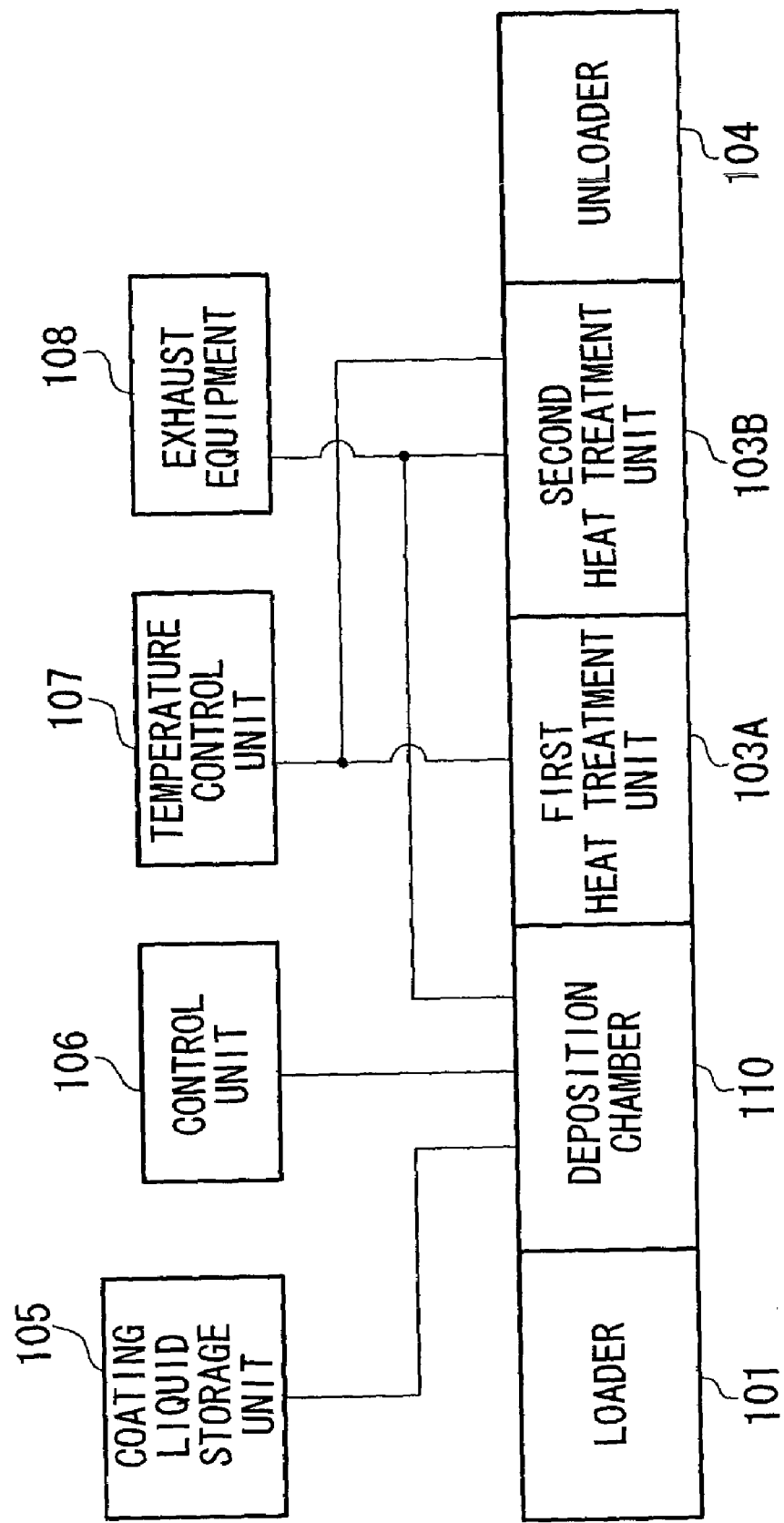
FIG. 5 is a block diagram of a coated film formation apparatus that includes a coating apparatus using a material discharge type of film formation chamber according to a first embodiment of the present invention.

FIG. 5 shows a coating type of silicon film formation apparatus for forming a silicon film by coating a liquid material followed by heat treatment. In this coating type of silicon film formation apparatus, a loader 101, a deposition chamber 110 having a material discharge type of coating apparatus, a first heat treatment unit 103A, a second heat treatment unit 103B and an unloader 104 are connected inline. A coating liquid storage unit 105 that stores the liquid material is connected to deposition chamber 110.

In order to form a silicon film, the silicon compound contained by the liquid material used in the present invention is a silicon compound having a ring system represented with the general formula $Si_nX_m$ (where, n represents an integer of 5 or more, m represents an integer of n, 2n-2 or 2n, and X represents a hydrogen atom and/or halogen atom). A silicon compound having the above general formula $Si_nX_m$ in which n is not less than 5 but not greater than 20 is particularly preferable, while that in which n is 5 or 6 is more preferable. In the case n is less than 5, handling becomes difficult since the silicon compound itself becomes unstable due to strain caused by the ring structure, and in the case n is greater than 20, solubility in solution decreases due to the cohesive strength of the silicon compound, thereby narrowing the selection range of solvents that can actually be used. In addition, although the silicon compound used for forming a silicon film in the present invention uses a solution having for its essential ingredient that is the previously mentioned silicon compound having a ring system represented with the general formula $Si_nX_m$, a silicon compound such as n-pentasilane, n-hexasilane or n-heptasilane may also be contained in the solution.

The concentration of the silicon compound solution is about 1 to 80% by weight, and can be adjusted corresponding to the desired thickness of the silicon film. If the above concentration exceeds 80%, precipitation occurs easily thereby preventing the obtaining of a uniformly coated film. Minute amounts of fluorine-based, silicon-based or nonionic surface tension modifiers can be added to the above silicon compound solution as necessary without a range that does impair the desired function. Nonionic surface tension modifiers improve the wettability to coated object of the solution, improve the leveling of the coated film, and are useful in preventing the occurrence of irregularities in the surface of the coated film, or a so-called orange peel surface.

In addition, the viscosity of the silicon compound solution is normally within the range of 1 to 100 mPa s, and can be suitably selected according to the coated location and desired coated film thickness. If the viscosity exceeds 100 mPa s, it becomes difficult to obtain a uniformly coated film.

Moreover, in the method of the present invention, a solution in which the silicon compound represented with the general formula $Si_nX_m$ is dissolved in a solvent is coated onto a substrate. A solvent having a vapor pressure at room temperature of 0.001–100 mmHg is normally used for the solvent used for that solution. In the case the vapor pressure is higher than 100 mmHg, the solvent ends up evaporating first when forming a coated film by coating, thereby making it difficult to form a satisfactory coated film. On the other hand, in the case of a solvent having a vapor pressure of less than 0.001 mmHg, drying becomes slow and solvent tends to remain in the coated film of the silicon compound, thereby making it difficult to obtain a satisfactory silicon film in the subsequent heat treatment step. In addition, a hydrocarbon-based solvent or ether-based solvent is preferable with respect to solubility of the silicon compound and stability of the solution, while a more preferable example of a solvent is a hydrocarbon-based solvent.

A substrate coated with the liquid material in deposition chamber 110 is heat treated under similar heat treatment conditions as the case of formation of a coated insulating film in a first heat treatment unit 103A. At this time, the solvent in the coated film is removed, the ring of the cyclic silicon compound is opened, and the silicon compound is broken down resulting in the formation of a solid silicon film on the substrate. Moreover, the substrate undergoes heat treatment in a second heat treatment unit 103B at a temperature higher than the heat treatment temperature in first heat treatment unit 103A. This heat treatment is carried out in a short time by laser annealing or lamp annealing. The heating temperature is preferably about 800–1500° C. and the heating time is preferably about 10–80 ns in the case of laser annealing, is preferably about 500–1000° C. and about 1 ms to 5 s (seconds) in the case of lamp annealing. As a result of being subjected to additional heat treatment in this second heat treatment unit 103B, the crystallinity and fineness of the silicon film as well as the adhesion with other films are improved as compared with being heat treated in the first heat treatment unit 103A alone.

(Method of Injecting Impurities into a Silicon Film)

The method of injecting impurities into a silicon film is carried out using, for example, an ion injection apparatus of the prior art. On the other hand, as shown in FIG. 6, an impurity-containing insulating layer may be coated followed by dispersing impurities on a silicon film beneath. In the dispersion method, formation of the impurity-containing insulating layer can use the same apparatus as the apparatus shown in FIG. 4.

In the present embodiment, an SOG film containing phosphorous glass or boron glass is coated in the form of the impurity-containing coated film. In the case of forming an N type of highly concentrated impurity region, an SOG film containing several hundred micrograms of $P_2O_5$ per 100 ml of liquid is used as the impurity-containing coated film for the liquid containing siloxane polymer so that the Si concentration is several wt % using ethanol or ethyl acetate for the solvent. In this case, the coating liquid is stored in coating liquid storage unit 105 of FIG. 4, and the coating liquid is coated onto a substrate by spin coater 102. Moreover, a several hundred nanometer thick film is obtained for the above SOG film by rotating the substrate at a rotating speed of several thousand rpm in spin coater 102. This impurity-containing coated film is then heat treated at 300–500° C. in first heat treatment unit 103A to obtain a phosphorous glass film containing several mol % of $P_2O_5$. The TFT substrate on which the phosphorous glass film is formed is subjected to high-temperature, short-duration heat treatment by lamp annealing or laser annealing in second heat treatment unit 103B, and the impurities within the SOG film are dispersed in the solid phase within the silicon film of the layer beneath it, resulting in the formation of a highly concentrated impurity region within said silicon film. The TFT substrate is then finally housed in a cassette with unloader 104.

In the formation of this source-drain region, the coating step and the high-temperature, short-duration annealing step can be carried out within one minute, thereby having extremely high productivity. Furthermore, although the heat treatment step requires roughly several tens of minutes, the tact time can be reduced by making contrivances in the length and structure of the heat treatment oven.

Figure 13:
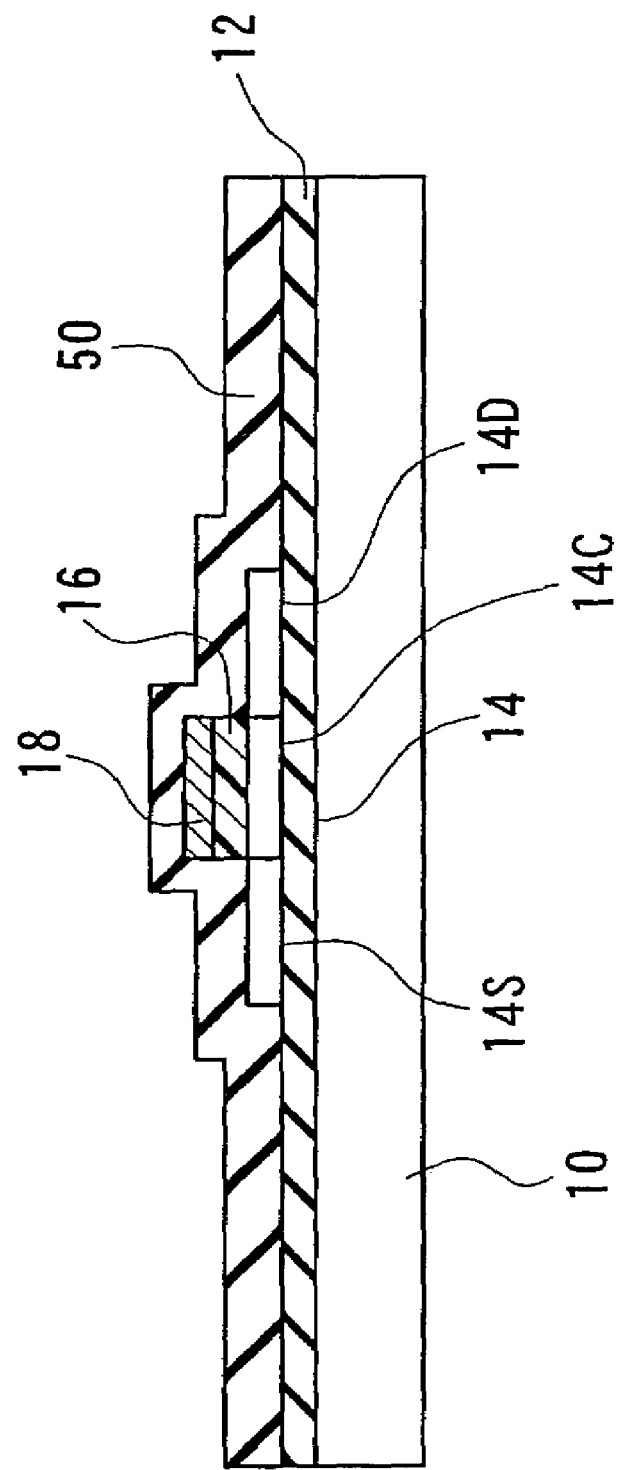
FIG. 13 is a cross-sectional view of the production process of a coplanar TFT that uses an impurity-containing insulating layer according to the present invention.

A cross-sectional view of the TFT on which the above impurity-containing coated film is coated is shown in FIG. 13. FIG. 13 shows a coplanar TFT corresponding to FIG. 3J, a first insulating layer 12 is formed on glass substrate 10, and a silicon film 14 is patterned thereon. The third insulating film 16 is removed by etching by masking gate electrode 18, resulting in temporary exposure of the silicon layer of the regions to serve as the source and drain. Thus, impurity-containing coated film 50 is formed by contacting regions 14S and 14D to serve as the source and drain of the above silicon film. As a result of the high-temperature, short duration heat treatment described above, the phosphorus contained in the impurity-containing coated film 50 is dispersed in the solid phase and is dispersed within the above silicon film, resulting in the formation of N-type source and drain regions 14S and 14D having a sheet resistance of 10 KΩ/□ or less.

In the following steps, as can be understood from the cross-sectional drawings of the TFT sequentially shown starting in FIG. 2F, an interlayer insulating film in the form of a fourth insulating film is formed, followed by the formation of a contact hole opening and electrode in that order. Here, during formation of the fourth insulating film, the fourth insulating film may be formed by the previously described coated film after removing impurity-containing coated film 50, or may be newly formed onto impurity containing coated film 50.

According to the present embodiment, since the formation of source and drain regions in a coplanar TFT is carried out by the formation of a coated film and high-temperature, short-duration heat treatment instead of the ion implantation or ion doping of the prior art, TFT can be produced using an apparatus that is inexpensive and has a high throughput.

(Method of Forming Electrically Conductive Film)

Next, an explanation is provided of a method of forming a coated electrically conductive film by coating a liquid material containing electrically conductive particles. This coated electrically conductive film can be produced using the apparatus shown in FIG. 5. At this time, liquid material stored in coating liquid storage unit 105 in FIG. 5 is used in which fine particles of metal or other electrically conductive substance are dispersed in a liquid such as an organic solvent. For example, a dispersion of fine silver particles having a particle diameter of 8–10 nm in terpineol or toluene and so forth is coated onto a substrate by a material discharge method.

Moreover, an electrically conductive film having a thickness of several hundred nanometers can be obtained if heat treatment is carried out at 250–300° C. with first heat treatment unit 103A in FIG. 5. Substances such as Au, Al, Cu, Ni, Co, Cr or ITO may also be used for the fine particles of an electrically conductive substance, and an electrically conductive film can be formed by a coating type of electrically conductive film formation apparatus. Since the resulting electrically conductive film is an aggregate of fine particles and extremely susceptible to oxidation, it is necessary that an inert gas atmosphere be provided in deposition chamber 110 and first heat treatment unit 103A.

In addition, the resistance value of the coated electrically conductive film may be roughly one power of ten higher than the bulk resistance value. In this case, the resistance value of the electrically conductive film is lowered by carrying out additional heat treatment at 300–500° C. on the coated electrically conductive film with second heat treatment unit 103B in FIG. 5. At the same time, the contact resistance between the source region of the TFT and the source wiring formed with the coated electrically conductive film, as well as the contact resistance between the drain region and the drain electrode formed with the coated electrically conductive film can be reduced. Lowering of the resistance of the coated electrically conductive film and reduction of the contact resistance can be carried out more effectively by carrying out high-temperature, short-duration heat treatment such as lamp annealing or laser annealing with the second heat treatment unit 103B. In addition, reliability can be improved by forming multiple layers of dissimilar metals. Since a base metal such as Al or Cu is comparatively easily oxidized in air, a precious metal layer such as Ag that is resistant to oxidation in air should be formed thereon.

(Method of Coating Liquid Material)

Figure 8:
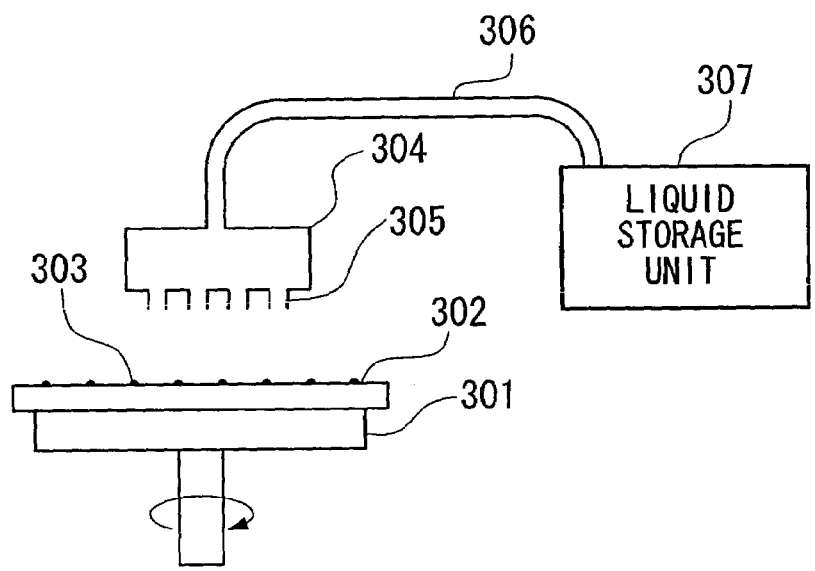
FIG. 8 is a block diagram of another liquid coating apparatus according to the present invention.
Figure 9:
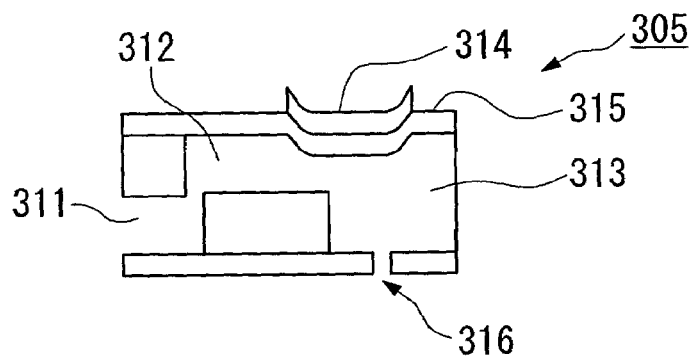
FIG. 9 is a partially enlarged view of the liquid coating apparatus shown in FIG. 8.
Figure 10:
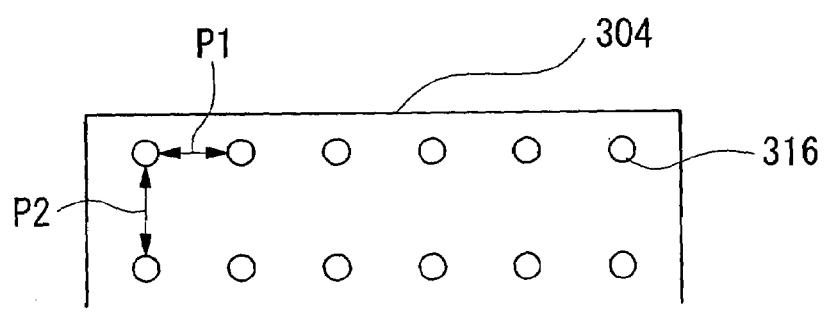
FIG. 10 is a partially enlarged view of the liquid coating apparatus shown in FIG. 8.

FIGS. 8 through 10 show a coating apparatus for using a material discharge method to coat a liquid such as a liquid material for forming a thin film or a liquid such as a resist used for a mask during photoetching. In the present embodiment, the explanation is provided using the example of a resist liquid for the coating liquid. The present embodiment can naturally also be used to for each of the above coated films without limiting to coating of a resist liquid.

In FIG. 8, a substrate 302 is vacuum suctioned on a stage 301. The liquid material is supplied from a liquid storage unit 307 to a dispenser head 304 through a supply line 306. The liquid material is then coated onto substrate 302 in the form of an extremely large number of dots 303 from a plurality of nozzles 305 provided on dispenser head 307.

FIG. 9 shows a detailed cross-sectional view of a nozzle 305. In FIG. 9, a similar structure to the head of a material discharge type of printer is employed to discharge liquid material with the vibration of piezo elements. The liquid material accumulates in a cavity portion 313 from an inlet portion 311 via a supply port 312. A vibrating plate 315 moves due to elongation and contraction of a piezo element 314 adhered to the vibrating plate 315, causing the volume of cavity 313 to decrease or increase. The liquid material is discharged from nozzle ports 316 when the volume of cavity 313 decreases, while the liquid material is supplied to cavity 313 from supply port 312 when the volume of cavity 313 increases. A plurality of nozzle ports 316 are arranged, for example, two-dimensionally as shown in FIG. 10, and as shown in FIG. 8, a coated film having an arbitrary pattern can be formed on the substrate by relative movement of substrate 302 and dispenser 304, and by switching the discharge of liquid material on and off.

In FIG. 10, nozzle ports 316 are arranged at a horizontal pitch P1 of several tens of micrometers and a vertical pitch P2 of several millimeters. The aperture of nozzle ports 316 is from several tens of micrometers to several hundred micrometers. The amount discharged for a single discharge is from several ten to several hundred nanograms, and the size of the droplets of liquid material that are discharged is from a diameter of several ten to several hundred micrometers. The liquid material coated in the form of dots immediately after being discharged from nozzles 305 is in the form of a circle having a diameter of several hundred micrometers. In the case of coating the liquid material onto the entire surface of a substrate, a coated film of uniform film thickness can be obtained by making the pitch of the above dots 303 several hundred micrometers and rotating the substrate for several seconds at a rotating speed of several hundred to several thousand rpm. The film thickness of the coated film can be controlled not only by the rotating speed and rotating time of the substrate, but also by the aperture of nozzle ports 316 and the pitch of dots 303.

The coating method used to coat the liquid material is a material discharge type of coating method, and since the coating material is coated in the form of dots over the entire surface of a substrate, the substrate should be moved, such as by rotating, so that the liquid material is coated onto those portions where there is no liquid material between dots 303. Consequently, the coating material can be used efficiently.

Furthermore, although the usage efficiency of the liquid material is several percent or less in the case of conventional spin coating, this method enables a usage efficiency of 50% or more. Since this method can also be applied to the formation of the insulating film, silicon film and electrically conductive film formed with a coated film as previously described, it is extremely effective in reducing the costs of image display apparatuses and electronic equipment.

In addition, since the aperture of nozzle ports 316 can be made to be even smaller in the case of liquid coating using a material discharge method, liquid material can be coated in the form of a linear pattern having a width of 10–20 μm. If this technology is used to form a silicon film or electrically conductive film, images can be depicted directly without requiring a photolithography step. If the design rule of a TFT is on the order of several tens of micrometers, a liquid crystal display apparatus can be produced without using a CVD apparatus, sputtering apparatus, ion implantation and doping apparatus, exposure apparatus or etching apparatus by combining this direct image depiction with a coating type of thin film formation technology. Namely, a liquid crystal display apparatus can be produced with only the material discharge type of liquid coating apparatus according to the present invention and a heat treatment apparatus such as a laser annealing apparatus or lamp annealing apparatus.

(Production Method of a Thin Film Device)

The following provides an explanation of the basic production process of a thin film device using FIGS. 1A through 1C, FIGS. 2D through 2G, and FIGS. 3H through 3J.

Figure 1A:
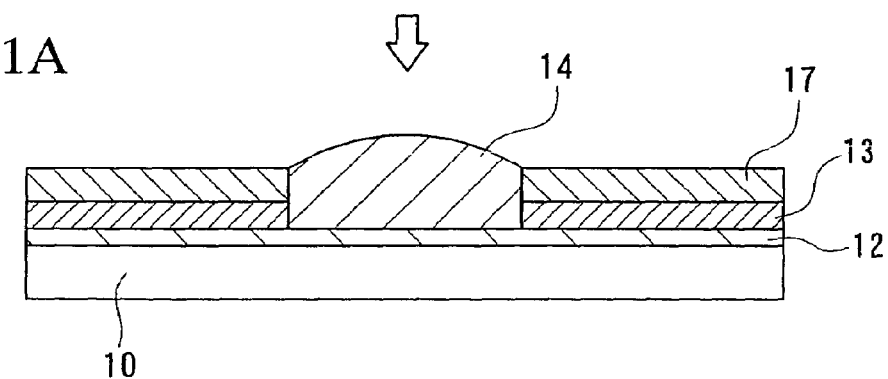
FIGS. 1A through 1C are cross-sectional views showing the production process of a thin film device according to a first embodiment of the present invention.

As shown in FIG. 1A, first insulating film (undercoating insulating film) 12 is formed on glass substrate 10, and second insulating film 13 is formed on said first insulating film 12. First insulating film 12 and second insulating film 13 are each formed by coating a first liquid material, in which, for example, polysilazane is mixed into a solvent, by spin coating followed by conversion to $SiO_2$ by heat treatment.

Next, the silicon film formation region is patterned by a photoetching step. First resist film 17 is formed on second insulating film 13, and first resist film 17 and a silicon film region of second insulating film 13 are etched by aligning with the pattern of said first resist film 17. At this time, a film composed of a self-organizing film may also be formed on the surface of first resist film 17. Alternatively, a self-organizing film may be formed on second insulating film 13 without forming first resist film 17. As another possibility, the surface of first resist film 17 is preferably imparted with liquid repellency by treatment with $CF_4$ plasma and so forth instead of the above. In this case, as a result of first resist film 17 being imparted with liquid repellency by treatment with $CF_4$ plasma and so forth, the liquid repellency with respect to the coated region relatively increases. Following formation of this film, a second liquid material containing silicon atoms is dropped towards the silicon film region by a material discharge method. Since the surface of first resist film 17 has liquid repellency, while the surface of first insulating film 12 with which the second liquid material makes contact has lyophilicity, the second liquid material is able to smoothly enter the silicon film region. Following completion of coating of the second liquid material, the organic solvent contained in the second liquid material is removed by heat treatment. The heating temperature of this heat treatment is about 100–150° C., and the heating time is about 5–30 minutes.

Figure 1B:
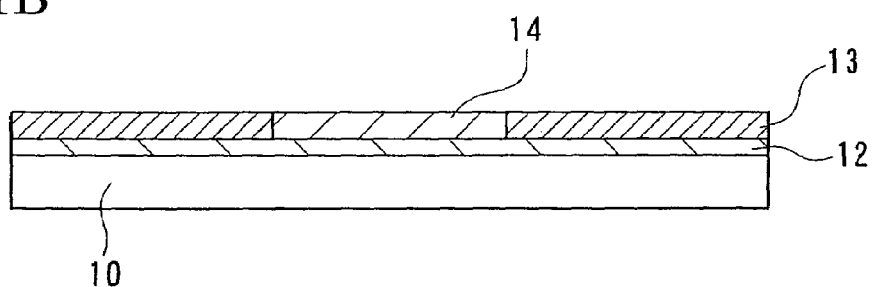

As shown in FIG. 1B, following heat treatment, first resist film 17 is removed, and the silicon coating region is solidified by a first heat treatment and a second heat treatment to form silicon film 14.

Figure 1C:
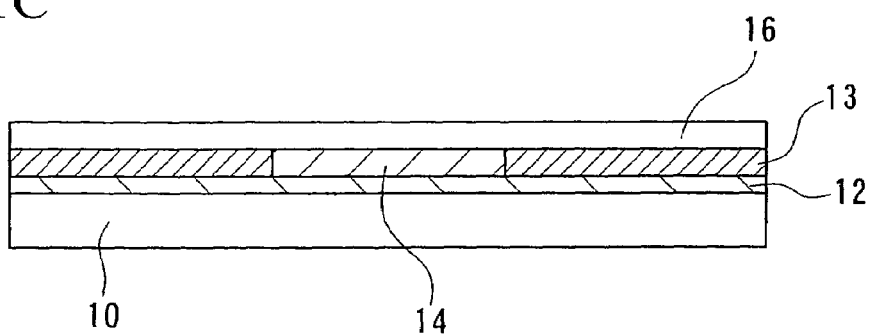

As shown in FIG. 1C, following formation of silicon film 14, a gate insulating film in the form of third insulating film 16 is formed on said silicon film 14 and second insulating film 13. Similar to the insulating film of the lower layer, the first liquid material, in which, for example, polysilazane is mixed into a solvent, is coated by spin coating followed by conversion to $SiO_2$ by heat treatment.

Figure 2D:
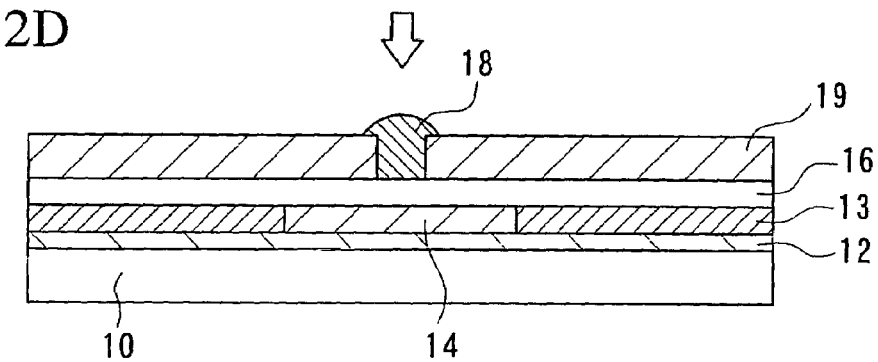
FIGS. 2D through 2G are cross-sectional views showing the production process of a thin film device according to a first embodiment of the present invention.

As shown in FIG. 2D, following formation of third insulating film 16, the gate electrode region is patterned by a photoetching step in the same manner as FIG. 1A. Second resist film 19 is formed on third insulating film 16 followed by patterning of the gate electrode formation region. At this time, a film composed of a self-organizing film may also be formed on the surface of second resist film 19. Alternatively, liquid repellency may be imparted to the surface of second resist film 19 by treatment with $CF_4$ plasma and so forth. In this case, as a result of liquid repellency being imparted to the first resist film by treatment with $CF_4$ plasma and so forth, liquid repellency with respect to the coating region relatively increases. Following formation of this film, a third liquid material containing gold or other metal particles is dropped towards the gate electrode region by a material discharge method. Since the surface of second resist film 19 has liquid repellency while the surface of third insulating film 16 with which the third liquid material makes contact has lyophilicity, the third liquid material is able to smoothly enter the silicon film region. Following completion of coating of the third liquid material, the organic solvent contained in the third liquid material is removed by heat treatment. The heating temperature of this heat treatment is about 100–150° C., and the heating time is about 5–30 minutes.

Figure 2E:
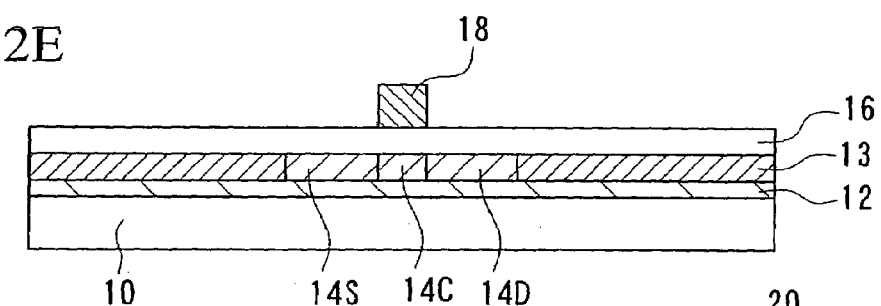

As shown in FIG. 2E, following heat treatment, second resist film 19 is removed and the gate electrode film is made to be increasingly fine by a second heat treatment to form gate electrode 18. This second heat treatment is carried out at, for example, within the range of a heating temperature of 350–450° C. and a heating time of about 60 minutes in a water vapor atmosphere. Next, following formation of gate electrode 18, impurities are injected towards silicon film 14, and source region 14S and drain region 14D, which are doped with a high concentration of impurities, and a channel region 14C between source region 14S and drain region 14D, are formed in silicon film 14.

Figure 2F:
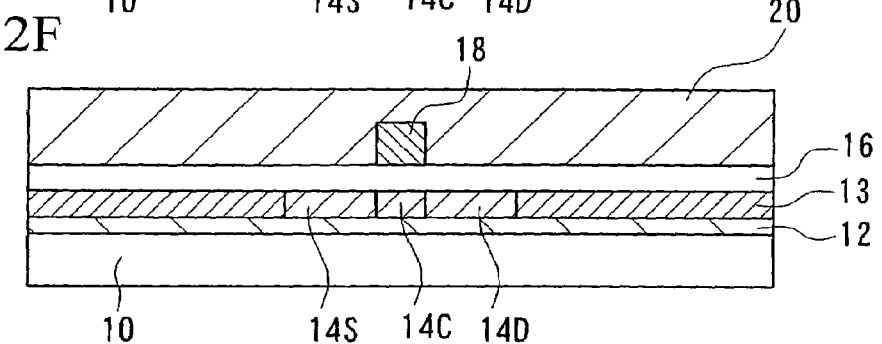

As shown in FIG. 2F, following completion of injection of impurities into silicon film 14, an interlayer insulating film in the form of a fourth insulating film 20 is formed on third insulating film 16 and gate electrode 18. Similar to the insulating layer below, fourth insulating film 20 is formed by coating a first liquid material in which, for example, polysilazane is mixed into a solvent, by spin coating followed by conversion to $SiO_2$ by heat treatment. Here, each of the insulating films is made increasingly fine and the injected impurities are activated by further applying heat treatment.

Figure 2G:
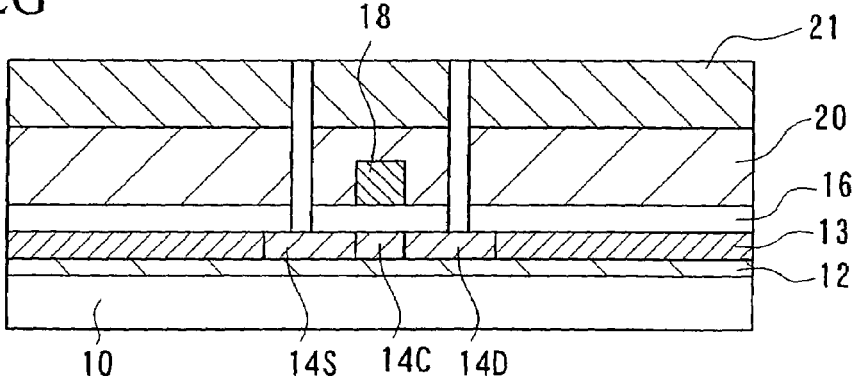

As shown in FIG. 2G, a third resist film 21 for forming contact holes is formed on fourth insulating film 20, and the contact holes are opened by etching to the surface of silicon film 14.

As shown in FIG. 3H, following formation of the contact holes, third resist film 21 is patterned into source electrode and drain electrode formation regions by additionally exposing third resist film 21.

As shown in FIG. 3I, after forming the formation regions of the electrode patterns, a fourth liquid material containing aluminum or other metal particles is dropped towards each of the source and drain electrode regions by a material discharge method. Since the surface of third resist film 21 has liquid repellency while the surface of fourth insulating film 20 where the fourth liquid material makes contact has lyophilicity, the fourth liquid material is able to smoothly enter each of the source and drain electrode regions. Following completion of coating of the fourth liquid material, the organic solvent contained in the fourth liquid material is removed by a first heat treatment, resulting in the formation of a solid metal film. The heating temperature of this heat treatment is within the range of, for example, 100–150° C., and the heating time is about 5–30 minutes.

As shown in FIG. 3J, following this heat treatment, fourth resist film 21 is removed and as a result of an additional second heat treatment, the metal film is baked resulting in the formation of low-resistance source electrode 24 and drain electrode 22. Following formation of these electrodes, a protective film (protective insulating layer) 26 is formed on the uppermost layer.

Furthermore, although a thin film device has been explained in the present first embodiment by using the example of the case of forming an active matrix substrate in a TFT, the present invention can be similarly applied to the same active matrix substrate for using other two-terminal or three-terminal elements such as MIM (Metal-Insulator-Metal) or MIS (Metal-Insulator-Silicon) elements as pixel switching elements. For example, although the thin film laminated structure of an active matrix substrate using MIM is composed only of an electrically conductive layer and insulating layer without containing a semiconductor layer, the present invention can be applied in this case as well. Moreover, the present invention may use, for example, electroluminescence (EL) independent of using liquid crystal for the display element. Moreover, the present invention can also be applied to thin film devices having various thin film laminated structures that include an electrically conductive layer and insulating layer as well as a semiconductor layer such as semiconductor devices containing TFT as well as digital mirror devices (DMD).

Next, an explanation is provided of second through seventh embodiments of the present invention in the case of applying the present invention to an active matrix substrate for an electro-optical apparatus in the form of a liquid crystal display apparatus, and particularly pixel electrodes formed with an electrically conductive coated film by a material discharge method.

[Second Embodiment]

(Method of Forming a Transparent Electrode)

The following provides an explanation of a method of forming a transparent electrode using an ITO film coated by a material discharge method. Deposition of this coated ITO film can also be carried out using the same apparatus as FIG. 5. The liquid material used in the present embodiment is a liquid in which an 8% mixture of organic indium and organic tin in xylole are blended at a ratio of 97:3 (for example, Adeka ITO coated film/ITO-103L, trade name, Asahi Denka Kogyo). Furthermore, liquid materials in which the ratio of organic indium and organic tin is within the range of 99:1 to 90:10 can also be used for the liquid material.

The liquid material is stored in coating liquid storage unit 105 of FIG. 5, and discharged onto the substrate by a material discharge type of coating apparatus in deposition chamber 110 to form a coated film. Although heat treatment is performed on this coated film after it has been formed, the heat treatment conditions are set as described below. First, a first heat treatment is carried out in first heat treatment unit 103A of FIG. 5 for 30 to 60 minutes in an air or oxygen atmosphere at 250–450° C. Next, a second heat treatment is carried out in second heat treatment unit 103B for 30 to 60 minutes in a hydrogen-containing atmosphere at 200–400° C.

As a result, organic components are removed and a mixed film of indium oxide and tin oxide (ITO film) is formed. As a result of the above heat treatment, an ITO film having a film thickness of about 50 to about 200 nm can be obtained provided with sheet resistance of $10^2$–$10^4$ $\Omega/\square$, optical transmittance of 90% or more and adequate performance as a pixel electrode. Although the sheet resistance of the ITO film following the above first heat treatment is on the order of $10^5$–$10^6$ $\Omega/\square$, sheet resistance is decreased to the order of $10^2$–$10^4$ $\Omega/\square$ due to the above second heat treatment.

(First Embodiment of a Liquid Crystal Display Apparatus)

Figure 11:
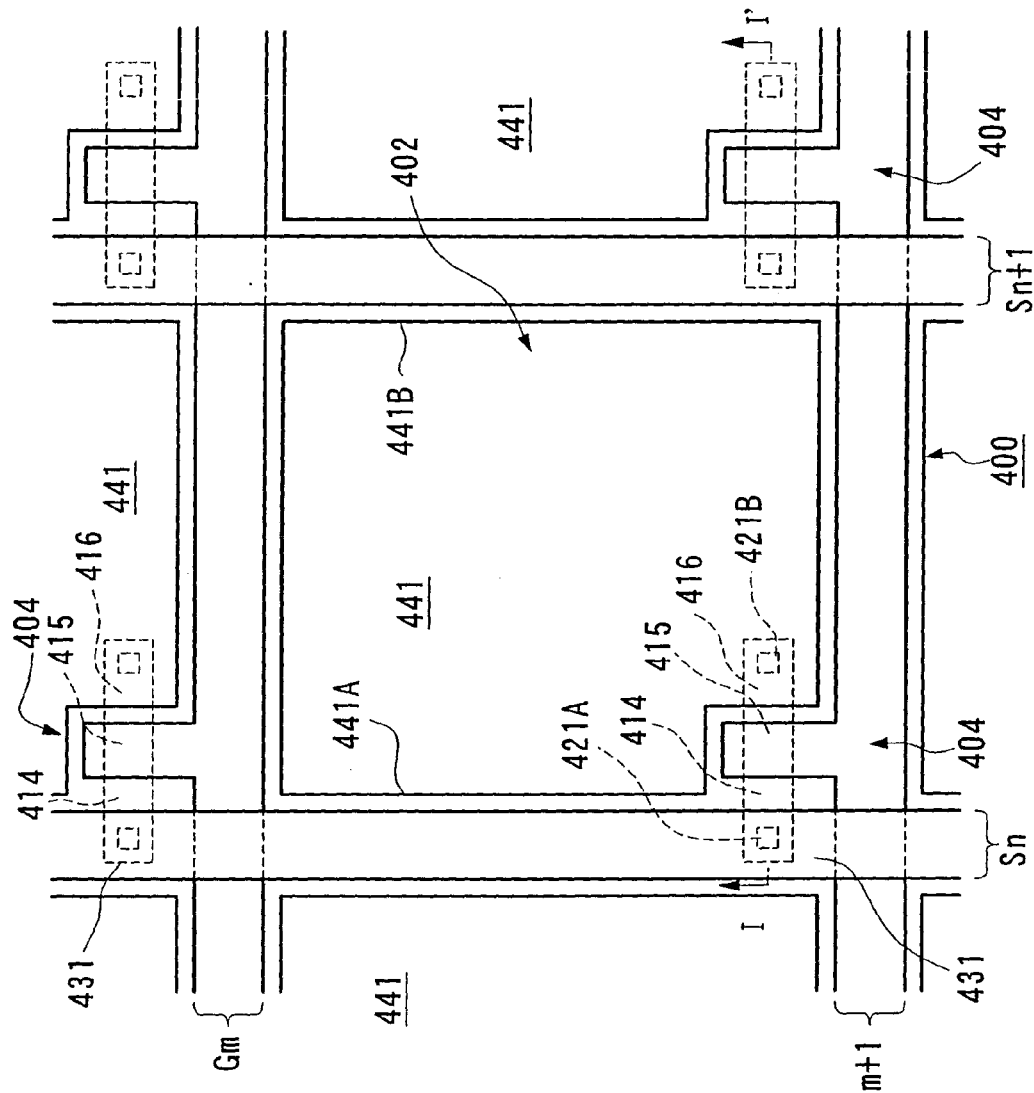
FIG. 11 is an overhead view showing an enlarged view of a portion of a pixel region that is partitioned and formed on an active matrix substrate for a liquid crystal display apparatus as claimed in a second embodiment of the present invention.
Figure 12:
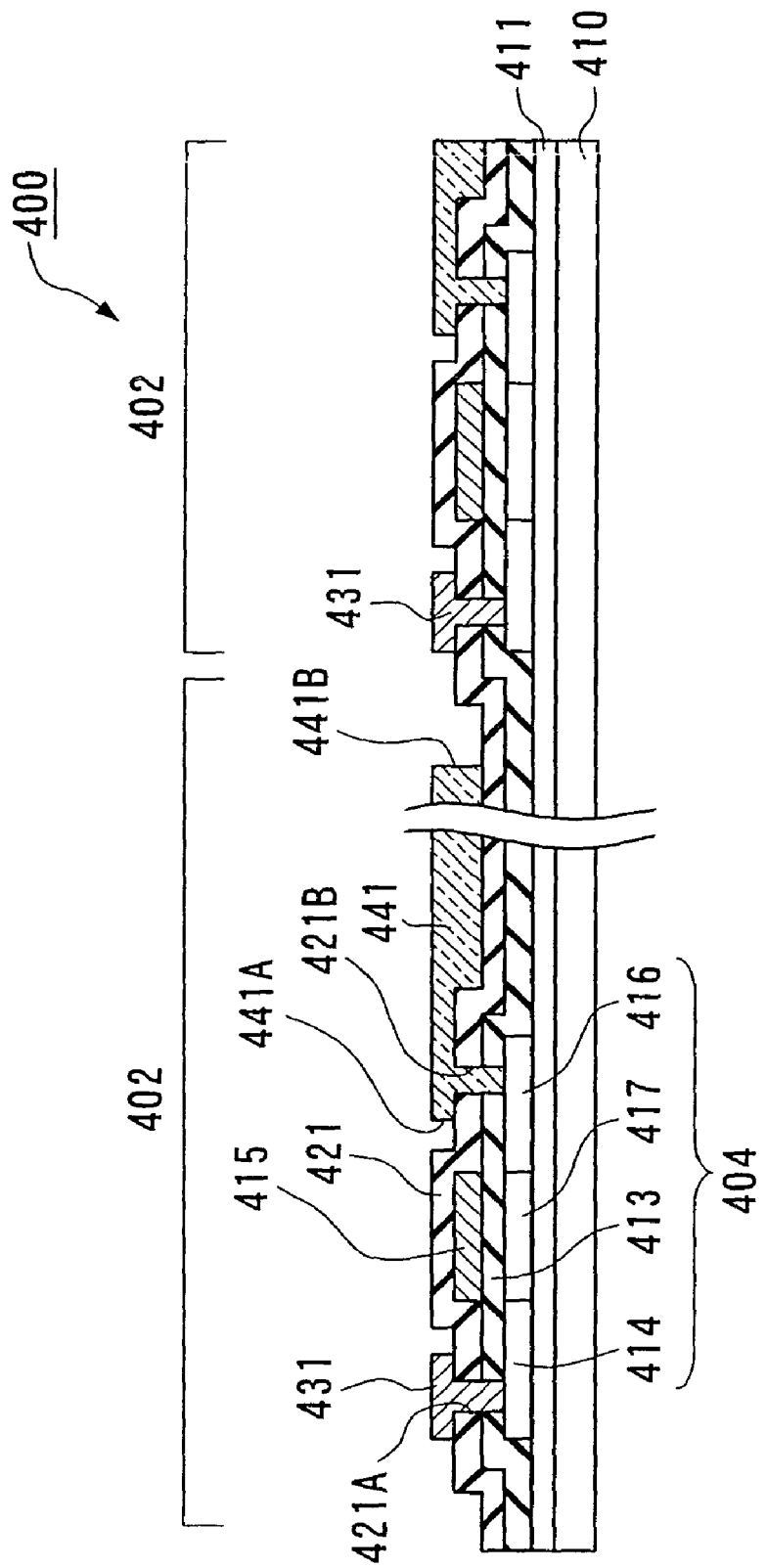
FIG. 12 is a cross-sectional view taken at the location corresponding to line I–I' of FIG. 11.

FIG. 11 is an overhead view showing an enlarged view of a portion of a pixel region that is partitioned and formed on an active matrix substrate for a liquid crystal display apparatus, while FIG. 12 is a cross-sectional view taken at the location corresponding to line I–I' of FIG. 11.

In FIGS. 11 and 12, in an active matrix substrate 40 for a liquid crystal display apparatus, the top of insulating substrate 410 is partitioned into a plurality of pixel regions 402 by data lines Sn, Sn+1, . . . and scanning lines Gm, Gm+1, . . . , and a TFT 40 is formed for each pixel region 402.

TFT 404 has a channel region 417 for forming a channel between a source region 414 and a drain region 416, a gate electrode 415 that opposes said channel region 417 with a gate insulating film 413 interposed between, an interlayer insulating film 421 formed on the surface side of said gate electrode 415, a source electrode 431 electrically connected to source region 414 through a contact hole 421A of said interlayer insulating film 421, and pixel electrode 441 composed of an ITO film electrically connected to drain region 416 through a contact hole 421B of interlayer insulating film 421. Source electrode 431 constitutes a portion of data lines Sn, Sn+1, . . . , while gate electrode 415 constitutes a portion of scanning lines Gm, Gm+1, . . .

Similar to source electrode (data lines) 431, pixel electrode 441 is formed on the surface of interlayer insulating film 421. Consequently, in pixel electrode 441, peripheral edges 441A and 441B parallel to data lines Sn, Sn+1, . . . are composed to be located much farther to the inside than data lines Sn, Sn+1, . . .

FIGS. 14A through 14D and FIGS. 15A through 15C are cross-sectional process drawings showing the production method of the active matrix substrate of the present embodiment. In the production method of active matrix substrate 400, general-purpose non-alkaline glass is first used for insulating substrate 410 as shown in FIG. 14A.

First, after cleaning insulating substrate 410, an undercoating protective film 411 composed of a silicon oxide film and so forth is formed on insulating substrate 410 by the coating method of the present invention (material discharge method) or by CVD, PVD and so forth. Examples of CVD include low pressure CVD (LPCVD) and plasma CVD (PECVD). Examples of PVD include sputtering. Furthermore, undercoating protective film 411 may be omitted depending on the impurities contained in insulating substrate 410 or the degree of cleanliness of said substrate surface.

Next, an intrinsic silicon film in the form of semiconductor film 406 is formed to serve as the active layer of TFT 404. This semiconductor film 406 can also be formed by the coating method of the present invention (material discharge method) or by CVD, PVD and so forth. The semiconductor film 406 obtained in this manner can be used directly as a semiconductor layer of the channel region of a TFT in the form of an amorphous silicon film. In addition, as shown in FIG. 14B, crystallization of semiconductor film 406 may be promoted by short-term radiation of light energy such as laser light or electromagnetic energy.

Next, after forming a resist mask having a predetermined pattern, semiconductor film 406 is patterned using this resist mask resulting in an island-shaped semiconductor film 412 as shown in FIG. 14C. After patterning semiconductor film 412, gate insulating film 413 is formed with the coating method of the present invention (material discharge method) or by PVD or CVD and so forth.

Next, a thin film such as an aluminum film to serve as a gate electrode is formed by sputtering or the coating method of the present invention (material discharge method). Normally, the gate electrode and gate wiring are formed by the same step with the same metal material and so forth. After depositing the thin film to serve as the gate electrode, as shown in FIG. 14D, pattering is performed to form gate electrode 415. Scanning lines are also formed at this time. Next, impurity ions are then introduced into semiconductor film 412 to form source region 414 and drain region 416. The portion at which impurity ions are not introduced becomes channel region 417. In this method, although channel region 417 has a self-organizing structure formed only beneath gate electrode 415 since gate electrode 415 serves as a mask for ion injection, a TFT having an offset gate structure or LDD structure may also be employed.

An ion doping method, in which hydrogen compounds of injected impurity elements and hydrogen are injected using a non-mass separating ion injection system, or an ion implantation method, in which only desired impurity ions are injected using a mass separating ion injection system, may be applied for introduction of impurity ions. Hydrides of injected impurities such as phosphine ($PH_3$) or diborane ($B_2H_6$), in which the diluted concentration in hydrogen is about 0.1%, are used for the raw material gas of ion doping.

Next, as shown in FIG. 15A, an interlayer insulating film 421 composed of a silicon oxide film is formed with the coating method of the present invention (material discharge method) or by CVD or PVD and so forth. Following ion injection and formation of interlayer insulating film 421, heat treatment is performed for several tens of minutes to several hours in a suitable thermal environment at about 350° C. or lower to activate the injection ions and bake on interlayer insulating film 421.

Next, as shown in FIG. 15B, contact holes 421A and 421B are formed at locations corresponding to source region 414 and drain region 416 of interlayer insulating film 421. Next, after forming an aluminum film and so forth for forming the source electrode by sputtering or the coating method of the present invention, sputtering is performed to form source electrode 431. Data lines may also be formed at this time.

Next, as shown in FIG. 15C, ITO film 408 is coated and deposited on the entire surface of interlayer insulating film 421. In the coating and deposition of this ITO film 408, a coating material of a liquid material may be used, and coating may be performed by a material discharge method. In this second embodiment as well, the film coated on the surface side of insulating substrate 410 is subjected to heat treatment (baking) after removing the solvent by drying. At this time, the heat treatment conditions consist of, for example, performing a first heat treatment for 30–60 minutes in an air or oxygen atmosphere at 250–450° C., followed by a second heat treatment for 30–60 minutes in a hydrogen-containing atmosphere at 200–400° C. As a result, the organic components are removed and mixed film of indium oxide and tin oxide (ITO film) is formed.

As a result of this heat treatment, an ITO film having a film thickness of about 50 to about 200 nm can be obtained provided with sheet resistance of $10^2$–$10^4$ Ω/□, optical transmittance of 90% or more and adequate performance as a pixel electrode 441. Although the sheet resistance of the ITO film following the first heat treatment is on the order of $10^5$–$10^6$ Ω/□, sheet resistance decreases to the order of $10^2$–$10^4$ Ω/□ due to the second heat treatment.

After forming ITO film 408, patterning is performed and when pixel electrode 441 is formed as shown in FIG. 12, TFT 404 is formed in each pixel region 402. Thus, if TFT 404 is driven by control signals supplied along scanning lines Gm, image data can be written into liquid crystal cells sealed between pixel electrode 441 and an opposing substrate (not shown) from data lines Sn via TFT 404 to perform the prescribed display.

In this manner, in this second embodiment, in the forming of an ITO film for forming a pixel electrode 441, since a liquid coating material is coated onto insulating substrate 410 by a coating deposition method such as a material discharge method suitable for processing large substrates, differing from sputtering and other deposition methods requiring expensive and complicated deposition apparatuses provided with a vacuum system, the ITO film can be deposited with an inexpensive deposition apparatus.

Figure 19A:
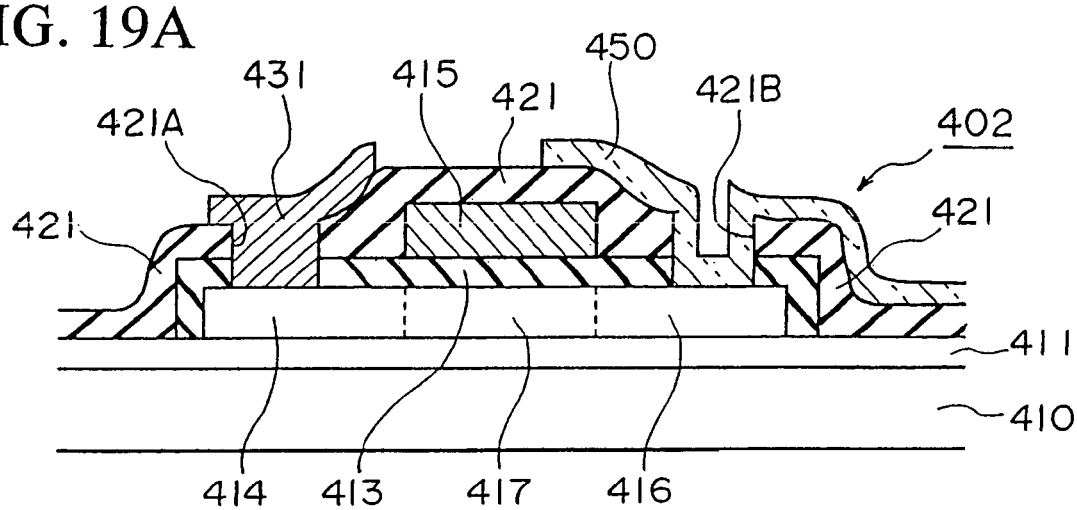
FIGS. 19A and 19B are longitudinal cross-sectional views showing enlarged views of the vicinity of a contact hole in a comparative example and an embodiment of the present invention, respectively.
Figure 19B:
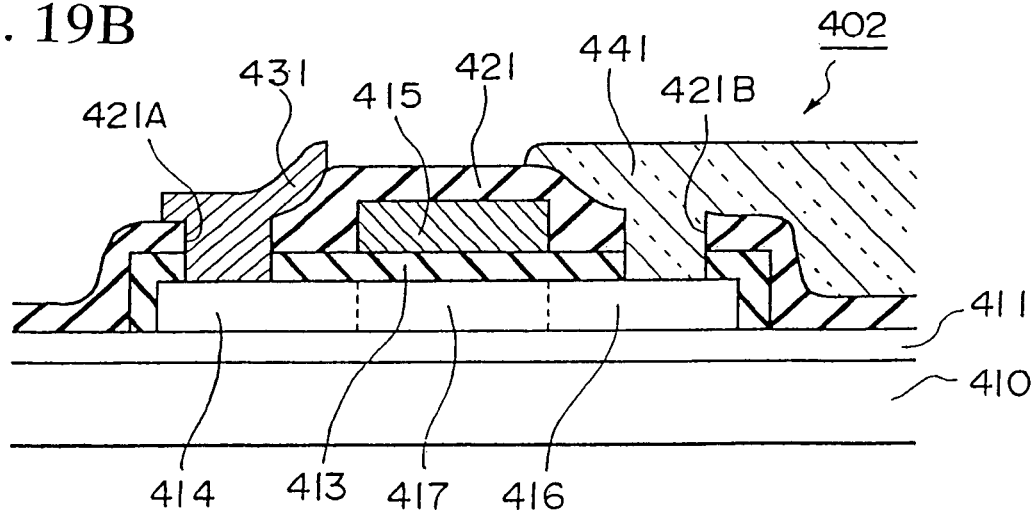

Moreover, depending on the coating deposition method, as shown in FIG. 19B, since the coating material can be smoothly filled into contact hole 421B when coating a liquid or paste-like coating material for composing pixel electrode 441 onto the surface of interlayer insulating film 421, the shape of the surface of pixel electrode 441 is resistant to the effects of surface irregularities and so forth in the lower layer. For this reason, since a flat pixel electrode 441 (electrically conductive film) free of level differences in its surface can be formed, together with lapping being able to be performed stably, the occurrence of a reverse tilt domain can be prevented. Accordingly, display quality is improved by this second embodiment.

In contrast, as shown in FIG. 19A, when a pixel electrode is formed with sputtered ITO film 450, sputtered ITO film 450 ends up being formed along the same level difference as the surface in which this sputtered ITO film 450 is formed. This level difference formed in the surface of sputtered ITO film 450 causes defects such as unstable lapping and the occurrence of a reverse tilt domain, and causes a decrease in display quality.

Moreover, since it is difficult to form sputtered ITO film 450 so that it completely fills contact hole 421B, an opening ends up being formed there. The presence of this opening also causes unstable lapping and a reverse tilt domain. Thus, it is useful to form pixel electrode 441 with a coated ITO film as shown in FIG. 19B.

[Third Embodiment]

(Second Embodiment of Liquid Crystal Display Apparatus)

Figure 16:
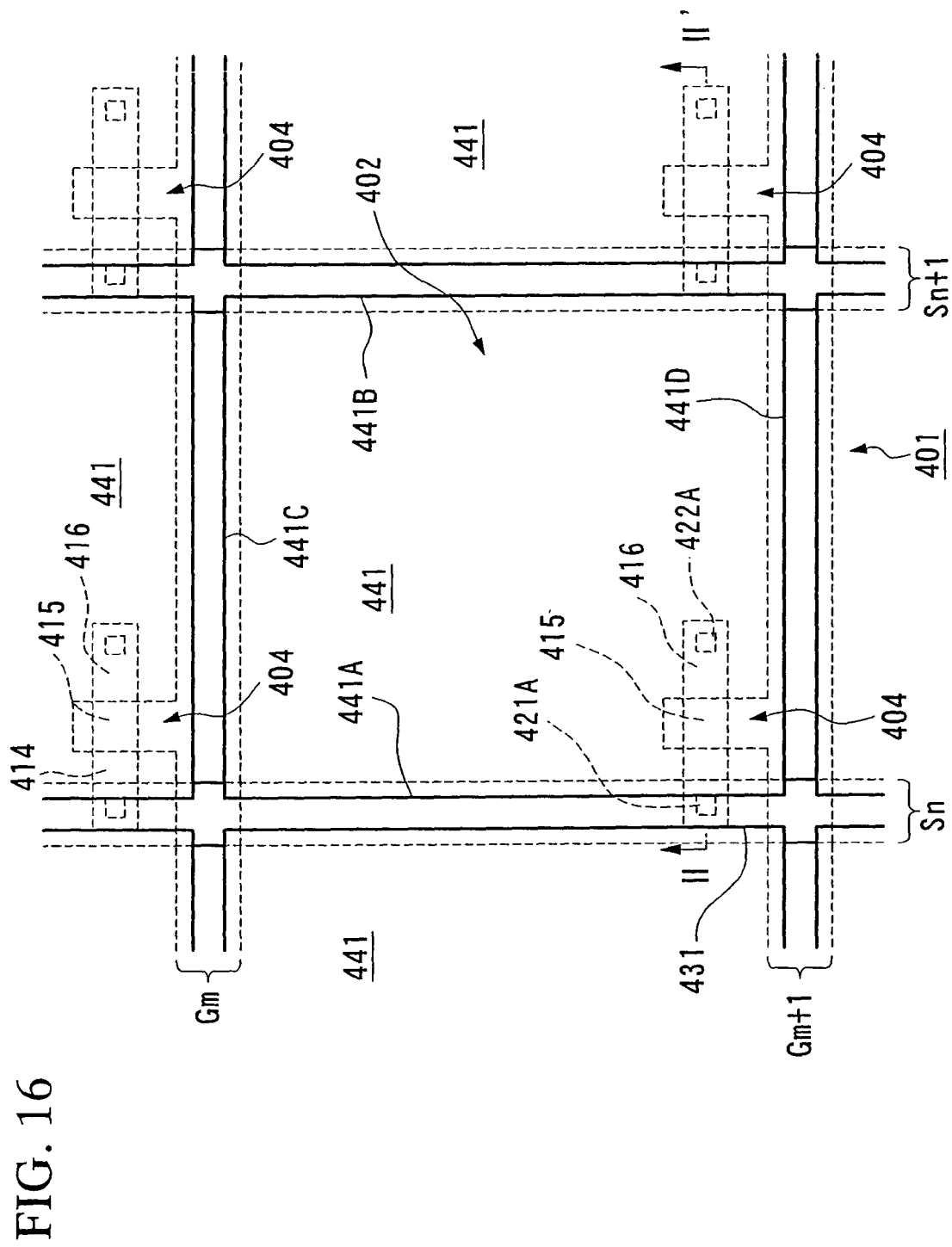
FIG. 16 is an overhead view showing an enlarged view of a portion of a pixel region partitioned and formed on an active matrix substrate for a liquid crystal display apparatus as claimed in a third embodiment of the present invention.
Figure 17:
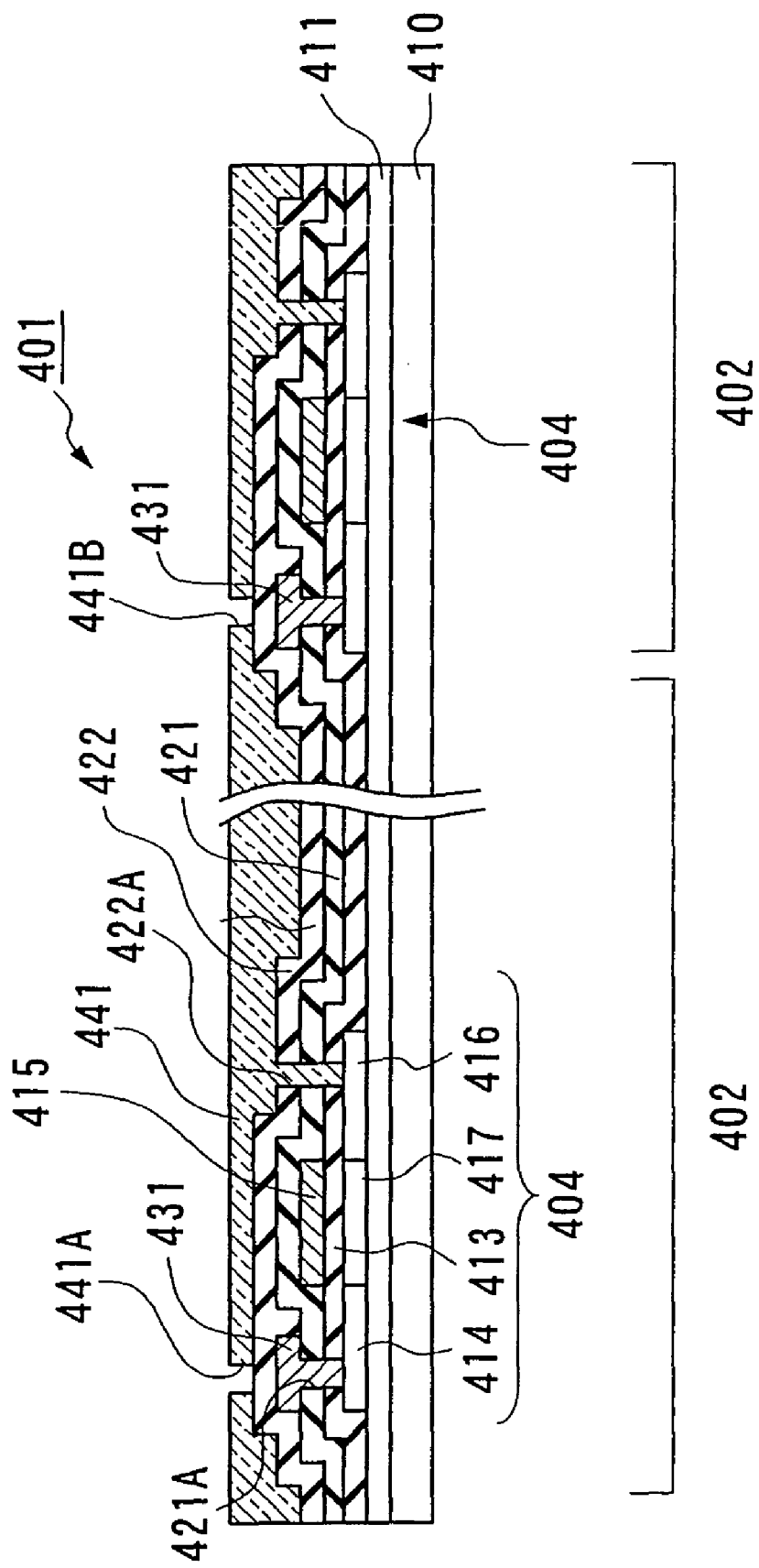
FIG. 17 is a cross-sectional view taken at the location corresponding to line II–II' of FIG. 16.

FIG. 16 is an overhead view showing an enlarged view of a portion of a pixel region partitioned and formed on an active matrix substrate for a liquid crystal display apparatus, while FIG. 17 is a cross-sectional view taken at the location equivalent to line II–II' of FIG. 16.

In FIGS. 16 and 17, those points that differ between the thin film device structure on active matrix substrate 401 for a liquid crystal display apparatus as claimed in the third embodiment and the thin film device structure on active matrix substrate 400 of the second embodiment are as described below. First, in this third embodiment, the interlayer insulating film employs a two-layer structure consisting of lower layer side interlayer insulating film 421 located on the lower layer side on the surface side of gate electrode 415, and upper layer side interlayer insulating film 422 formed on the surface of said lower layer side interlayer insulating film 421. Here, source electrode 421 is formed on the surface of lower layer side interlayer insulating film 421, and is electrically connected to source region 414 via contact hole 421A of lower layer side interlayer insulating film 421.

In contrast, pixel electrode 441 is formed on the surface of upper layer side interlayer insulating film 422, and is electrically connected to drain region 416 via upper layer side interlayer insulating film 422 and contact hole 422A of lower layer side interlayer insulating film 421. In this manner, since pixel electrode 441 is composed in a layer differing from source electrode 431, there is no shorting between these electrodes.

Therefore, in this third embodiment, as can be understood from FIG. 16, in any of pixel regions 402, two peripheral edges 441A and 441B of pixel electrode 441 parallel to data lines Sn and Sn+1 are formed so as to be located above data lines Sn and Sn+1 in the space between adjacent elements. In addition, two peripheral edges 441C and 441D of pixel electrode 441 parallel to scanning lines Gm and Gm+1 are formed so as to be located above scanning lines Gm and Gm+1 in the space between adjacent elements. Namely, portions of pixel electrode 441 are covering data lines Sn and Sn+1 as well as scanning lines Gm and Gm+1. Thus, there are no gaps when viewed from above between the four peripheral edges 441A through 441D of pixel electrode 441 and data lines Sn and Sn+1 and scanning lines Gm and Gm+1. For this reason, data lines Sn and Sn+1 as well as scanning lines Gm and Gm+1 themselves function as a black matrix. As a result, high-quality display can be performed without increasing the number of steps for forming a black matrix layer.

The production method of this type of active matrix substrate 401 is in common with FIGS. 14A through 14D explained in the second embodiment. Therefore, in the following explanation, those steps following the step shown in FIG. 14D are explained with reference to FIGS. 18A through 18D.

First, as shown in FIG. 18A, after having formed source region 414, drain region 416, channel region 417, gate insulating film 413 and gate electrode 415, a lower layer side interlayer insulating film 421 composed of a silicon oxide film is formed on the surface side of gate electrode 415 with the coating method of the present invention (material discharge method) or by CVD or PVD.

Next, as shown in FIG. 18B, contact hole 421A is formed at the location corresponding to source region 414 in lower layer side interlayer insulating film 421. Next, after sputtering an aluminum film for forming source electrode 431 and data wires, the aluminum film is patterned to form source electrode 431 and data wires Sn, Sn+1 . . .

Next, as shown in FIG. 18C, an upper layer side interlayer insulating film 422 composed of a silicon oxide film is formed on the surface of lower layer side interlayer insulating film 421 with the coating method of the present invention or by CVD or PVD. Furthermore, in this case, the use of the coating method of the present invention is preferable since the surface of the interlayer insulating film can be made to be flat. Next, contact hole 422A is formed at the location corresponding to drain region 416 in lower layer side interlayer insulating film 421 and upper layer side interlayer insulating film 422. Next, as shown in FIG. 18D, an ITO film 409 is coated and deposited over the entire surface of interlayer insulating film 422.

In the performing of this coating and deposition, similar to the first and second embodiments, a liquid coating material can be used, and the liquid coating material can be coated using a material discharge method. In addition, in this third embodiment as well, the first and second heat treatments previously described are also performed on the coated ITO film 409 to lower the sheet resistance.

Subsequently, pixel electrode 441 is formed as shown in FIG. 17 by patterning ITO film 409. At this time, as was explained with reference to FIG. 16, each pixel region 402 is patterned so that the four peripheral edges 441A through 441D of pixel electrode 441 cover data lines Sn and Sn+1 as well as scanning lines Gm and Gm+1 in the spaces between adjacent pixels. Since the data lines and scanning lines are normally formed with a metal film, these data lines and scanning lines are light blocking films, and can be used as a black matrix. For this reason, high-quality display can be performed without increasing the number of steps.

Moreover, since the formation range has been maximally enlarged until pixel region 441 covers the data lines and scanning lines, the numerical aperture of pixel region 402 is high. This results in improved display brightness. In addition, in this third embodiment, in the formation of an ITO film for forming pixel electrode 441, since a liquid coating material is coated onto insulating substrate 410 by a material discharge method suitable for processing of large substrates, as shown in FIG. 19B, the lower layer side of pixel electrode 441 is thicker at the portion in which the lower layer side is concave, and thinner at the portion in which the lower layer side is convex. Thus, surface irregularities caused by the data lines are not reflected on the surface of pixel electrode 441. For this reason, since a flat pixel electrode 441 can be formed that is free of level differences in its surface, together with lapping being able to be performed stably, the occurrence of a reverse tilt domain can be prevented. This advantage applies similarly to the upper layer side of the scanning lines. Accordingly, display quality is improved by the present invention.

Moreover, in the formation of the ITO film for forming pixel electrode 441, since a liquid coating material is coated onto insulating substrate 410 by spin coating, differing from sputtering and other deposition methods requiring expensive and complicated deposition apparatuses provided with a vacuum system, the ITO film can be deposited with an inexpensive deposition apparatus.

Moreover, since the coating deposition method has superior level difference covering, even if contract holes 421A and 422A of lower layer side interlayer insulating film 421 and upper layer side interlayer insulating film 422 are present in the lower layer side, their large surface irregularities do not have an effect on the shape of the surface of pixel electrode 441 (ITO film). Namely, since an interlayer insulating film is formed having a two-layer structure consisting of lower layer side interlayer insulting film 421 and upper layer side interlayer insulating film 422, even if surface irregularities caused by contact holes 421 A and 422A are large, flat pixel electrode 441 can be formed that is free of level differences in its surface. Thus, a structure can be employed in which pixel electrode 441 is connected directly to drain region 416, and the production process can be simplified by not having to form a relay electrode (via) directly connected to drain region 416 between lower layer side interlayer insulating film 421 and upper layer side interlayer insulating film 422.

Furthermore, although a material discharge method was used in this third embodiment as well since an ITO film was formed from a liquid coating material, the ITO film can also be formed using a printing method if a paste-like coating material is used. Moreover, since screen printing can be utilized if a paste-like coating material is used, that resulting from printing the paste-like coating material only on the region at which pixel electrode 441 is to be formed followed by drying and heat treatment may be used directly as pixel electrode 441. In this case, since the ITO film is not required to be patterned by etching, this offers the advantage of a considerable reduction in production costs.

In addition, although the explanations of the second and third embodiments used the example of a planar type of TFT film, in which the shape of the surface of pixel electrode 441 is susceptible to the effects of the presence of contact holes in the interlayer insulating film, if the present invention is applied to the case of forming a pixel electrode in a region where there are surface irregularities on the lower layer side, the effects of the surface irregularities on the shape of the surface of the pixel electrode can be removed even for an inverted staggered TFT.

[Fourth Embodiment]

(Third Embodiment of Liquid Crystal Display Apparatus)

Figure 20:
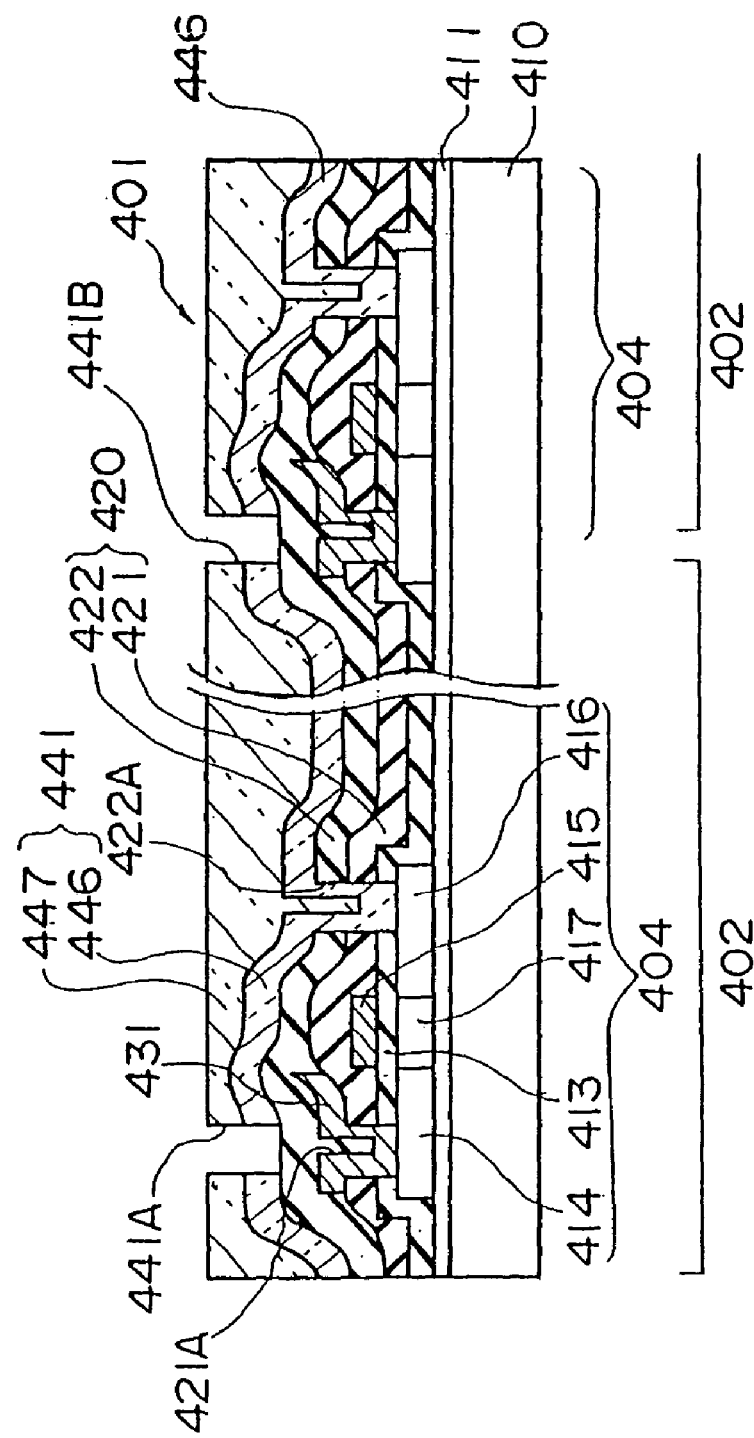
FIG. 20 is a longitudinal cross-sectional view showing the structure of a fourth embodiment taken at the location corresponding to line II–II' of FIG. 16.
Figure 21A:
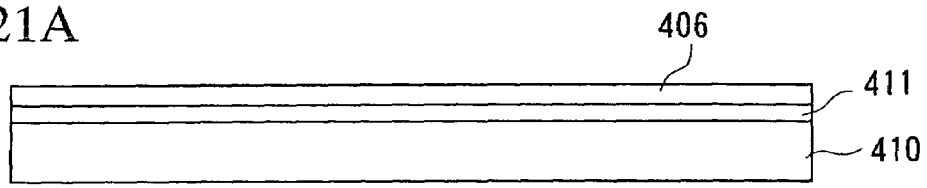
FIGS. 21A through 21E are cross-sectional views showing the production method of the active matrix substrate shown in FIG. 20.
Figure 21B:
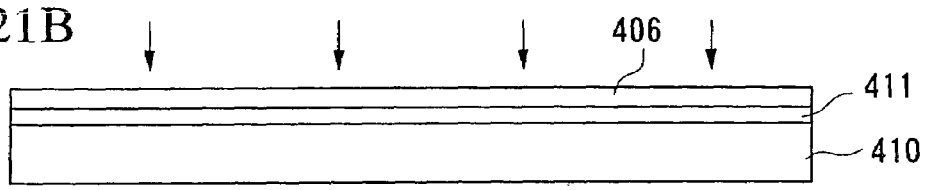
Figure 21C:
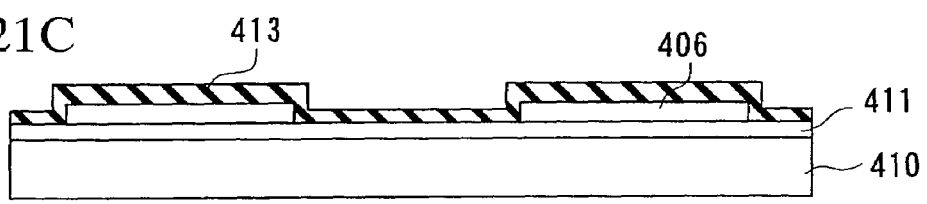
Figure 21D:
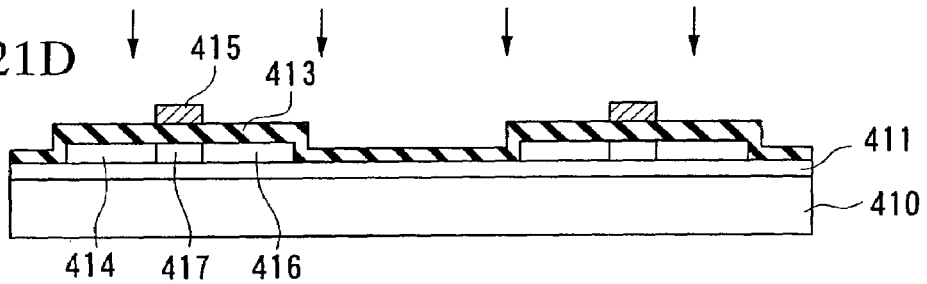
Figure 21E:
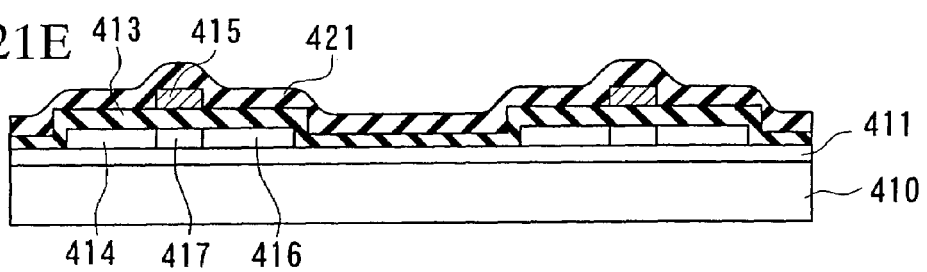

A structure in which the cross-section taken along line II–II' of FIG. 16 differs from that of FIG. 17 of the third embodiment is shown in FIG. 20 as the structure of the fourth embodiment. In this fourth embodiment as well, interlayer insulating film 420 has a two-layer structure composed of a lower layer side interlayer insulating film 421 located on its lower layer side, and an upper layer side interlayer insulating film 422 located on the surface of this lower layer side interlayer insulating film 421.

The structure shown in FIG. 20 differs from that of FIG. 17 with respect to pixel electrode 441 having a two-layer structure consisting of a sputtered ITO film 446 sputtered on the surface of upper layer side interlayer insulating film 422 (electrically conductive sputtered film), and coated ITO film 447 coated and deposited on the surface of this sputtered ITO film 446 (electrically conductive transparent coated film). Thus, coated ITO film 447 is electrically connected to drain region 416 via sputtered ITO film 446 located on its lower layer side. Since sputtered ITO film 446 and coated ITO film 447 are formed by patterning collectively as will be described later, their formation regions are the same. Since the structure is the same as that shown in FIG. 17 aside from this difference, the same reference symbols as those used in FIG. 17 are used, and a detailed explanation is omitted.

In the structure of this fourth embodiment as well, since its two-dimensional layout is the same as FIG. 16 used to explain the third embodiment, data lines Sn, Sn+1 . . . and scanning lines Gm, Gm+1 . . . themselves function as a black matrix. Thus, high-quality display can be performed without increasing the number of steps.

In the third embodiment, coated ITO film that makes contact with drain region 416 tends to have a higher contact resistance as compared with a sputtered ITO film. In this fourth embodiment, since coated ITO film 447 is merely electrically connected to drain region 416 via sputtered ITO film 446, there is the advantage of being able to solve the problem of large contact resistance.

The production method of such an active matrix substrate 401 is explained with reference to FIGS. 21A through 21E and FIGS. 22A through 22E. Here, since FIGS. 21A through 21E are the same as FIGS. 14A through 14D and FIG. 18A used to show the process of the third embodiment, their explanation is omitted. In addition, FIGS. 22B and 22C are the same as FIGS. 18B and 18C used to show the process of the third embodiment.

Figure 22A:
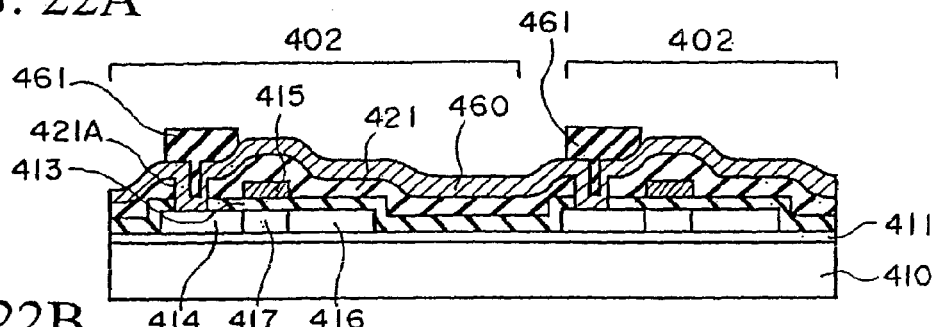
FIGS. 22A through 22E are cross-sectional views showing the steps carried out subsequent to the processes of FIGS. 21A through 21E.
Figure 22B:
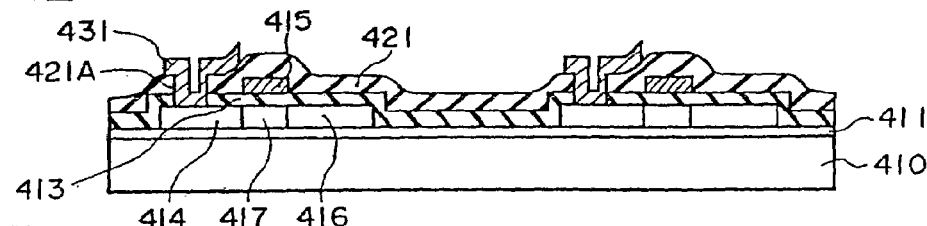

FIG. 22A shows a resist pattern formation step as the step prior to FIG. 22B. In order to form the source electrode 431 and source lines shown in FIG. 22B, an aluminum film 460 is formed by sputtering in FIG. 22A. Subsequently, a patterned resist mask 461 is formed on this aluminum film 460. Source electrode 431 and data lines are formed as shown in FIG. 22B by etching aluminum film 460 using this resist film 461.

Figure 22C:
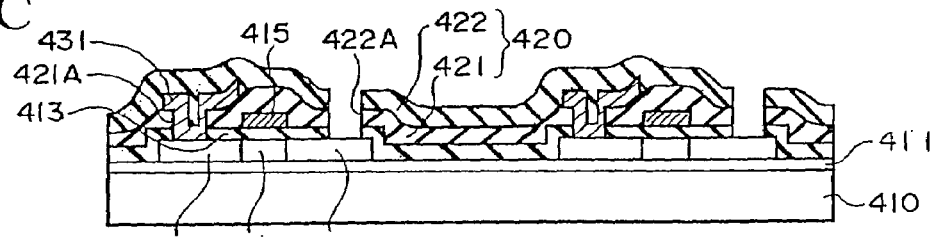

Next, as shown in FIG. 22C, upper layer side interlayer insulating film 422 composed of a silicon oxide film is formed on the surface of lower layer side interlayer insulating film 421 with the coating method of the present invention (material discharge method) or by CVD or PVD. Following ion injection and formation of interlayer insulating film 420, heat treatment for several tens of minutes to several hours is performed in a suitable thermal environment at about 350° C. or lower to activate the injection ions and bake on interlayer insulating film 420 (lower layer side interlayer insulating film 421 and upper layer side interlayer insulating film 422).

Figure 22D:
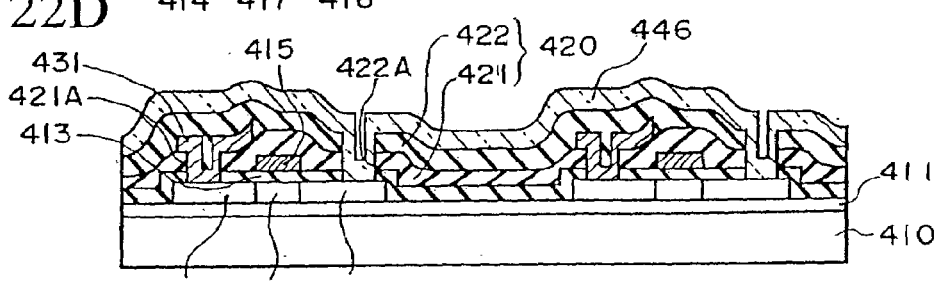

Next, contact hole 422A is formed at the location corresponding to drain region 416 in lower layer side interlayer insulating film 421 and upper layer side interlayer insulating film 422. Next, as shown in FIG. 22D, sputtered ITO film 446 (electrically conductive sputtered film) is formed by sputtering over the entire surface of interlayer insulating film 420 composed of lower layer side interlayer insulating film 421 and upper layer side interlayer insulating film 422.

Figure 22E:
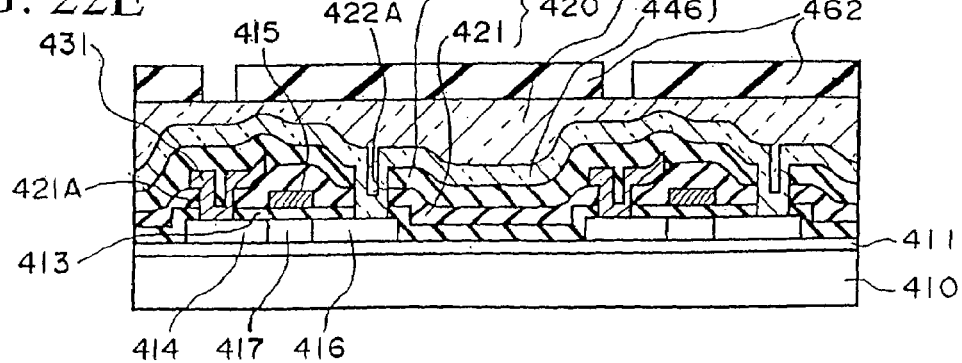

Continuing, as shown in FIG. 22E, coated ITO film 447 (electrically conductive transparent coated film) is formed on the surface of sputtered ITO film 446. In the formation of this coated ITO film 447, the same process conditions can be employed as in the second and third embodiments. A liquid or paste-like coated film coated on the surface side in this fourth embodiment is then subjected to heat treatment in a heat treatment apparatus following drying and removal of solvent.

Heat treatment is performed under heat treatment conditions consisting of, for example, performing a first heat treatment (baking) for 30–60 minutes in an oxygen-containing atmosphere or non-reducing atmosphere at a temperature of 250–500° C., and preferably 250–400° C., followed by performing a second heat treatment for 30–60 minutes in a hydrogen-containing reducing atmosphere at a temperature of 200° C. and above, and preferably 200–350° C. In either case, the treatment temperature in the second heat treatment is set to be lower than the treatment temperature of the first heat treatment so that the film stabilized with the first heat treatment is not subjected to thermal decomposition.

When heat treatment is performed in this manner, in addition to the organic components being removed, the coated film consists of a mixed film of indium oxide and tin oxide (coated ITO film 447). As a result, coated ITO film 447 having a film thickness of about 50 to about 200 nm is able to compose pixel electrode 441 provided with sheet resistance of $10^2$–$10^4$ $\Omega/\square$, optical transmittance of 90% or more and adequate performance together with sputtered ITO film 446. Subsequently, insulating substrate 410 is held in the reducing atmosphere in which the second heat treatment was performed, a non-oxidizing atmosphere such as nitrogen gas or other non-oxidizing atmosphere until the substrate temperature falls to 200° C. or lower, and insulating substrate 410 is then removed from the heat treatment apparatus into the atmosphere after the substrate temperature has fallen below 200° C.

In this manner, if insulating substrate 410 is exposed to the atmosphere after its temperature has fallen below about 200° C., since the film for which resistance was lowered by the reduction of the second heat treatment in a hydrogen-containing atmosphere can be prevented from re-oxidizing, coated ITO film 447 can be obtained that has low sheet resistance. The temperature when insulating substrate 410 is removed from the heat treatment apparatus into the atmosphere is more preferably 100° C. or lower in order to prevent re-oxidation of coated ITO film 447. This is because specific resistance increases when re-oxidation of coated ITO film 447 occurs due to the presence of oxygen in the atmosphere since the specific resistance of coated ITO film 447 becomes lower the greater the number of oxygen defects in the film.

After forming sputtered ITO film 446 and coated ITO film 447 in this manner, as shown in FIG. 22E, resist mask 462 is formed after which they are collectively patterned with an etching liquid such as aqua regia or HBr, or by dry etching using $CH_4$ and so forth, to form pixel electrode 441 as shown in FIG. 20. As a result, a TFT is formed at each pixel region 402. Thus, if the TFT is driven by a control signal supplied via a scanning line Gm, image data is written from a data line Sn via the TFT to liquid crystal sealed between pixel electrode 441 and an opposing substrate (not shown), thereby making it possible to perform the prescribed display.

In addition, in the present embodiment, coated ITO film 447 is used in the formation of pixel electrode 441. Since this coating and deposition method has superior level difference covering, a liquid or paste-like coating material for composing coated ITO film 447 is able to smoothly fill any surface irregularities in sputtered ITO film 446 caused by contact hole 422A as shown in FIG. 33B. In addition, when a coating material is coated onto insulating substrate 410, coated ITO film 447 is formed to be thicker at the concave portion and thinner at the convex portion.

Thus, surface irregularities caused by data line 431 are not reflected in the surface of pixel electrode 441. This applies similarly to the upper layer side of scanning line 451. For this reason, since a flat pixel electrode 441 can be formed free of level differences in its surface, together with lapping able to be performed stably, the occurrence of a reverse tilt domain and so forth can be prevented. Accordingly, display quality is improved by the present invention.

Figure 33A:
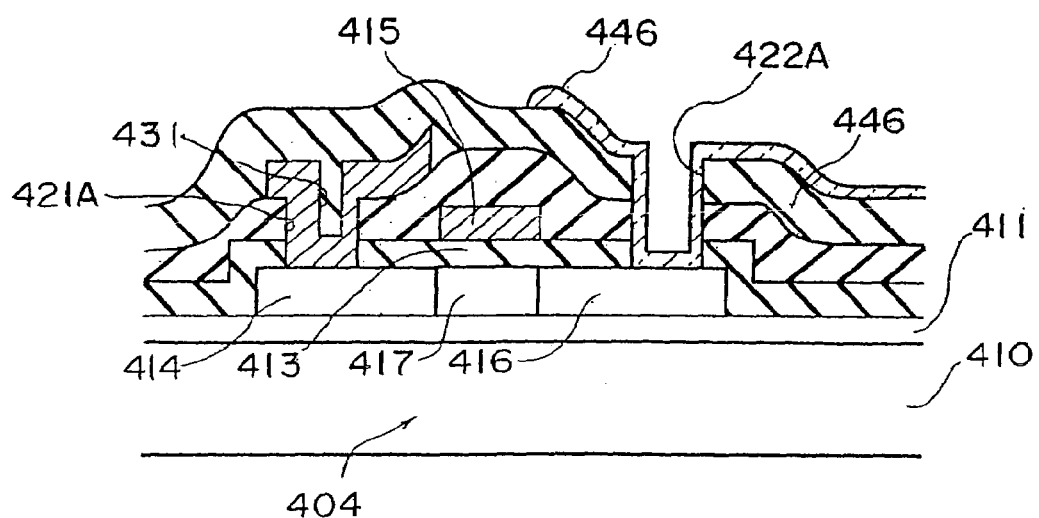
FIGS. 33A and 33B are longitudinal cross-sectional views showing enlarged views of the vicinity of a contact hole of a comparative example and embodiment of the present invention, respectively.
Figure 33B:
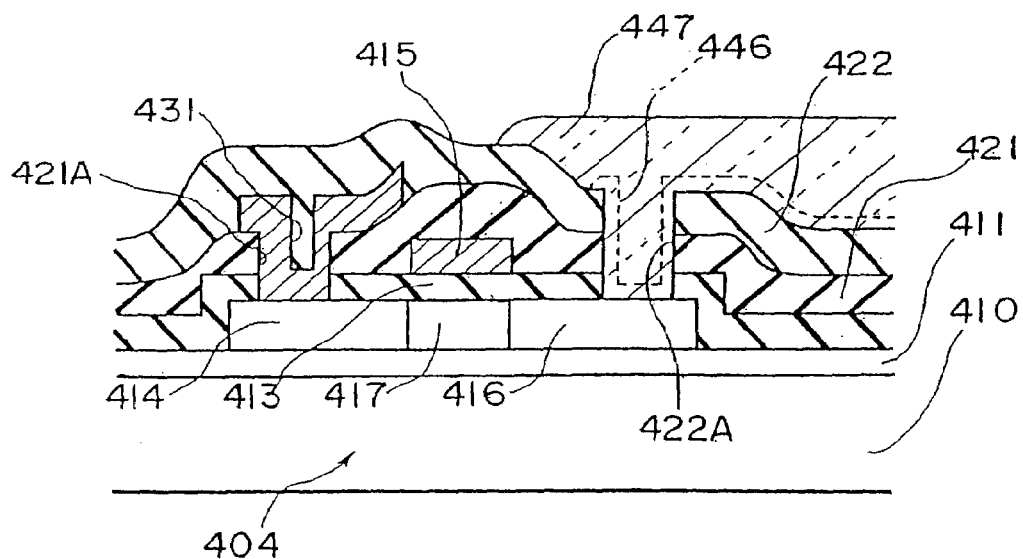

On the other hand, as shown in FIG. 33A, if the pixel electrode is formed with only sputtered ITO film 446, sputtered ITO film 446 ends up being formed along the level difference in the surface on which this sputtered ITO film 446 is formed. The level difference formed in the surface of sputtered ITO film 446 causes unstable lapping and a reverse tilt domain, thereby causing a decrease in display quality. Moreover, since it is difficult to form sputtered ITO film 446 so as to completely fill contact hole 442A, an opening ends up being formed there. The presence of this opening also causes unstable lapping and a reverse tilt domain. Thus, it is useful to form coated ITO film 447.

In addition, in the case of employing a two-layer structure for interlayer insulating film 420 for the purpose of forming pixel electrode 441 and source electrode 431 between different layers as in the fourth embodiment, although the aspect ratio of contact hole 422A becomes larger, if coated ITO film 447 is used, there is the remarkable effect of being able to form a flat pixel electrode 441. In addition, although sputtered ITO film 446 tends to have poor adhesion to a resist mask as compared with coated ITO film 447, in the present embodiment, since resist mask 446 is formed on the surface of coated ITO film 447, there is no occurrence of the problem of lower patterning accuracy. For this reason, pixel electrode 441 can be formed to have a highly accurate pattern.

[Fifth Embodiment]

(Fourth Embodiment of a Liquid Crystal Display Apparatus)

Figure 23:
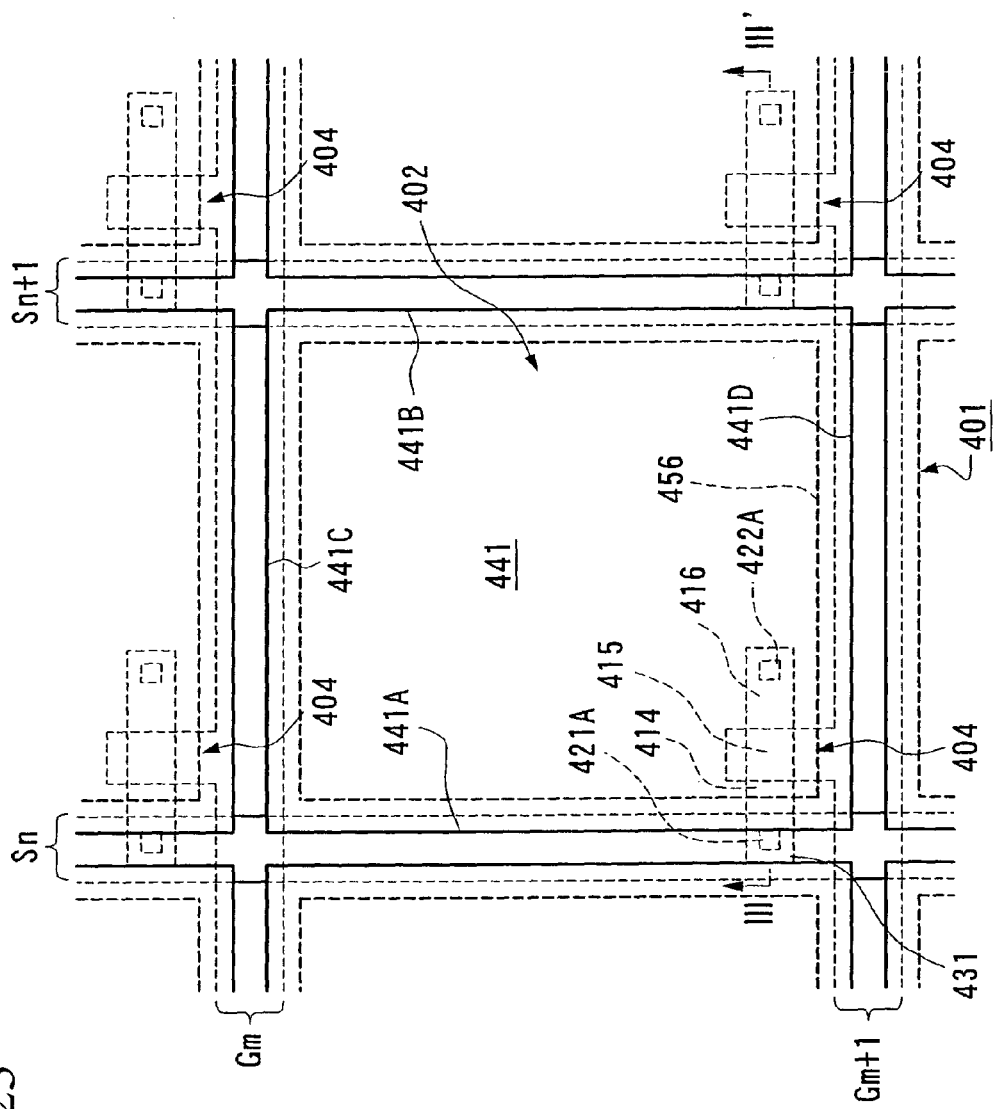
FIG. 23 is an overhead view showing an enlarged view of a portion of a pixel region partitioned and formed on an active matrix substrate for a liquid crystal display as claimed in a fifth embodiment of the present invention.
Figure 24:
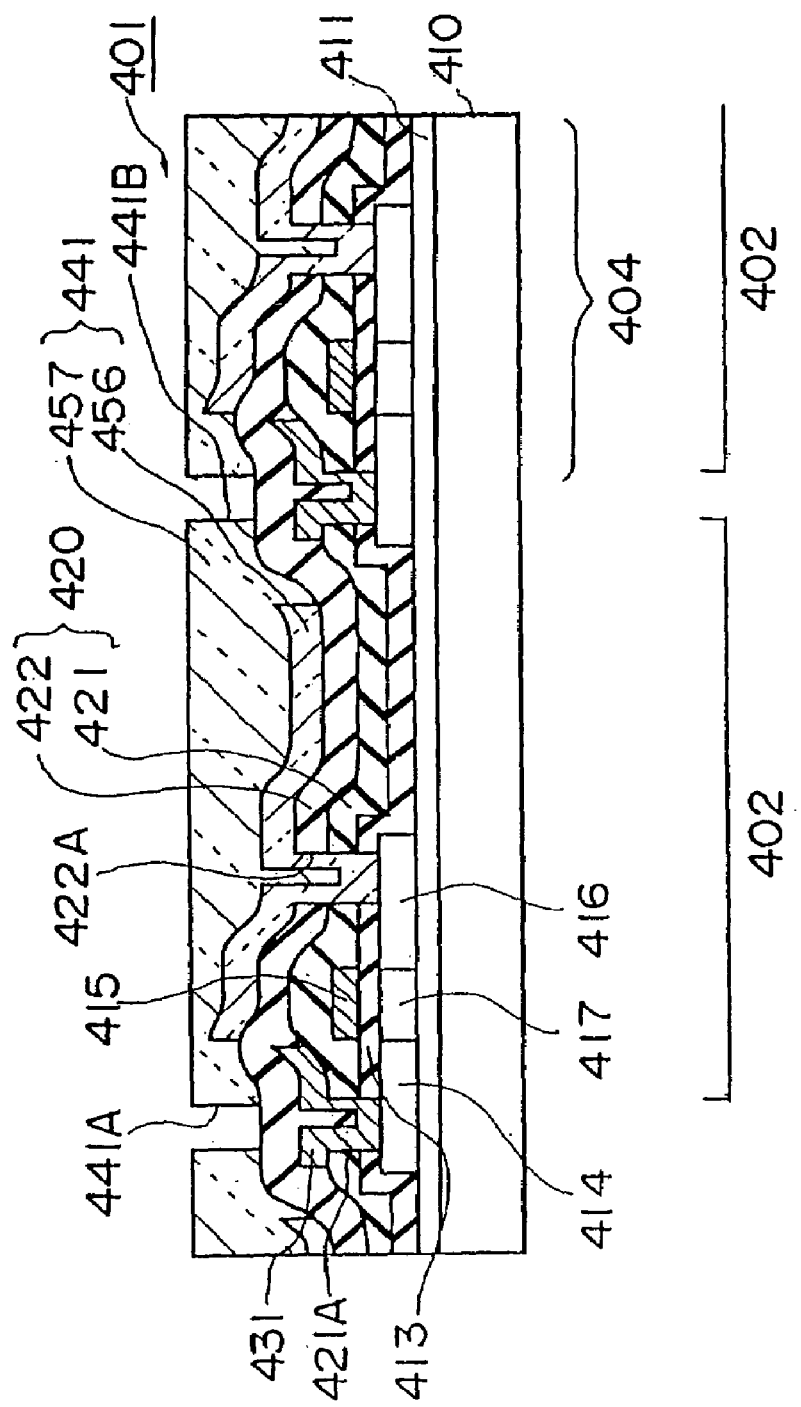
FIG. 24 is a cross-sectional view taken at the location corresponding to line III–III' of FIG. 23.

FIG. 23 is an overhead view showing an enlarged view of a portion of a pixel region partitioned and formed on an active matrix substrate for a liquid crystal display that applies the present invention, while FIG. 24 is a cross-sectional view taken at the location corresponding to line III–III' of FIG. 23. Furthermore, in this fifth embodiment, the same reference symbols are used to indicate those portions that are the same as the fourth embodiment, and their explanation is omitted.

In FIG. 23, active matrix substrate 401 for a liquid crystal display as claimed in this fifth embodiment also has a plurality of pixel regions 402 partitioned and formed on a insulating substrate 410 by data lines 431 and scanning lines 415, and a TFT is respectively formed on each pixel region 402.

In the structure of this fifth embodiment as well, since its two-dimensional layout is the same as FIG. 16 used to explain the third and fourth embodiments with the exception of a sputtered ITO film, data lines Sn, Sn+1 . . . and scanning lines Gm, Gm+1 . . . themselves function as a black matrix. Thus, high-quality display can be performed without increasing the number of steps.

This fifth embodiment differs from the fourth embodiment in that, since sputtered ITO film 456 and coated ITO film 457 are patterned and formed separately as will be described later, their formation regions are different, with the formation region of coated ITO film 457 being larger than the formation region of sputtered ITO film 456. Here, as is the fourth embodiment, in the case of forming the coated ITO film and sputtered ITO film in the same region, both ITO films can be patterned collectively. Namely, a resist mask was formed only on the surface of the coated ITO film that demonstrates satisfactory adhesion with it, and it was not necessary to form the resist mask on the surface of the sputtered ITO film that has poor adhesion with the resist mask. For this reason, high-definition patterning can be achieved.

In contrast, in the case of this fifth embodiment, it is also necessary to form a resist mask on the surface of the sputtered ITO film as well. However, in the case the coated ITO film is formed on a larger region than the formation region of the sputtered ITO film, even if adhesion between the sputtered ITO film and resist mask is poor and patterning accuracy is low, since the patterning accuracy of the coated ITO film which exhibits satisfactory adhesion with the resist mask ultimately defines the pattern, high-definition patterning can be achieved.

Figure 25A:
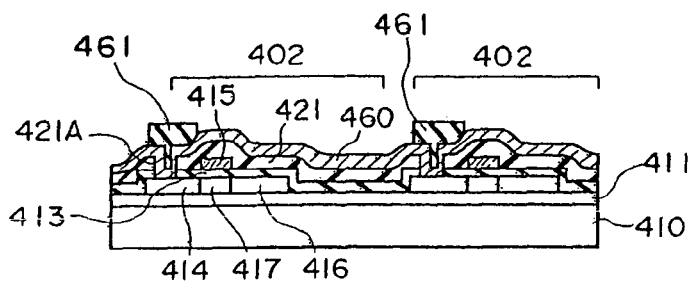
FIGS. 25A through 25F are cross-sectional views showing each of the steps carried out after the steps shown in FIGS. 21A through 21E in the production of the active matrix substrate shown in FIG. 23.
Figure 25B:
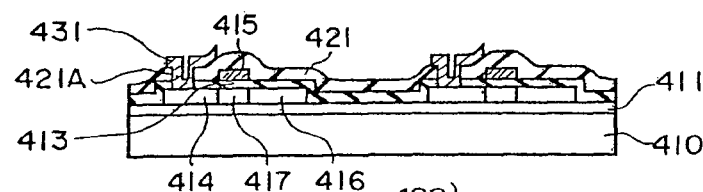
Figure 25C:
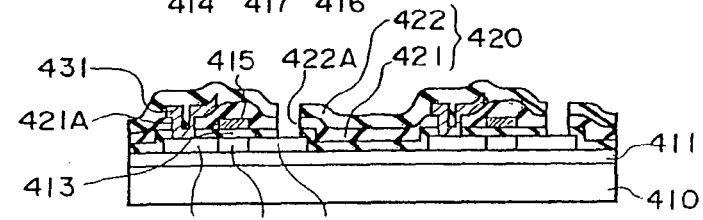

The production method of an active matrix substrate 401 having such a constitution is the same as the steps shown in FIGS. 21A through 21E used to explain the fourth embodiment, and is also in common with the steps of FIGS. 25A through 25C. Therefore, in the following explanation, an explanation is provided only for the steps following the step shown in FIG. 25D with reference to FIGS. 25D through 25F.

In FIG. 25C, an upper layer side interlayer insulating film 422 composed of a silicon oxide film and a contact hole 422A are formed on the surface of lower layer side interlayer insulating film 421.

Figure 25D:
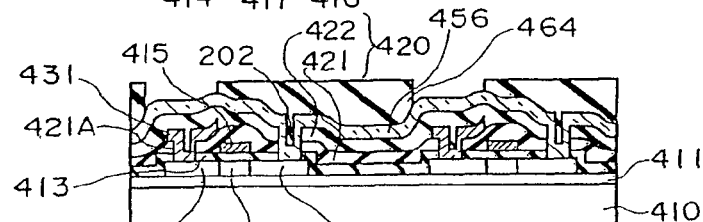
Figure 25E:
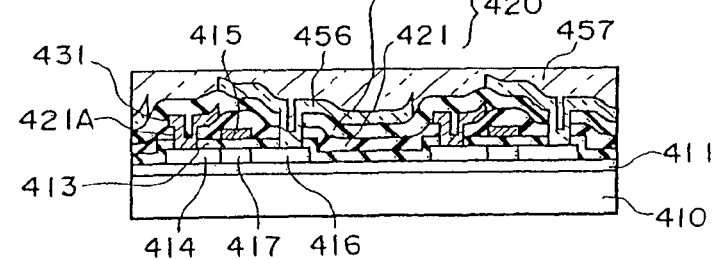

Next, as shown in FIG. 25D, an ITO film 456 (electrically conductive sputtered film) is formed by sputtering over the entire surface of interlayer insulating film 420 composed of lower layer side interlayer insulating film 421 and upper layer side interlayer insulating film 422. The steps up to this point are the same as the fourth embodiment. In this fifth embodiment however, only sputtered ITO film 456 is first patterned with an etching liquid such as aqua regia or HBr, or by dry etching using $CH_4$ and so forth. Namely, after forming sputtered ITO film 456, a resist mask 456 is formed as shown in FIG. 25D after which this is patterned. Sputtered ITO film 456 is thus left behind in a region narrower than the scheduled formation region of pixel electrode 441 as shown in FIG. 25E by etching sputtered ITO film 456 using this resist mask 464.

Next, coated ITO film 457 (electrically conductive transparent coated film) is formed on the surface side of sputtered ITO film 456. In the formation of this coated ITO film 457 as well, a coating material as explained in the each of the previously mentioned embodiments can be used.

Figure 25F:
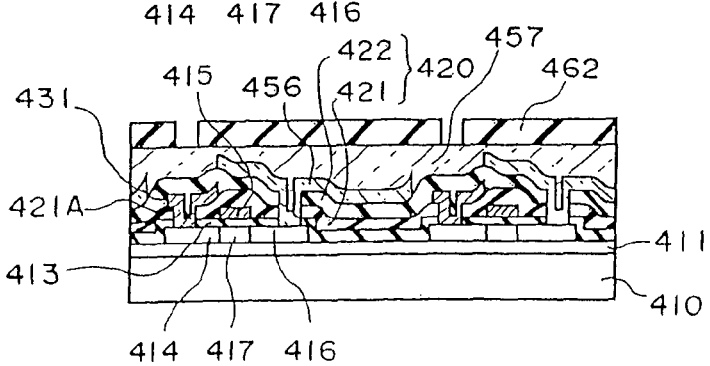

After forming coated ITO film 457 in this manner, a resist mask 462 is formed as shown in FIG. 25F, and pixel electrode 441 is then formed as shown in FIG. 24 by patterning with an etching liquid such as aqua regia or HBr, or by dry etching using $CH_4$ and so forth.

In the structure of this fifth embodiment as well, effects similar to those of the structure of the fourth embodiment can be demonstrated. In particular, although coated ITO film 457 that contacts drain region 416 tends to have a higher contact resistance than a sputtered ITO film, since coated ITO film 457 is merely electrically connected to drain region 416 via sputtered ITO film 456 in the fifth embodiment, there is the advantage of being able to solve the problem of large contact resistance. In addition, since sputtered ITO film 456 may be thin, even if its adhesion with resist mask 464 is poor, since etching is only required to be performed for a short period of time, there are no obstacles to patterning. In addition, since the patterning accuracy for coated ITO film 457 having high patterning accuracy ultimately defines the patterning accuracy of pixel electrode 441, high-definition patterning can be achieved.

[Sixth Embodiment]
(Fifth Embodiment of a Liquid Crystal Display Apparatus)

Figure 26:
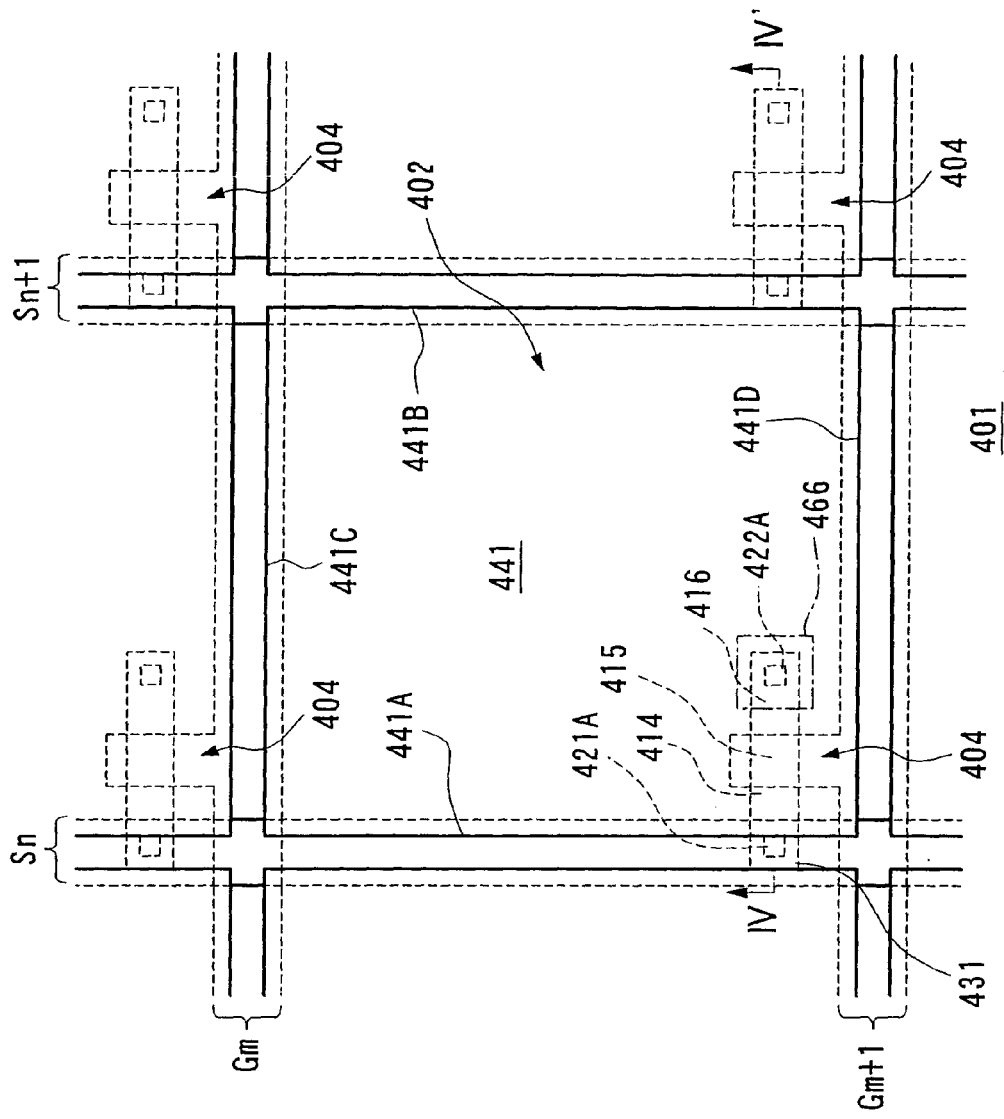
FIG. 26 is an overhead view showing an enlarged view of a portion of a pixel region partitioned and formed on an active matrix substrate for a liquid crystal display as claimed in a sixth embodiment of the present invention.
Figure 27:
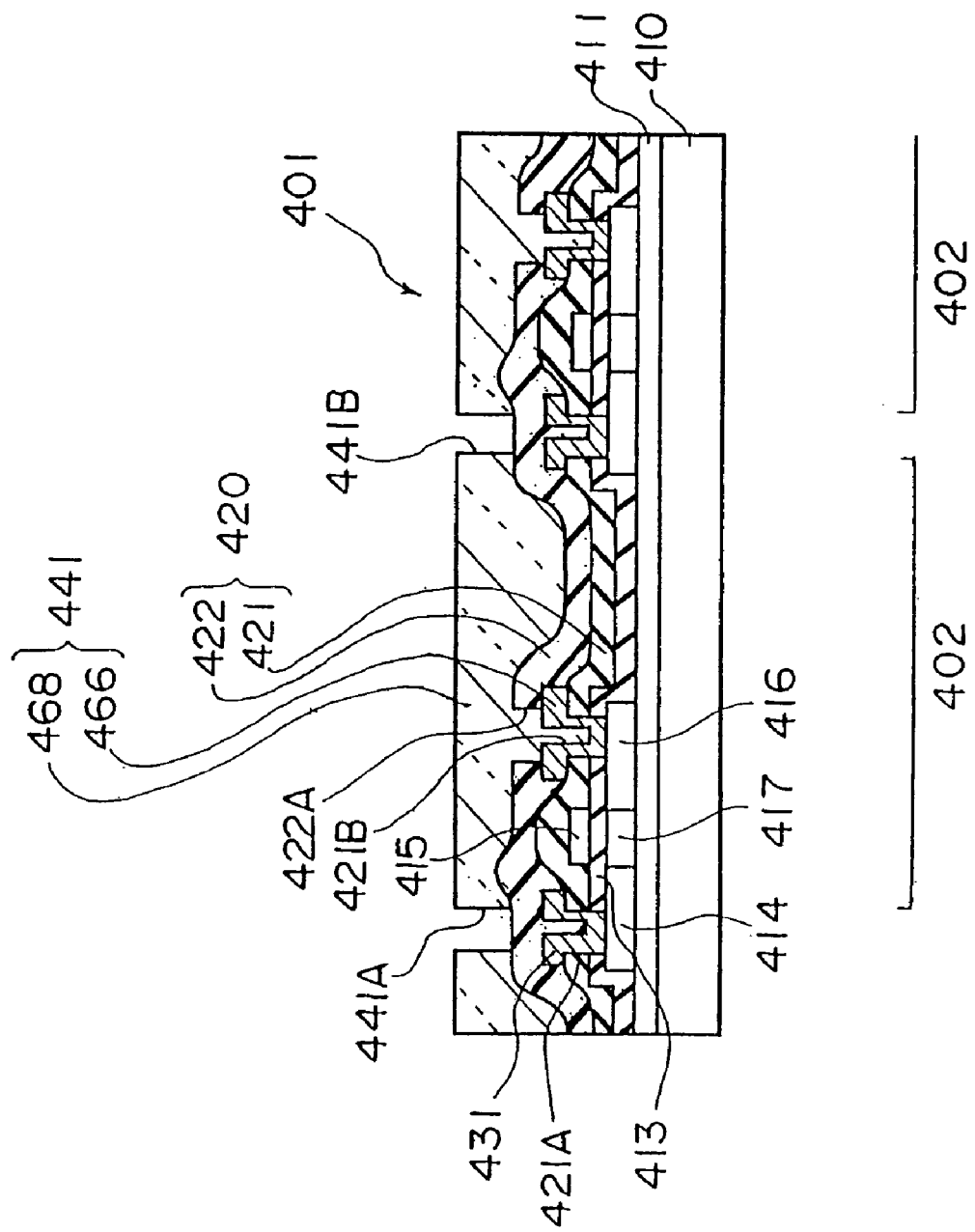
FIG. 27 is a cross-sectional view taken at the location corresponding to line IV–IV' of FIG. 26.

FIG. 26 is an overhead view showing an enlarged view of a portion of a pixel region partitioned and formed on an active matrix substrate for a liquid crystal display to which the present invention is applied, while FIG. 27 is a cross-sectional view taken at the location corresponding to line IV–IV' of FIG. 26.

The characteristic structure of this sixth embodiment is such that a pixel electrode 441 is composed of a coated ITO film 468 (electrically conductive transparent coated film) coated and deposited on the surface of an upper layer side interlayer insulating film 421, and this coated ITO film 468 is electrically connected to a relay electrode 466 composed of an aluminum film formed by sputtering on the surface of lower layer side interlayer insulating film 421 via a contact hole 422A of an upper layer side interlayer insulating film 422. In addition, relay electrode 466 is electrically connected to drain region 416 via a contact hole 421B of lower layer side interlayer insulating film 421. Thus, pixel electrode 441 is electrically connected to drain region 416 via relay electrode 466 located on its lower layer side.

Here, since relay electrode 466 consists of an aluminum film that does not allow the transmission of light, its formation region is limited to within and around contact hole 421B so as not to cause a decrease in numerical aperture.

The production method of an active matrix substrate 401 having such a constitution shares the same steps shown in FIGS. 21A through 21E used to explain the fourth embodiment. Therefore, in the following explanation, an explanation is only provided for the steps following the step shown in FIG. 21E with reference to FIGS. 28A through 28D.

Figure 28A:
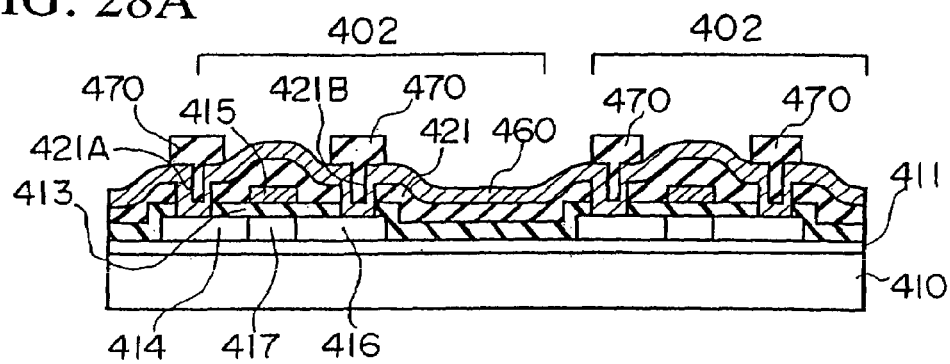
FIGS. 28A through 28D are cross-sectional views showing each of the steps carried out after the steps shown in FIGS. 21A through 21E in the production of the active matrix substrate shown in FIG. 26.

As shown in FIG. 28A, after forming contact holes 421A and 421B at locations corresponding to source region 414 and drain region 416 in lower layer side interlayer insulating film 421, aluminum film 460 (electrically conductive sputtered film) is formed by sputtering in order to form source electrode 431 and data lines.

Figure 28B:
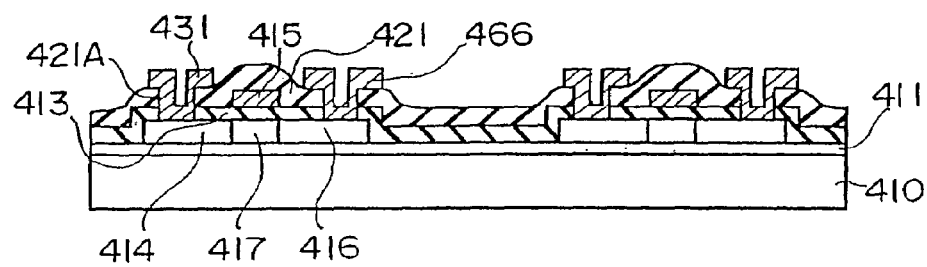

Next, after forming a resist mask 470, aluminum film 460 is patterned using this resist mask 470. As a result, source region 431, data lines and relay electrode 466 are formed simultaneously as shown in FIG. 28B.

Figure 28C:
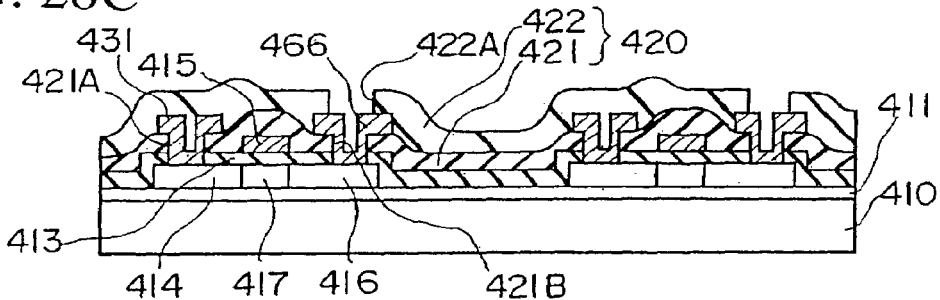

Next, as shown in FIG. 28C, upper layer side interlayer insulating film 422 composed of a silicon oxide film is formed with the coating method of the present invention (material discharge method) or by CVD or PVD on the surface of lower layer side interlayer insulating film 421. Next, contact hole 422A is formed at the location corresponding to relay electrode 466 (location corresponding to drain region 416) in upper layer side interlayer insulating film 422.

Figure 28D:
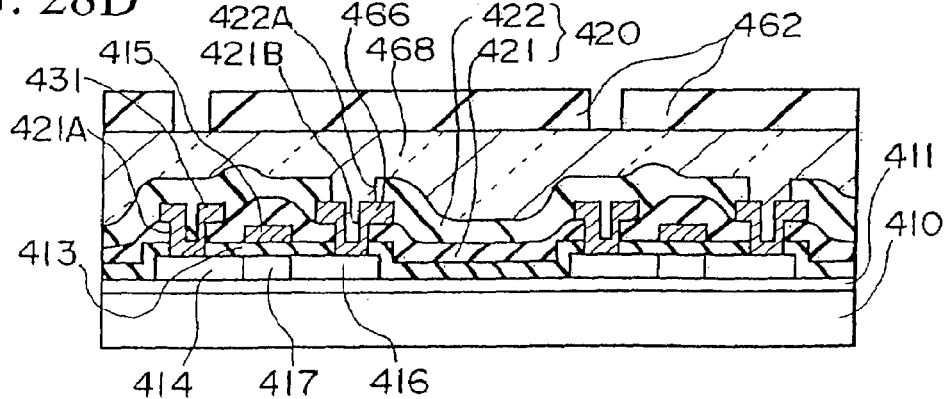

Next, as shown in FIG. 28D, coated ITO film 468 (electrically conductive transparent coated film) is formed over the entire surface of interlayer insulating film 420 composed of lower layer side interlayer insulating film 421 and upper layer side interlayer insulating film 422. In the formation of this coated ITO film 468 as well, a coating material as explained in each of the previously mentioned embodiments can be used.

After forming ITO film 468 in this manner, resist mask 462 is formed and then patterned to form pixel electrode 441 as shown in FIG. 27. At this time as well, as can be understood from FIG. 26, a black matrix can be composed consisting of data lines Sn, Sn+1, . . . and scanning lines Gm, Gm+1, . . . Moreover, since the numerical aperture of pixel region 402 increases enabling the formation of a flat pixel electrode 441 free of level differences in its surface, together with lapping being able to be performed stably, the occurrence of a reverse tilt domain and so forth can be prevented.

In addition, although the contact resistance of pixel electrode 441 comprised of coated ITO film 468 with drain region 416 (silicon film) tends to be higher than that of a sputtered ITO film and so forth, in this sixth embodiment, since coated ITO film 468 is electrically connected to drain region 416 via relay electrode 466 composed of a sputtered aluminum film, the problem of large contact resistance can be solved.

Furthermore, although aluminum was used for relay 466 in the present embodiment, if aluminum and a high melting point metal or a two-layer film with their metal silicides is used for relay electrode 466, the contact resistance with coated ITO film 468 can be reduced even further. Namely, since high melting point metals such as tungsten and molybdenum are more resistant to oxidation than aluminum, they are not oxidized when contacted with coated ITO film 468 containing a large amount of oxygen. For this reason, the contact resistance between relay electrode 466 and coated ITO film 468 can be held to a low level.

[Seventh Embodiment]

(Sixth Embodiment of a Liquid Crystal Display Apparatus)

Figure 29:
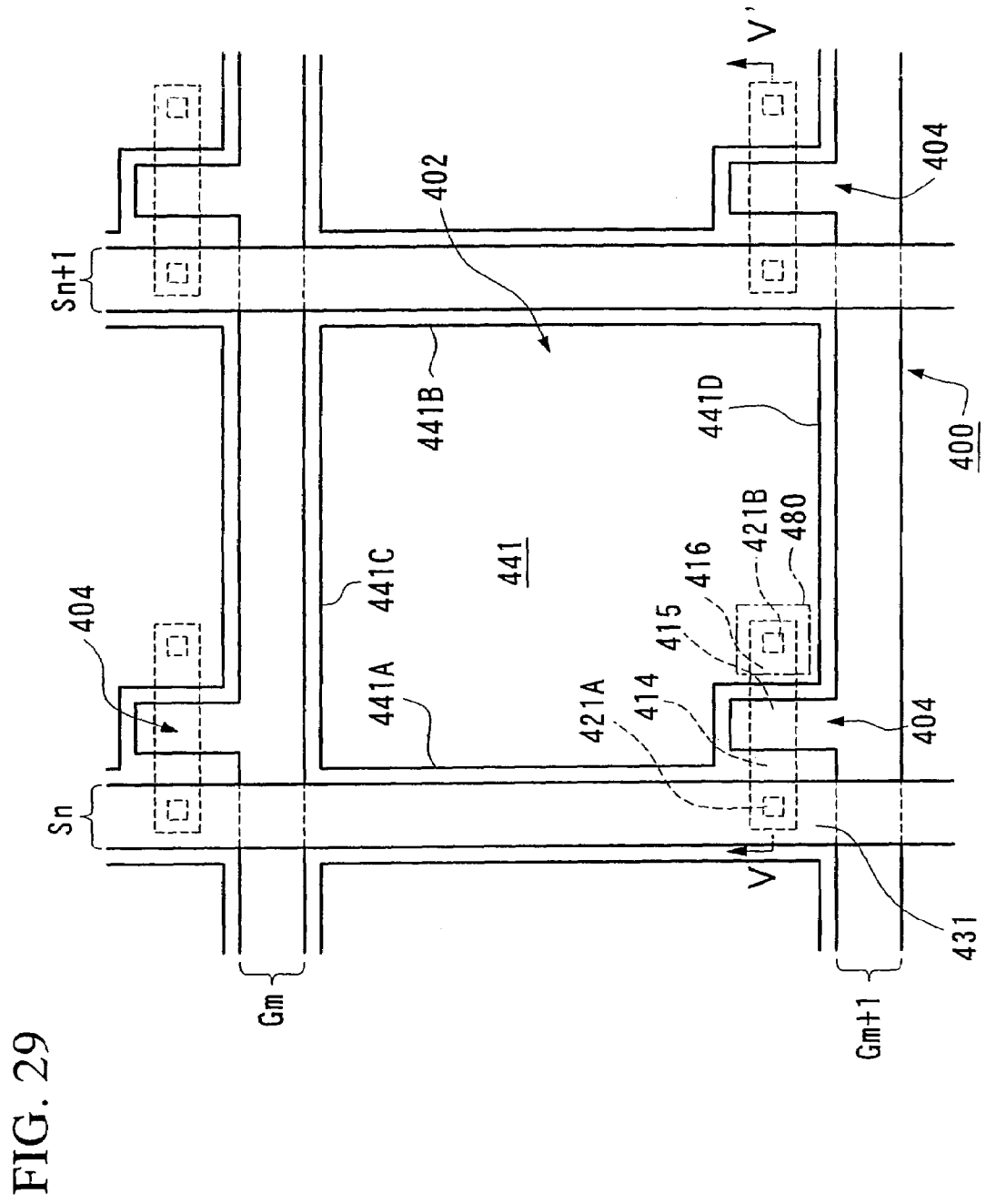
FIG. 29 is an overhead view showing an enlarged view of a portion of a pixel region partitioned and formed on an active matrix substrate for a liquid crystal display according to a seventh embodiment of the present invention.
Figure 30:
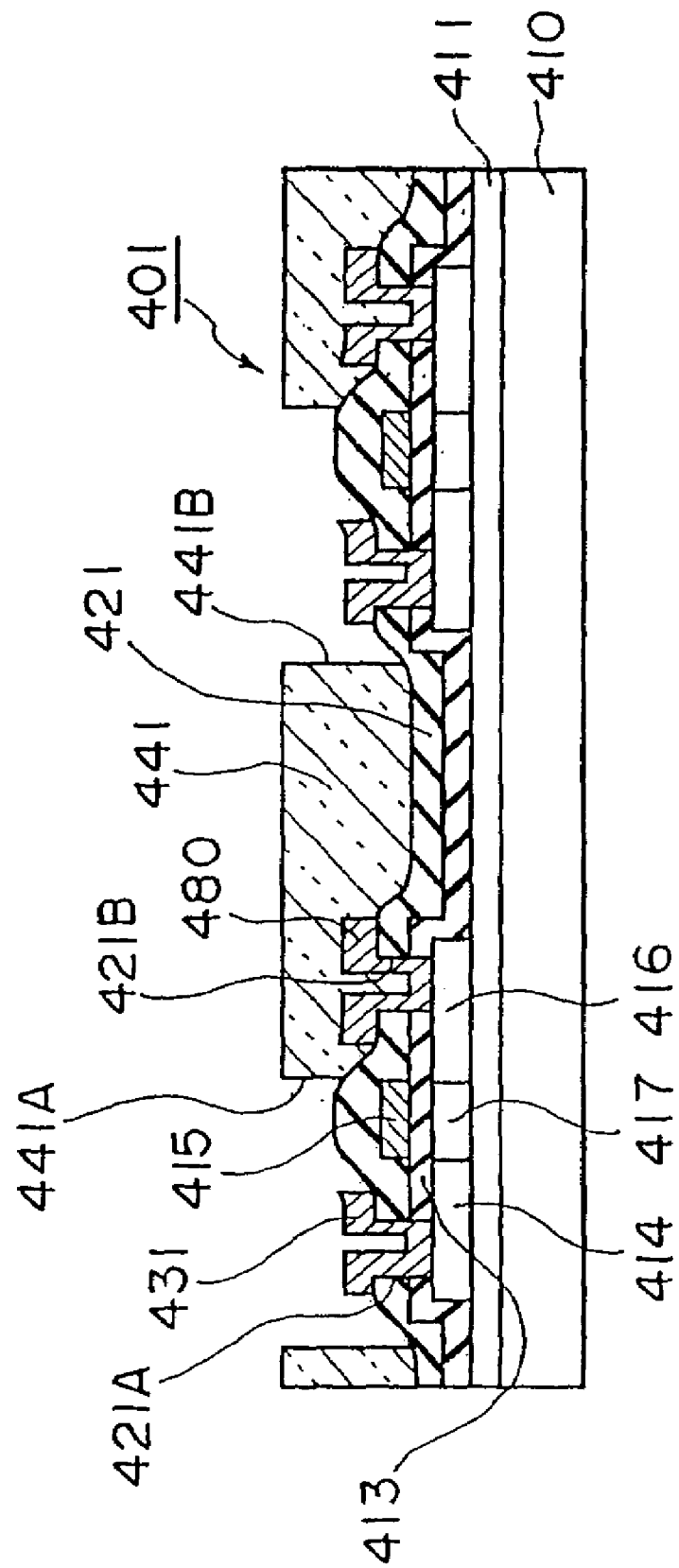
FIG. 30 is a cross-sectional view taken at the location corresponding to line V–V' of FIG. 29.

FIG. 29 is an overhead view showing an enlarged view of a portion of a pixel region partitioned and formed on an active matrix substrate for a liquid crystal display to which the present invention is applied, while FIG. 30 is a cross-sectional view taken at the location corresponding to line V–V' of FIG. 29.

This seventh embodiment is characterized by being a variation of the structure of the second embodiment shown in FIGS. 11 and 12, with the electrical connection between coated ITO film 441 and drain region 416 being secured by a relay electrode 408.

In FIG. 29, active matrix substrate 401 as claimed in this seventh embodiment also has an insulating substrate 410 partitioned into a plurality of pixel regions 402 by data lines 431 and scanning lines 415, and a TFT (non-linear element for pixel switching) is formed in each pixel region 402. Here, the present embodiment can be composed in the manner described below if the objectives are only to ensure the flatness of the pixel electrode and reduce its contact resistance. Namely, as shown in FIG. 30, interlayer insulating film 421 is only composed of a single silicon oxide film in the seventh embodiment.

Pixel electrode 441 composed of a coated ITO film is formed on the surface side of a relay electrode 480 composed of an aluminum film (electrically conductive sputtered film/metal film) formed by sputtering on the surface of interlayer insulating film 421 on its lower surface side. Thus, pixel electrode 441 is electrically connected to drain region 416 via relay electrode 480. Here as well, since relay electrode 480 consists of an aluminum film that does not allow transmission of light, its formation region is limited only to within and around contact hole 421B.

In this seventh embodiment, since pixel electrode 441 is composed in the same interlayer space as source electrode 431, these electrodes are disposed to as not to short (see FIGS. 29 and 30).

The production method of active matrix substrate 401 composed in this manner is roughly the same for the steps shown in FIGS. 21A through 21E used to explain the fourth embodiment. Therefore, in the following explanation, an explanation is only provided for the steps following the step shown in FIG. 21E with reference to FIGS. 31A through 31C.

Figure 31A:
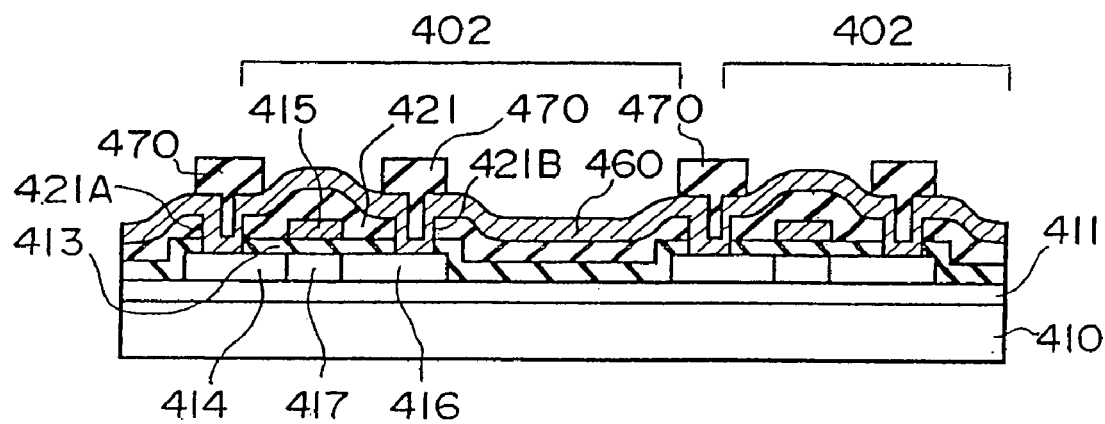
FIGS. 31A through 31C are cross-sectional views showing each of the steps carried out after the steps shown in FIG. 27 in the production of the active matrix substrate shown in FIG. 29.

As shown in FIG. 31A, contact holes 421A and 421B are formed at locations corresponding to source region 414 and drain region 416 in interlayer insulating film 421.

Next, after sputtering an aluminum film 460 for forming source electrode 431 and data lines, a resist mask 470 is formed.

Figure 31B:
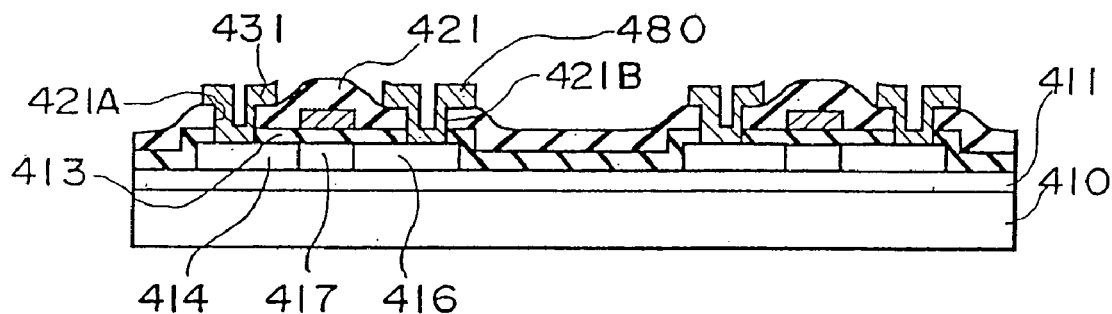

Next, aluminum film 460 is patterned using resist mask 470 to form source electrode 431, data lines and relay electrode 480 as shown in FIG. 31B.

Figure 31C:
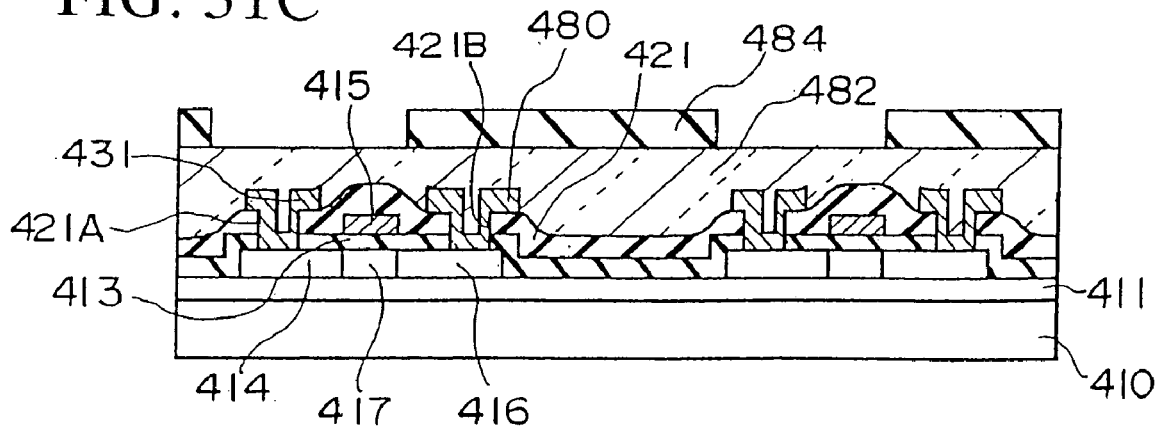

Next, as shown in FIG. 31C, a coated ITO film (electrically conductive transparent coated film) is formed over the entire surface side of interlayer insulating film 421. In the formation of this coated ITO film 482 as well, the coating material of each of the previously mentioned embodiments can be used.

After forming coated ITO film 482 in this manner, a resist mask 484 is formed followed by patterning ITO film 482 using this resist mask 484 to form pixel electrode 441 as shown in FIG. 30.

In this seventh embodiment as well, since a coating and deposition method have superior level difference covering is used in the formation of pixel electrode 441, a flat pixel electrode 441 can be formed that is free of level differences in its surface. Thus, together with lapping being able to be performed stably, the occurrence of a reverse tilt domain and so forth can be prevented. In addition, as a result of interposing a relay electrode, the problem of high contact resistance between pixel electrode 441, composed of an ITO film formed by a coating and deposition method, and drain region 461 can be solved.

Figure 32A:
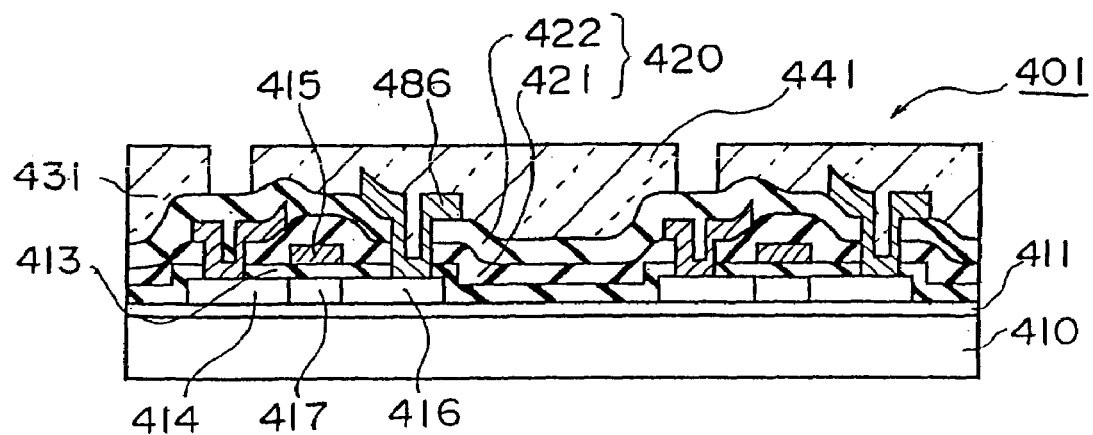
FIGS. 32A and 32B are explanatory drawings of an active matrix substrate for a liquid crystal display as claimed in another embodiment.

Furthermore, the present invention is not limited to the previously described embodiments, but rather can be carried out in numerous variations within the scope of the gist of the present invention. For example, in the sixth and seventh embodiments, relay electrodes 466 and 480 were formed simultaneously with source electrode 431 and the data lines, and composed from a metal film made from the same material (aluminum film) from the viewpoint of minimizing the number of steps of the production process. Instead, as shown in FIG. 32A, in the case interlayer insulating film 420 has been composed of lower layer side interlayer insulating film 421 and upper layer side interlayer insulating film 422, both pixel electrode 441 composed of an ITO film formed by coating deposition and relay electrode 486 formed from an electrically conductive sputtered film may be formed on the surface of upper layer side interlayer insulating film 422.

In the case of having been composed in this manner, different from the sixth embodiment, since the formation region of pixel electrode 441 can be enlarged, the data lines and scanning lines can be used as a black matrix. In addition, since relay electrode 486 (electrically conductive sputtered film) is formed in a different step than source electrode 431, its material may be the same metal material or a different material than source electrode 431.

In addition, although the explanation of both the sixth and seventh embodiments used the example of a planar TFT in which the surface form of the pixel electrode is easily affected by the presence of contact holes in an interlayer insulating film, the present invention can also be applied to an inverted staggered type or other types of TFT as well. In the case the pixel electrode must unavoidably be formed on a region containing surface irregularities in particular, if the pixel electrode is formed using an electrically conductive transparent coated film formed by coating deposition as in the present invention, the effect of the surface irregularities on the surface form of the pixel electrode can be eliminated.

Figure 32B:
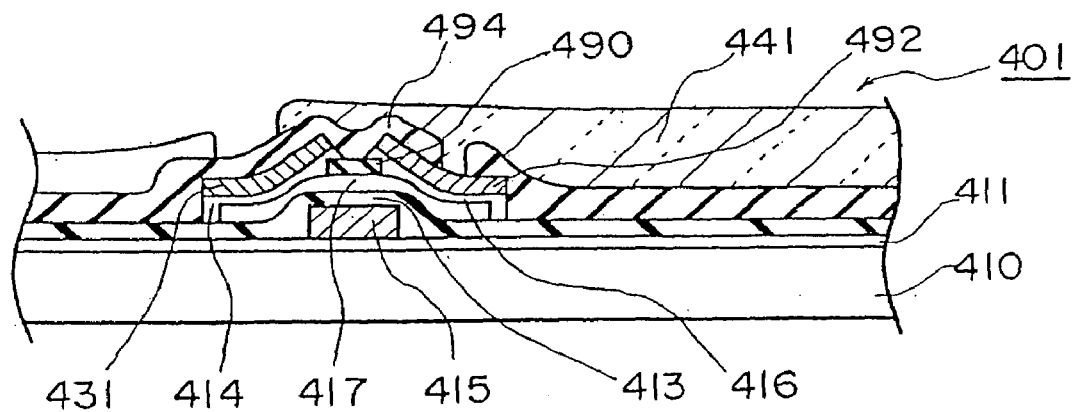

For example, in the inverted staggered type of TFT shown in FIG. 32B, if a coated ITO film is used for pixel electrode 441, the surface of pixel electrode 441 can be made to be flat. In the TFT shown in FIG. 32B, an intrinsic amorphous silicon film that composes undercoating protective film 411, gate electrode 415, gate insulating film 413 and channel region 417, and an insulating film 490 for protecting the channel are laminated on the surface side of insulating substrate 410 in that order. A highly concentrated N-type amorphous silicon film is comprised of source and drain regions 414 and 416 on both sides of channel protecting insulating film 490, and a source electrode 431 and a relay electrode 492 composed of a sputtered film made of chromium, aluminum or titanium and so forth are composed on the surface of these source and drain regions 414 and 416.

Moreover, an interlayer insulating film 494 and pixel electrode 441 are composed on their surface sides. Here, since pixel electrode 441 is composed of a coated ITO film, the surface is flat. In addition, pixel electrode 441 is electrically connected to a relay electrode 496 via a contact hole in interlayer insulating film 441. Namely, since pixel electrode 441 is electrically connected to drain region 416 via relay electrode 496 composed of a sputtered film, the problem of high contact resistance between pixel electrode 441 composed of a coated ITO film and drain region 416 (silicon film) can be eliminated. Moreover, since pixel electrode 441 is composed in a different interlayer space than source electrode 431, there is no shorting of these electrodes. For this reason, since pixel electrode 441 can be formed in a large region to where pixel electrode 441 covers the data lines and scanning lines (not shown), in addition to the data lines and scanning lines themselves being able to function as a black matrix, the numerical aperture of the pixel region can be increased.

Moreover, although a material discharge method for forming a coated ITO film from a liquid coating material was used in the formation of the pixel electrode, a coated ITO film can be formed using a printing method if a paste-like coating material is used. Moreover, since screen printing can also be used if a paste-like coating material is used, the paste-like coating material may be printed only onto the region where the pixel electrode is to be formed, and may then be used directly as a pixel electrode following drying and heat treatment. In this case, since the ITO film is not required to be patterned by etching, there is the advantage of production costs being able to be reduced considerably.

Furthermore, although the second through seventh embodiments have been explained using the example of forming only the pixel electrode with a coated film, as was explained in the first embodiment, it goes without saying that all or any of the insulating layers, electrically conductive layers or semiconductor layers can be formed with a coated film in addition to the pixel electrode.

[Eight Embodiment]
(Electronic Equipment)

Figure 34:
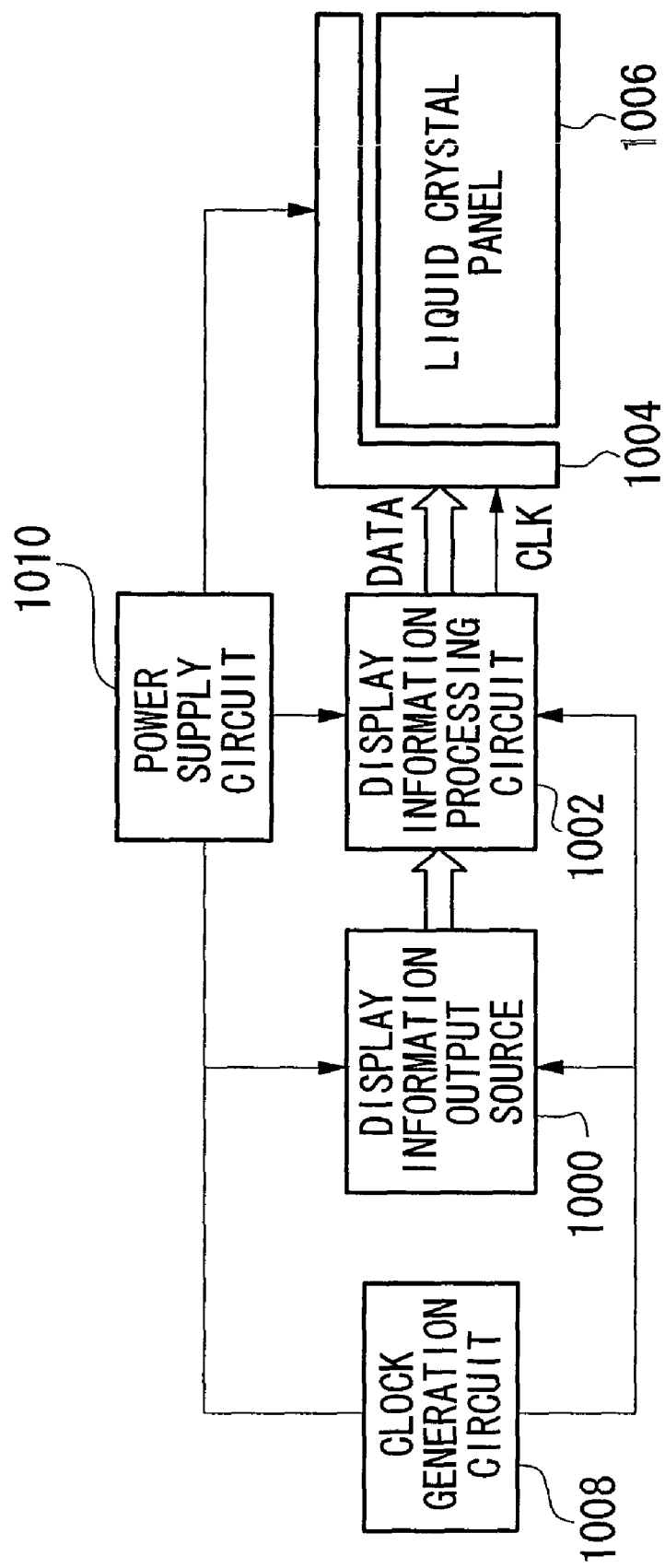
FIG. 34 is a block diagram showing a liquid crystal display apparatus contained in electronic equipment as claimed in an eighth embodiment of the present invention.

Electronic equipment composed using the liquid crystal display apparatus of the previously described embodiments are composed by containing display information output source 1000, display information processing circuit 1002, display drive circuit 1004, liquid crystal panel or other display panel 1006, clock generation circuit 1008 and a power supply circuit 1010 shown in FIG. 34.

Display information output source 1000 is composed by containing components such as ROM, RAM or other memory device, and a synchronizing circuit that generates an output in synchronization with a television signal, and outputs a video signal or other display information based on a clock from clock generation circuit 1008. Display information processing circuit 1002 processes and outputs display information based on a clock from clock generation circuit 1008. This display information processing circuit 1002 may be comprised of, for example, an amplification/polarity inversion clamping circuit and so forth. Display drive circuit 1004 is comprised of a scanning side drive circuit and data side drive circuit, and drives the display of liquid crystal panel 1006. Power supply circuit 1010 supplies electrical power to each of the above circuits.

Figure 35:
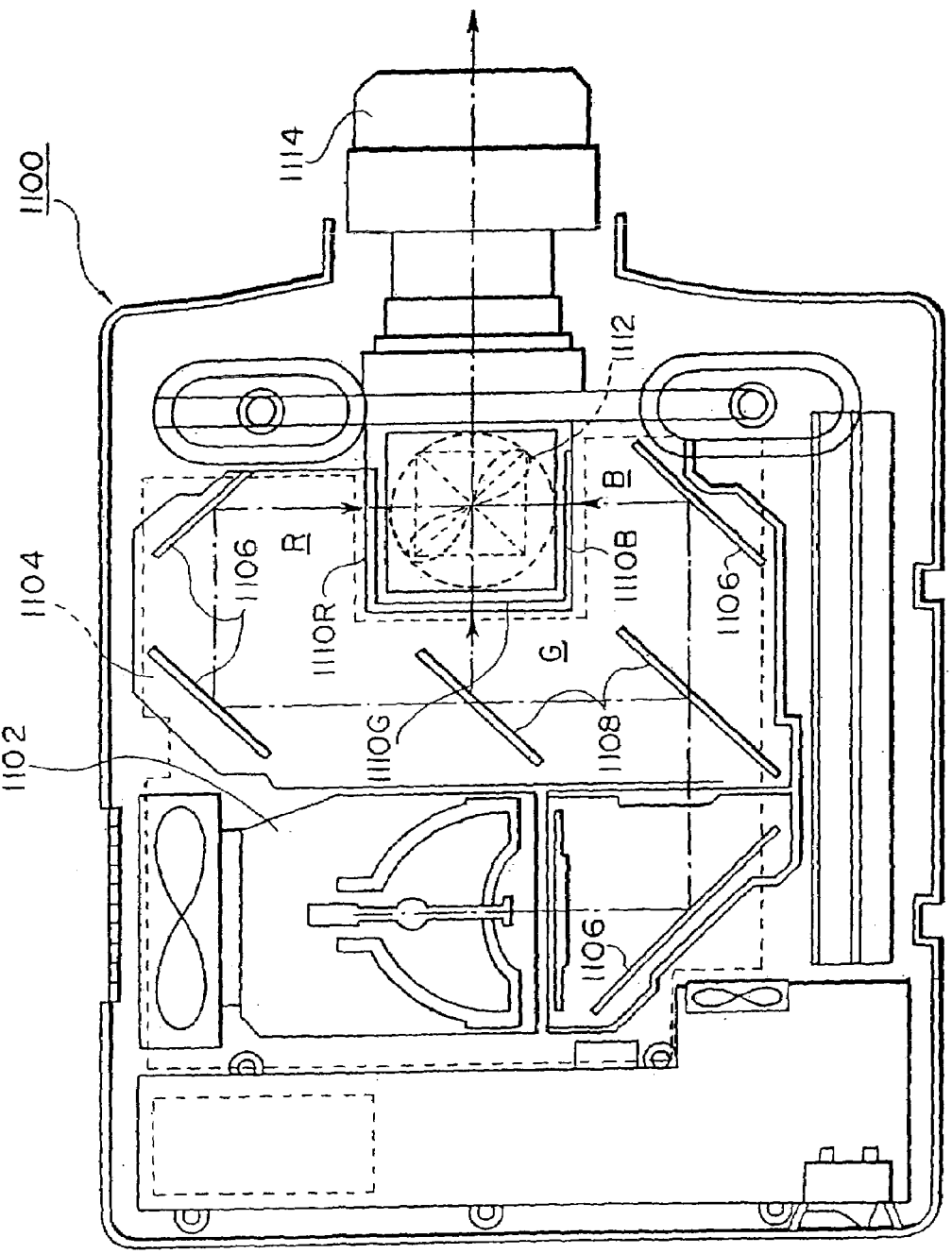
FIG. 35 is a schematic cross-sectional view of a projector as an example of electronic equipment using the liquid crystal display apparatus of FIG. 34.
Figure 36:
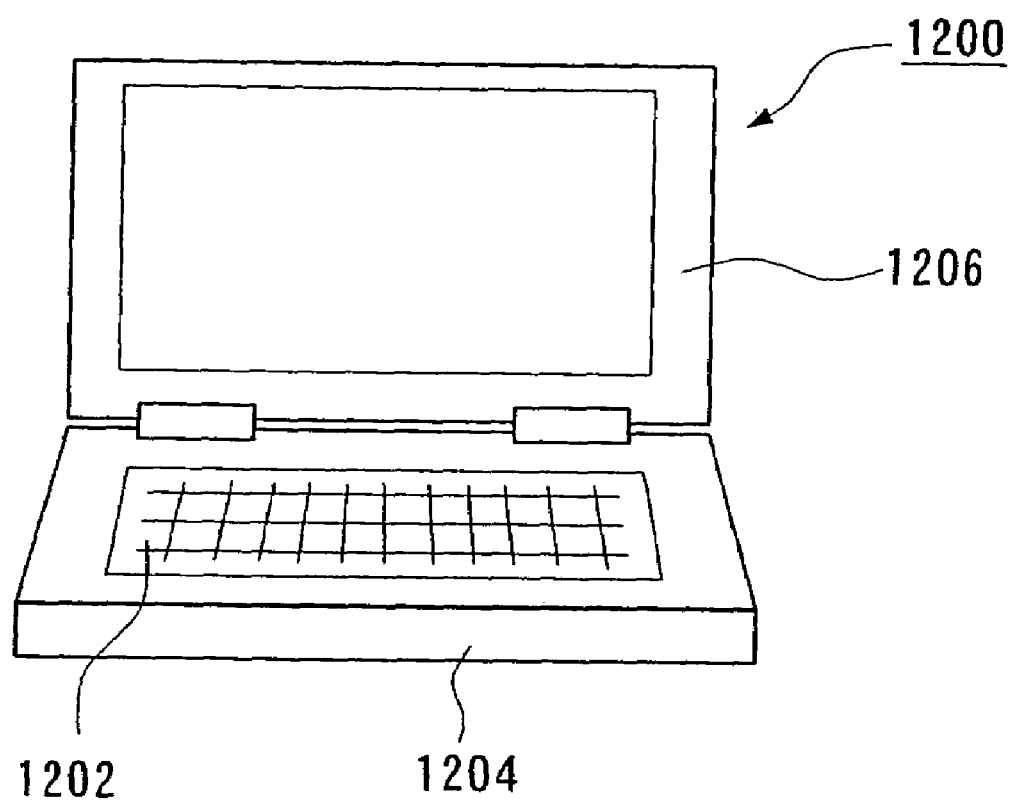
FIG. 36 is a schematic explanatory drawing of a personal computer as another example of electronic equipment.
Figure 37:
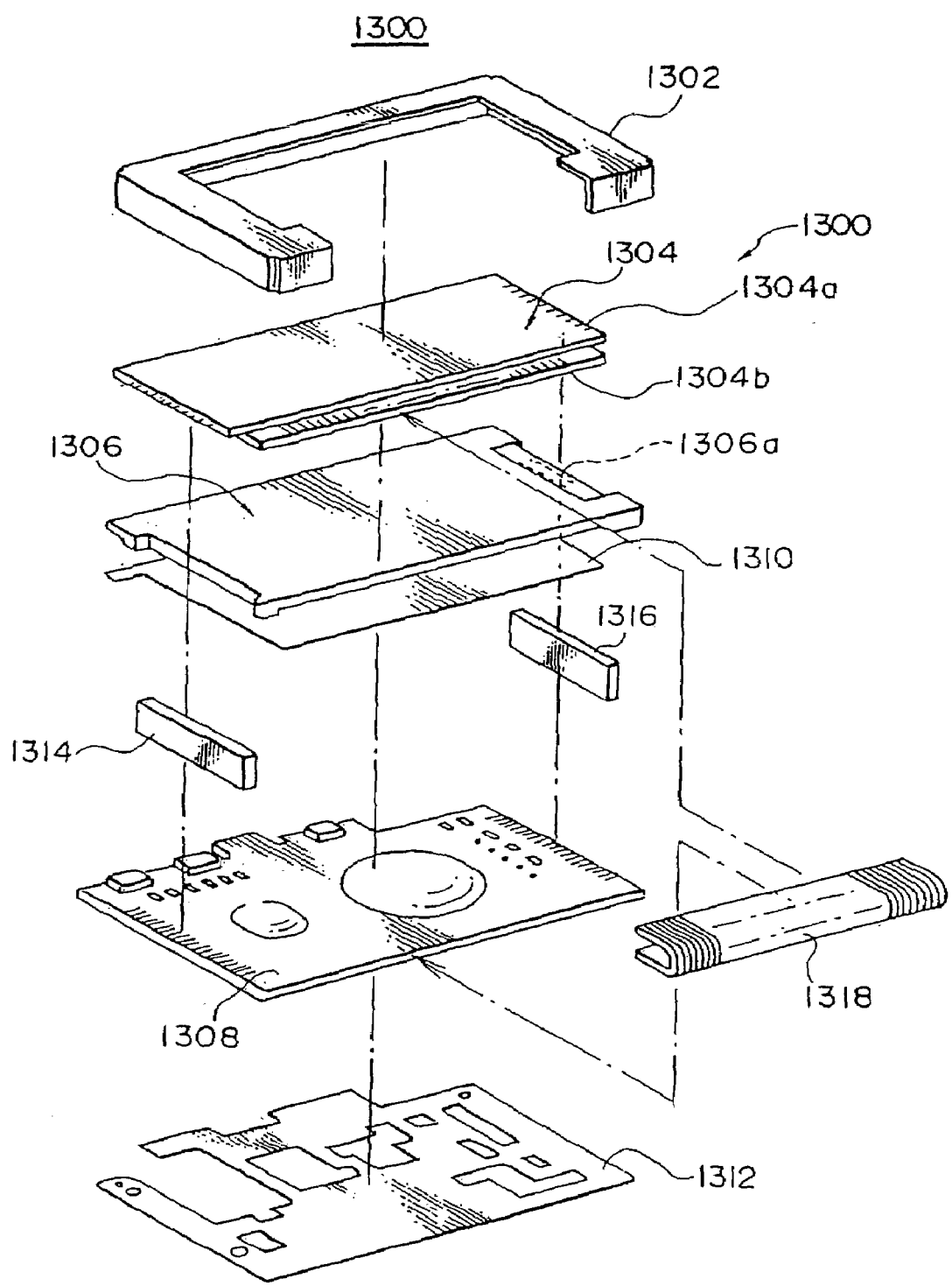
FIG. 37 is an exploded assembly perspective view of a pager as still another example of electronic equipment.

Examples of electrical equipment composed in the above manner include the liquid crystal projector shown in FIG. 35, the multimedia-compatible personal computer (PC) and engineering workstation (EWS) shown in FIG. 36, the pager shown in FIG. 37, or a cell phone, word processor, television, view finder type or direct viewing type of video tape recorder, electronic notebook, electronic desktop calculator, car navigation system, POS terminal and apparatuses equipped with a touch panel.

The liquid crystal projector shown in FIG. 35 is a projecting type of projector that uses a transmitting liquid crystal panel for the light bulb, and uses, for example, triangular prism optics. In FIG. 35, in a projector 1100, projected light radiated from a white light source lamp unit 1102 is separated into three primary colors of red (R), green (G) and blue (B) by a plurality of mirrors 1106 and two dichroic mirrors 1108 within a light guide 1104, and led to three liquid crystal panels consisting 1110R, 1110G and 1110B that display images of each color. Light that has been modulated by each of the liquid crystal panels 1110R, 1110G and 1110B enters dichroic prism 1112 from three directions. In dichroic prism 1112, since red R and blue B light are bent 90°, while green G light travels straight through, images of each color are synthesized, and color images are projected onto a screen and so forth through a projection lens 1114.

A personal computer 1200 shown in FIG. 36 has a main unit 1204 provided with a keyboard 1202, and a liquid crystal display screen 1206.

A pager 1300 shown in FIG. 37 has a liquid crystal display substrate 1304, a light guide 1306 provided with a backlight 1306a, a circuit board 1308, first and second shield plates 1310 and 1312, two flexible conductors 1314 and 1316 and a film carrier tape 1318 within a metal frame 1302. The two flexible conductors 1314 and 1316 and the film carrier tape 1318 connect the liquid crystal display substrate 1304 and the circuit board 1308.

Here, liquid crystal display substrate 1304 contains liquid crystal sealed between two transparent substrates 1304a and 1304b, resulting in the composition of at least a dot matrix type of liquid crystal display panel. The drive circuit 1004 shown in FIG. 34, or a display information processing circuit 1002 in addition to this, can be formed on one of the transparent substrates. Circuits not loaded on liquid crystal display substrate 1304 can be loaded on the circuit board 1308 in the case of FIG. 37 in the form of externally connected circuits of the liquid crystal display substrate.

Although circuit board 1308 is required in addition to liquid crystal display substrate 1304 since FIG. 37 shows the constitution of a pager, in the case in which a liquid crystal display apparatus is used as one component of electronic equipment and a display drive circuit and so forth is loaded on a transparent substrate, the minimum unit of that liquid crystal display apparatus is liquid crystal display substrate 1304. Alternatively, that in which liquid crystal display substrate 1304 is fixed in a package in the form of metal frame 1302 may also be used as a liquid crystal display apparatus serving as a component of electrical equipment. Moreover, in the case of a backlighting type, liquid crystal display substrate 1304 and light guide 1306 provided with backlight 1306a can be incorporated within metal frame 1302 to compose a liquid crystal display apparatus.

Figure 38:
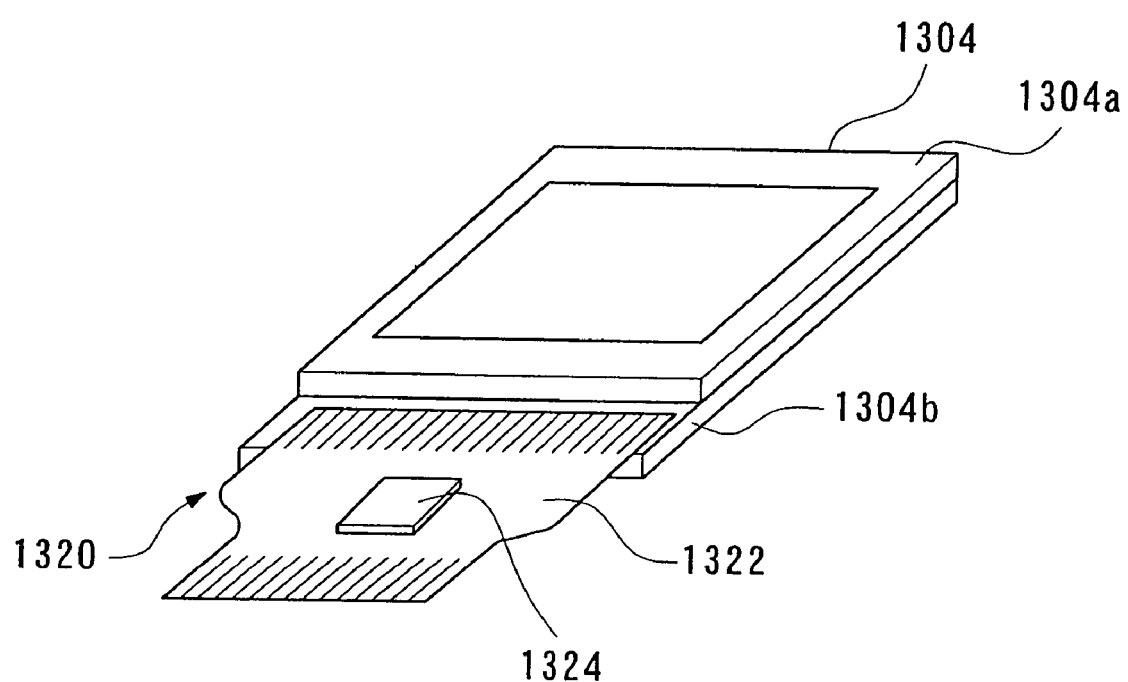
FIG. 38 is a schematic explanatory drawing showing a liquid crystal display apparatus having a TCP.

Instead of the above, as shown in FIG. 38, a tape carrier package (TCP) 1320, in which an IC chip 1324 is mounted on a polyimide tape 1322 on which is formed a metal conductive film, may be connected to one of the two transparent substrates 1304a and 1304b that compose liquid crystal display substrate 1304 for use as a liquid crystal display apparatus serving as a component of electronic equipment.

What is claimed is:

1. A method of manufacturing a device, the method comprising:
    forming a first film on a base material;
    forming a functional film, the forming of the functional film including depositing a liquid material only in a recess surrounded by the first film, and the forming of the first film being carried out prior to the forming of the functional film; and removing at least a part of the first film.

2. The method of manufacturing according to claim 1, the deposition of the liquid material including:

moving a relative position between a nozzle that discharges the liquid material and the base material; and discharging the liquid material from the nozzle toward the base material.

3. The method of manufacturing according to claim 1, the liquid material containing at least one of a polymer having Si—N bonds (polisilazane) and Spin on Glass (SOG).

4. The method of manufacturing according to claim 1, the liquid material containing a silicon compound having a ring system represented with a general formula $Si_nX_m$ in which n represents an integer of at least 5, m represents an integer of one of n, 2n-2 and 2n, and X represents at least one of a hydrogen atom and a halogen atom.

5. The method of manufacturing according to claim 1, the liquid material containing electrically conductive particles.

6. The method of manufacturing according to claim 1, the forming of the functional film including depositing the liquid material in the recess surrounded by the first film so as to pattern the first film in the recess.

7. The method of manufacturing according to claim 1, the forming of the functional film comprising forming an electrically conductive functional film.

8. A method of manufacturing a device, the method comprising:

forming a first film on a base material;

forming a functional film, the forming of the functional film including depositing a liquid material in a recess surrounded by the first film, and the forming of the first film being carried out prior to the forming of the functional film;

removing at least a part of the first film; and treating the first film to input liquid repellency to the first film.

9. The method of manufacturing according to claim 8, the liquid repellency treatment comprising a self-assembly layer.

10. A method of manufacturing a transistor including a functional film, the method comprising:

forming a first film on a base material; and forming the functional film, the forming of the functional film including depositing a liquid material only in a recess surrounded by the first film, and the forming of the first film being carried out prior to the forming of the functional film.

11. The method of manufacturing according to claim 10, the functional film being at least one of a silicon film, a gate insulating film and an electrically conductive film.

12. The method of manufacturing according to claim 10, further comprising treating the first film to impart liquid repellency to the first film.

13. The method of manufacturing according to claim 10, the liquid material containing electrically conductive particles.

14. A method of manufacturing a transistor including a functional film, the method comprising:

forming a first film on a base material, the first film including an inorganic layer made of an inorganic material and an organic layer made of an organic material; and forming the functional film, the forming of the functional film including depositing a liquid material in the first film, and the forming of the first film being carried out prior to the forming of the functional film.

15. The method of manufacturing according to claim 14, the forming of the functional film including depositing the liquid material the first film so as to pattern the first film.

16. The method of manufacturing according to claim 14, the forming of the functional film comprising forming an electrically conductive functional film.

17. A method of manufacturing a transistor including a functional film, the method comprising:

forming a first film on a base material;

forming the functional film, the forming of the functional film including depositing a liquid material only in a recess surrounded by the first film, and the forming of the first film being carried out prior to the forming of the functional film; and removing at least a part of the first film.

18. The method of manufacturing according to claim 17, further comprising treating the first film to impart liquid repellency to the first film.

19. The method of manufacturing according to claim 17, the functional film being at least one of a silicon film, a gate insulating film and an electrically conductive film of the transistor.

20. The method of manufacturing according to claim 17, the first film including an inorganic layer made of an inorganic material and an organic layer made of an organic material.

21. The method of manufacturing according to claim 20, the removing at least a part of the first film including removing the organic layer of the first film.

22. A method of manufacturing a transistor including a functional film, the method comprising:

forming a first film on a base material;

forming the functional film, the forming of the functional film including depositing a liquid material in a recess surrounded by the first film, the liquid material containing electrically conductive particles, and the forming of the first film being carried out prior to the forming of the functional film; and removing at least a part of the first film.

23. The method of manufacturing according to claim 22, the forming of the functional film including depositing the liquid material in the recess surrounded by the first film so as to pattern the first film in the recess.

24. The method of manufacturing according to claim 22, the forming of the functional film comprising forming an electrically conductive functional film.

* * * * *